(12) United States Patent
Mizunaga et al.

(10) Patent No.: US 8,952,880 B2
(45) Date of Patent: Feb. 10, 2015

(54) SHIFT REGISTER AND LIQUID CRYSTAL DISPLAY DEVICE FOR DETECTING ANOMALOUS SYNC SIGNAL

(75) Inventors: Takayuki Mizunaga, Osaka (JP); Hideki Morii, Osaka (JP); Akihisa Iwamoto, Osaka (JP); Masahiro Hirokane, Osaka (JP); Yuuki Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1152 days.

(21) Appl. No.: 12/736,121

(22) PCT Filed: Dec. 17, 2008

(86) PCT No.: PCT/JP2008/072931
§ 371 (c)(1),
(2), (4) Date: Oct. 4, 2010

(87) PCT Pub. No.: WO2009/116214
PCT Pub. Date: Sep. 24, 2009

(65) Prior Publication Data
US 2011/0018845 A1    Jan. 27, 2011

(30) Foreign Application Priority Data
Mar. 19, 2008  (JP) .................. 2008-072420

(51) Int. Cl.
*G09G 3/36* (2006.01)
*G11C 19/00* (2006.01)
(Continued)

(52) U.S. Cl.
CPC ............ *G09G 3/3677* (2013.01); *G11C 19/184* (2013.01); *G11C 19/28* (2013.01); *G09G 2310/0286* (2013.01); *G09G 2330/025* (2013.01)
USPC ................ 345/100; 345/99; 377/70

(58) Field of Classification Search
CPC . G09G 3/3266; G09G 3/3611; G09G 3/3648; G09G 3/3674; G09G 3/3677; G09G 2300/0408; G09G 2310/0202; G09G 2310/0267; G09G 2310/0281; G09G 2310/0286; G11C 19/00; G11C 19/28; G11C 19/285
USPC ........... 345/55, 98–100, 204, 206; 377/64–81
See application file for complete search history.

(56) References Cited

U.S. PATENT DOCUMENTS 5,151,612 A * 9/1992 Ishikawa ......................... 327/34
5,313,222 A   5/1994 Lee
(Continued)

FOREIGN PATENT DOCUMENTS

EP     0 801 376     10/1997
EP     0 974 952     1/2000
(Continued)

OTHER PUBLICATIONS

International Search Report.
(Continued)

*Primary Examiner* — Joe H Cheng
*Assistant Examiner* — Keith Crawley
(74) *Attorney, Agent, or Firm* — Harness, Dickey & Pierce, P.L.C.

(57) ABSTRACT

A display panel drive circuit includes a shift register constructed of unit circuits connected in stages. The unit circuits generate signal line selection signals, respectively, which signal line selection signals are made active for a respective certain period of time to form a respective pulse, and the pulses are outputted successively from respective unit circuits in order of ordinal number starting from a first stage until an end stage. In at least one embodiment, each of the unit circuits receive (i) clock signals generated based on a sync signal received from outside of the display panel drive circuit, (ii) a start pulse signal generated based on the sync signal, or a signal line selection signal generated in a stage different from its own stage, and (iii) a clear signal. The clear signal is made active in a case where anomalousness is included in the sync signal, and no pulse is outputted from the shift register until a subsequent vertical scanning period starts. This configuration achieves a display panel drive circuit which prevents display disorder or holds down increase in load given to a power source, each of which occurs in a case where anomalousness is included in the sync signal.

30 Claims, 42 Drawing Sheets

(51) Int. Cl.
*G11C 19/18* (2006.01)
*G11C 19/28* (2006.01)

(56) References Cited

U.S. PATENT DOCUMENTS

| | | | |
|---|---|---|---|
| 5,742,269 A | | 4/1998 | Hayashiguchi et al. |
| 6,522,319 B1 | | 2/2003 | Yamazaki |
| 6,894,673 B2 | * | 5/2005 | Koga et al. ............ 345/99 |
| 7,382,362 B2 | * | 6/2008 | Chilukuri et al. .......... 345/204 |
| 2002/0175887 A1 | | 11/2002 | Yamazaki |
| 2004/0100435 A1 | * | 5/2004 | Baek et al. ............ 345/98 |
| 2005/0030303 A1 | * | 2/2005 | Morita et al. ............ 345/204 |
| 2005/0134614 A1 | | 6/2005 | Tomohara |
| 2005/0195150 A1 | | 9/2005 | Etoh et al. |
| 2006/0001637 A1 | | 1/2006 | Pak et al. |
| 2006/0071891 A1 | | 4/2006 | Anai |
| 2006/0082534 A1 | | 4/2006 | Honda et al. |
| 2007/0040792 A1 | | 2/2007 | Kwag et al. |
| 2007/0085811 A1 | | 4/2007 | Lee |
| 2007/0126686 A1 | * | 6/2007 | Chang et al. ............ 345/98 |
| 2007/0148793 A1 | | 6/2007 | Yoshida |
| 2007/0262942 A1 | * | 11/2007 | Choi ............ 345/98 |
| 2008/0079682 A1 | | 4/2008 | Chang et al. |
| 2008/0122774 A1 | | 5/2008 | Jo et al. |
| 2008/0136756 A1 | * | 6/2008 | Yeo et al. ............ 345/87 |
| 2009/0129534 A1 | | 5/2009 | Yoshida |
| 2009/0174646 A1 | * | 7/2009 | Lim ............ 345/100 |

FOREIGN PATENT DOCUMENTS

| | | |
|---|---|---|
| JP | 2001-134244 | 5/2001 |
| JP | 2001-273785 | 10/2001 |
| JP | 2002-268602 | 9/2002 |
| JP | 2003-167545 | 6/2003 |
| JP | 2006-024350 | 1/2006 |
| JP | 2007-114771 | 5/2007 |
| JP | 2007-202126 | 8/2007 |
| JP | 2008-241828 | 10/2008 |
| JP | 2009-109955 | 5/2009 |
| KR | 10-2008-0000041 | 1/2008 |
| RU | 2 104 589 | 2/1998 |
| RU | 2 121 170 | 10/1998 |
| TW | 200813922 | 3/2008 |
| WO | WO 99/40561 | 8/1999 |

OTHER PUBLICATIONS

"AMLCD Electrics" In: Willem den Boer: "Active Matrix Liquid Crystal Displays: Fundamentals and Applications", 2005, Newnes, U.S.A., XP002676121, ISBN: 0750678135 pp. 87-111.

* cited by examiner

F I G. 4
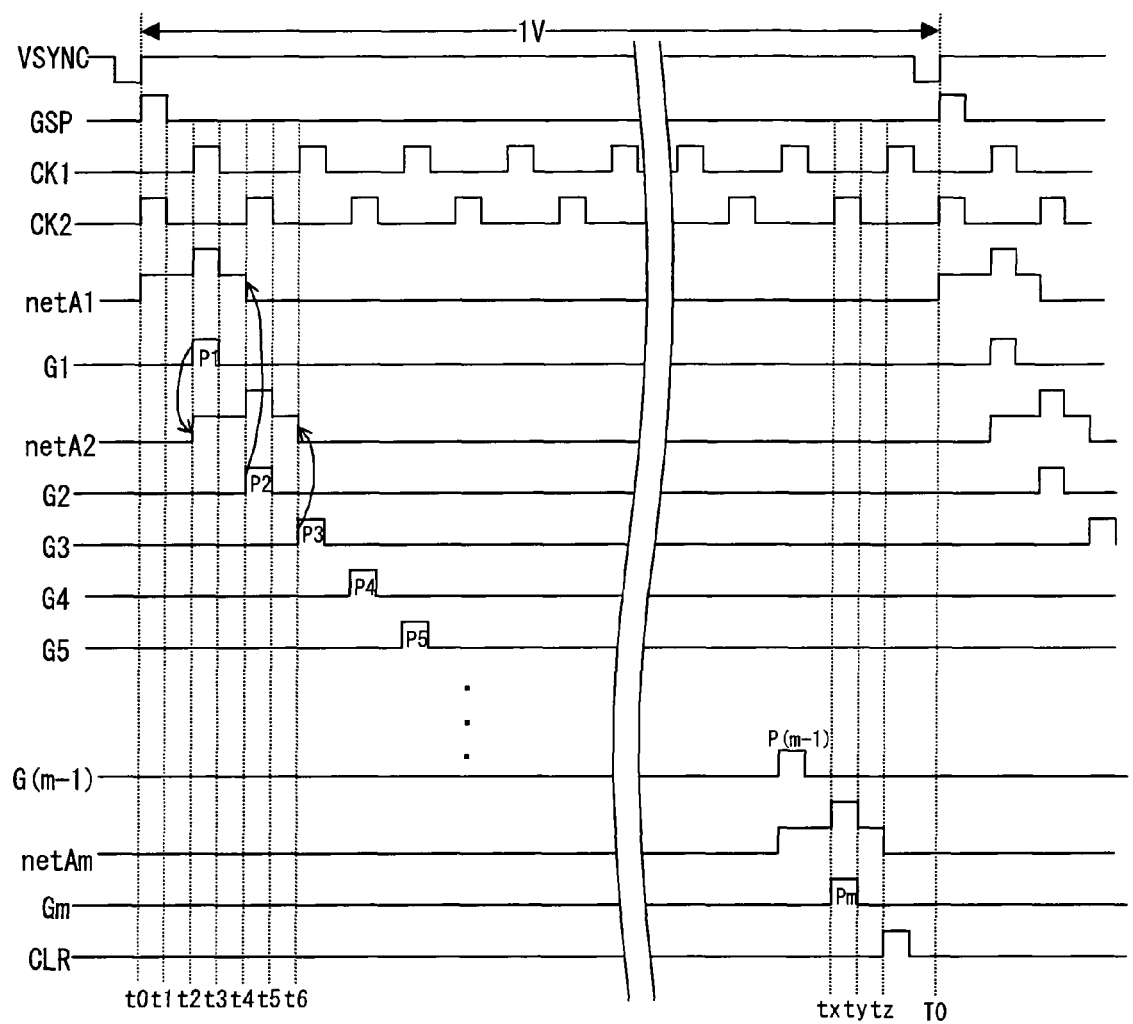

FIG. 6
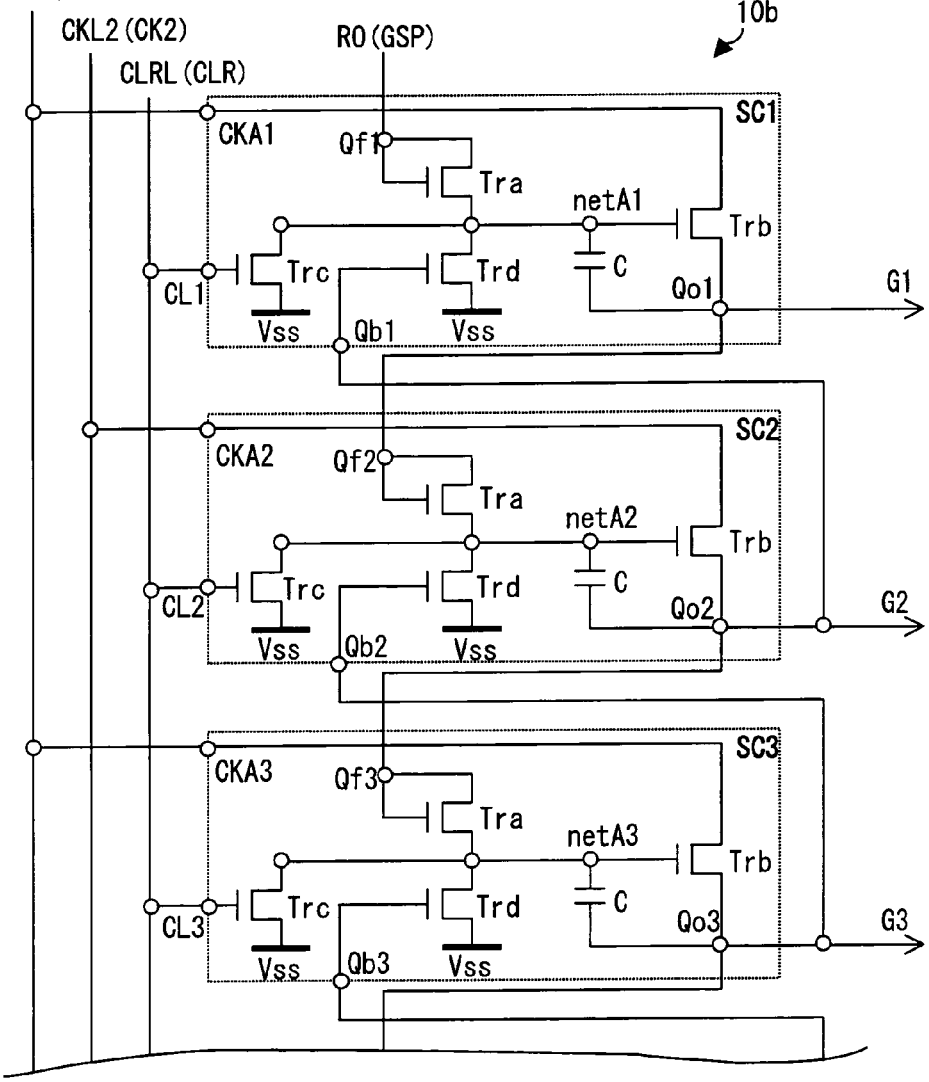
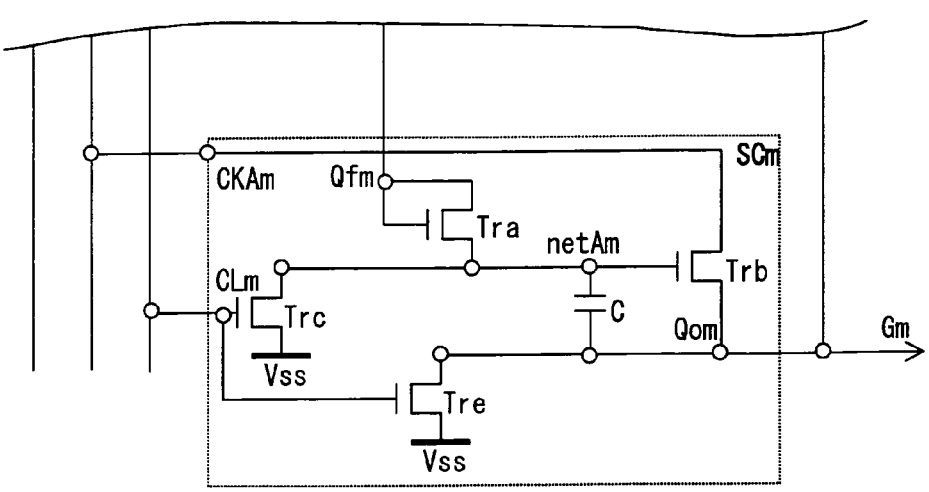

F I G. 7
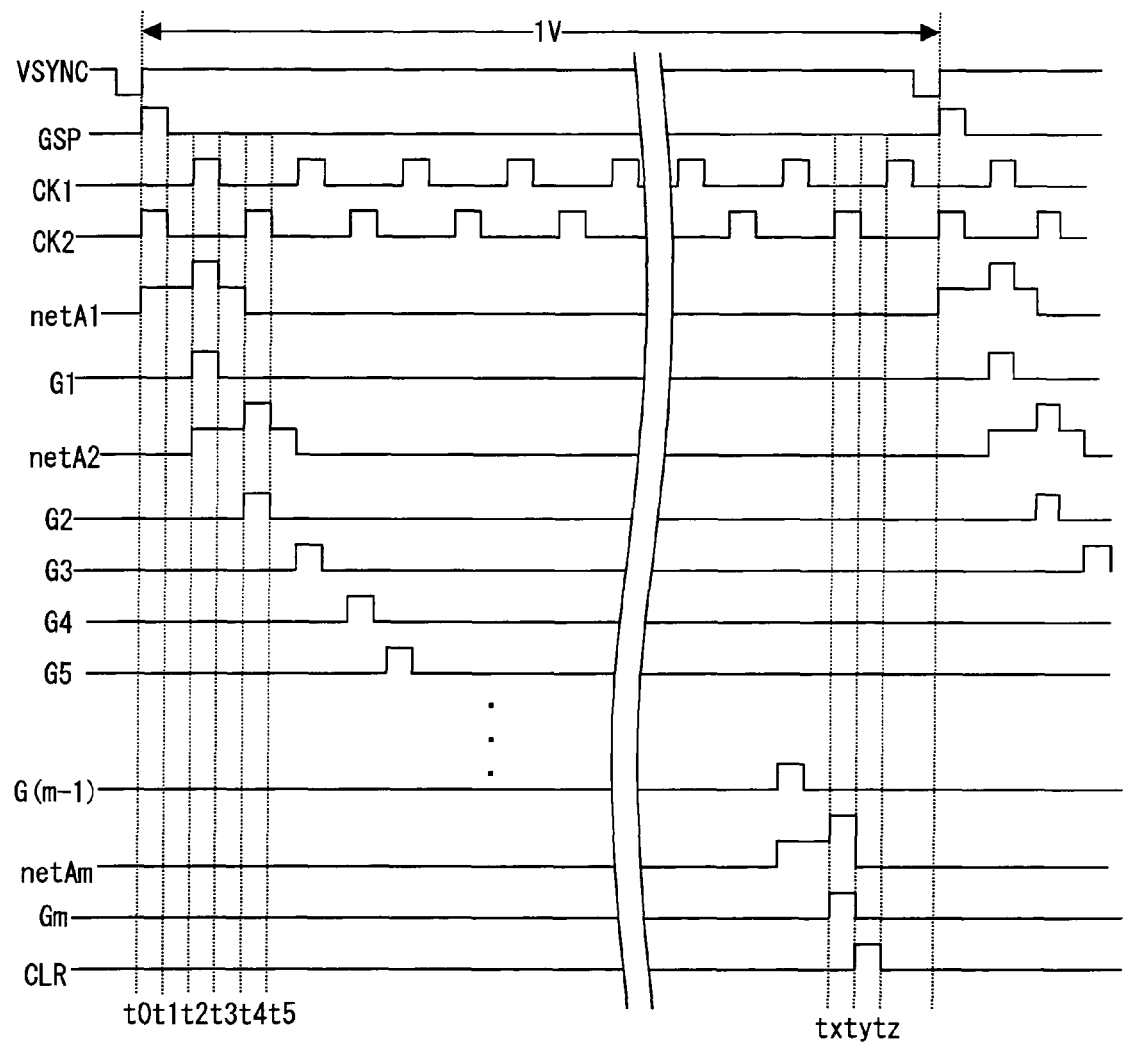

F I G. 9
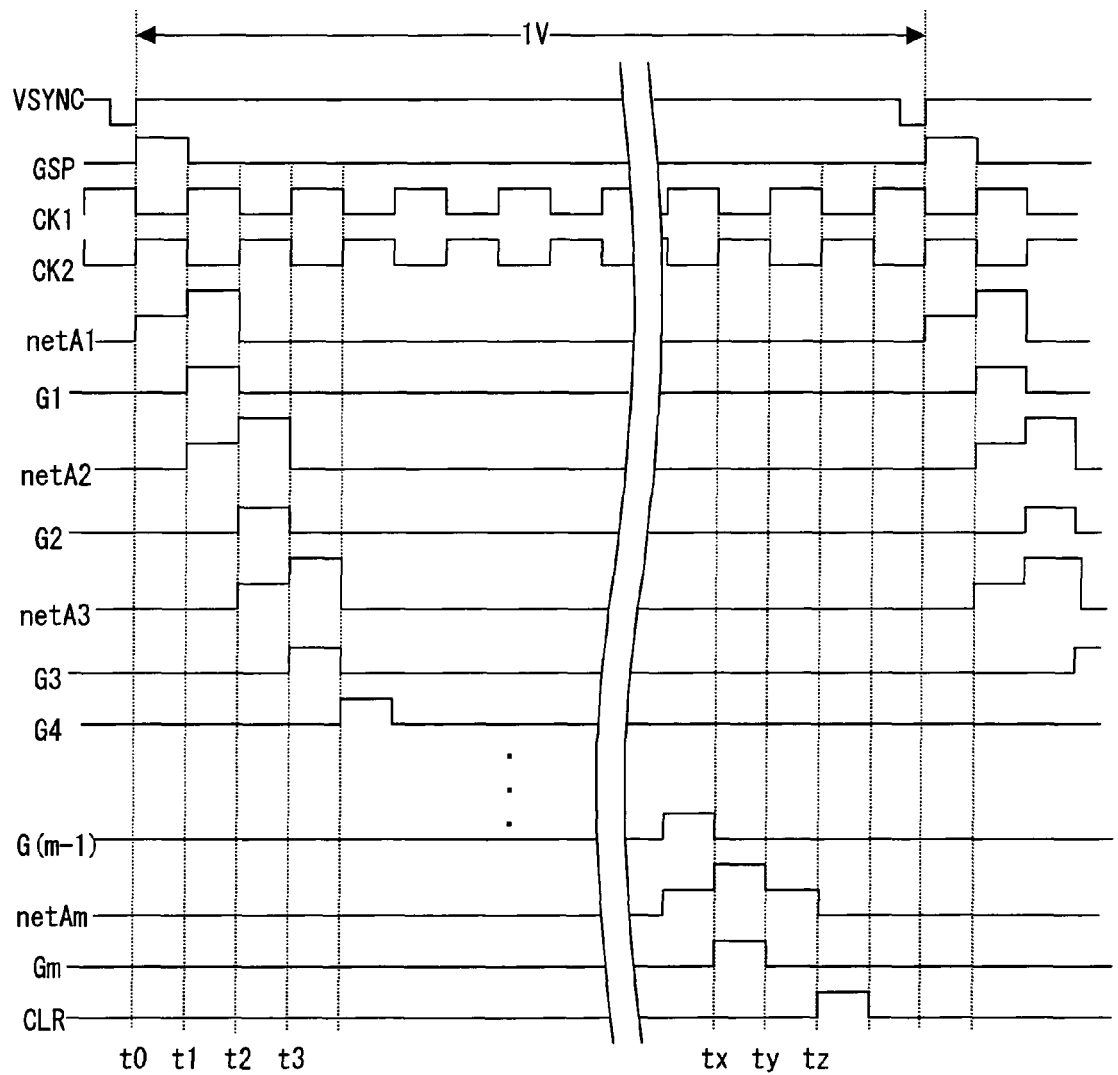

F I G. 1 4
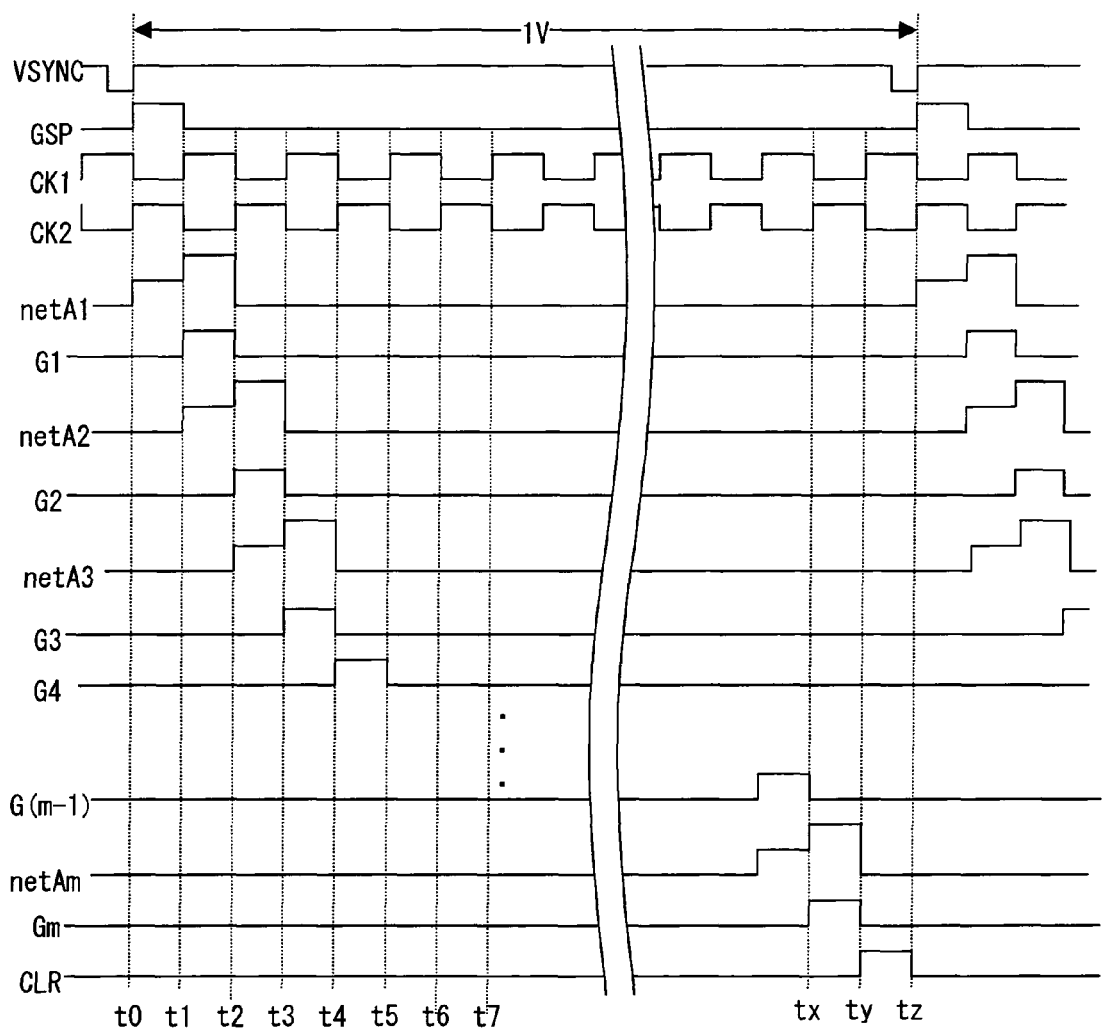

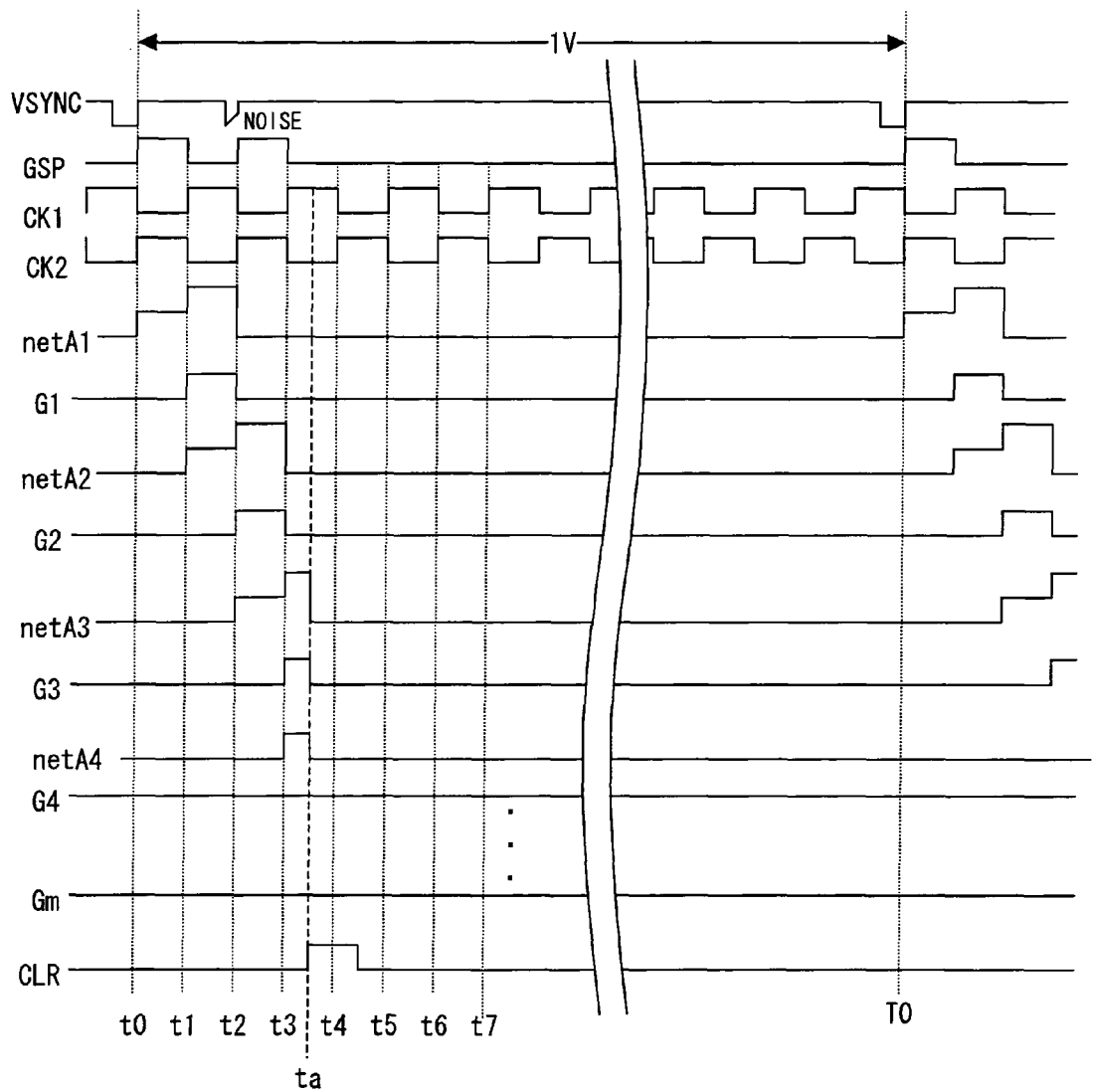

F I G. 1 7
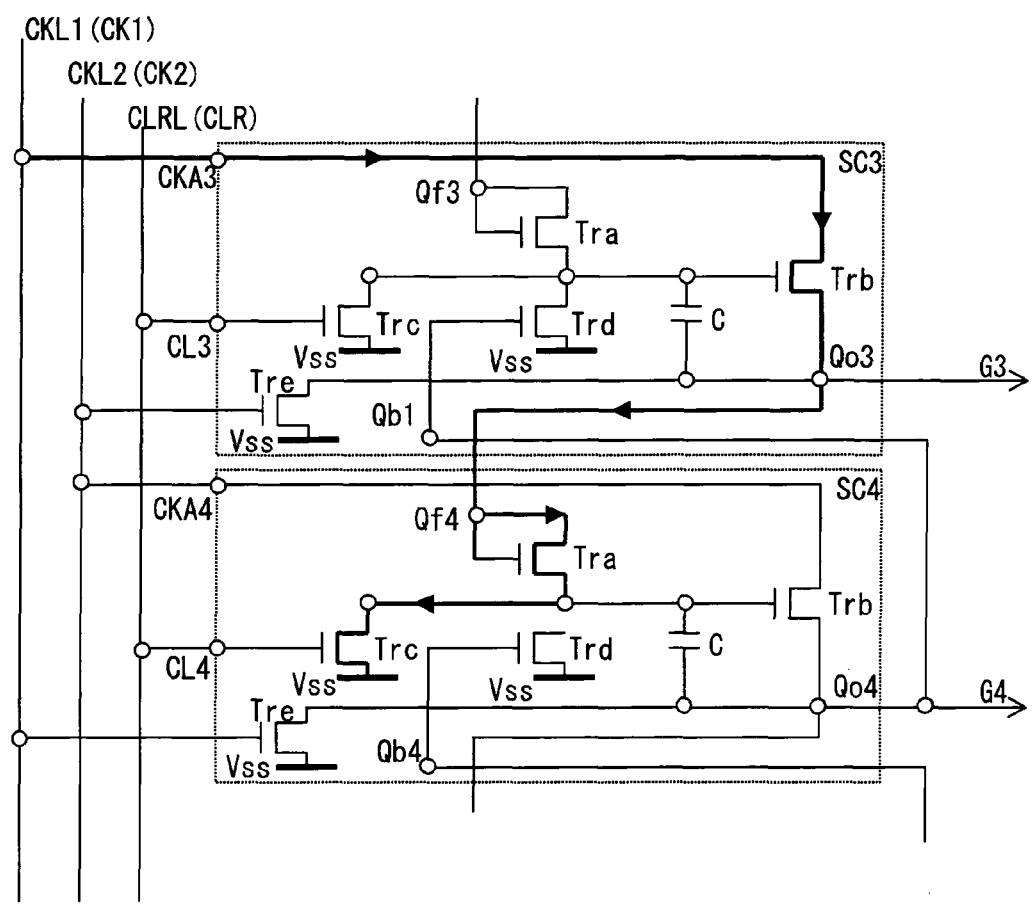

F I G. 1 8
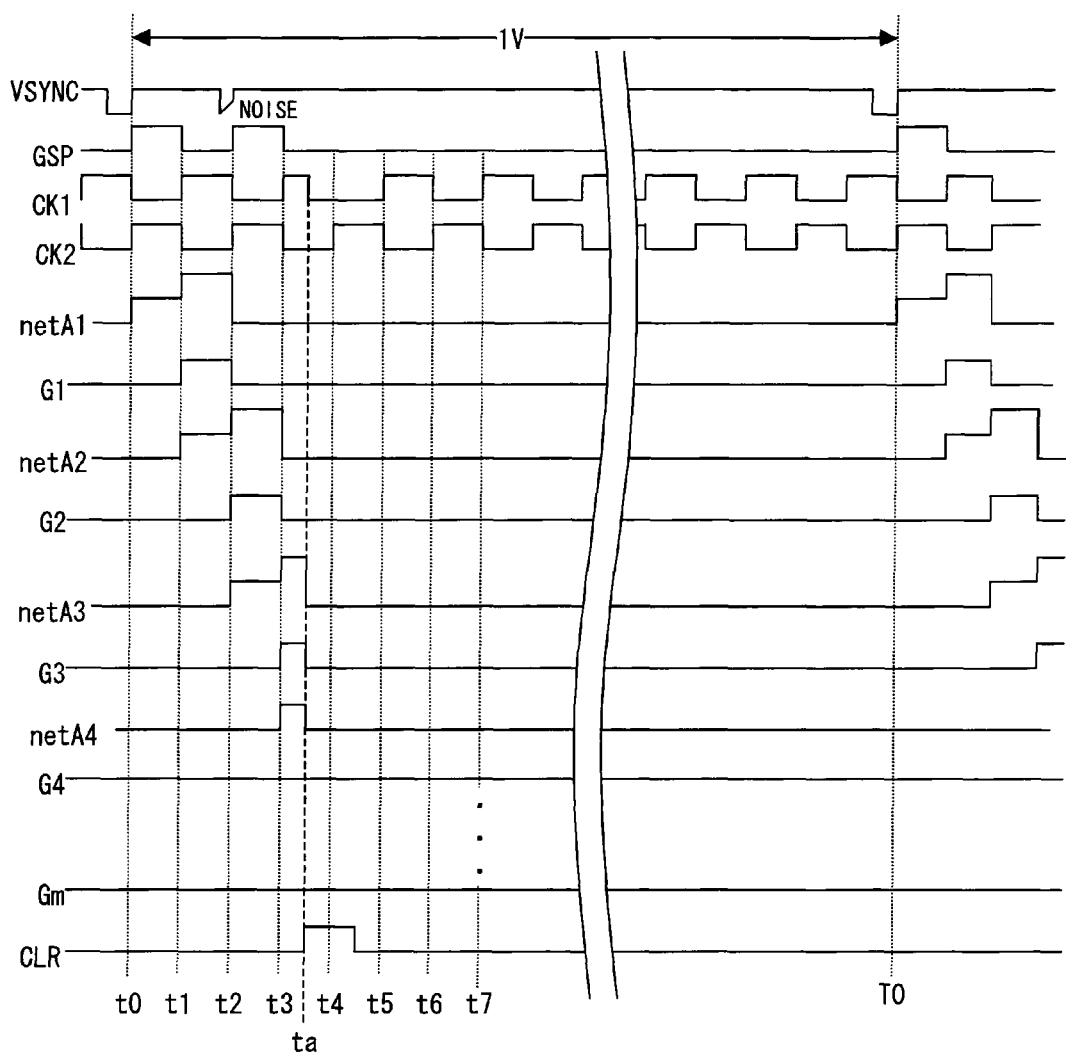

F I G. 2 3
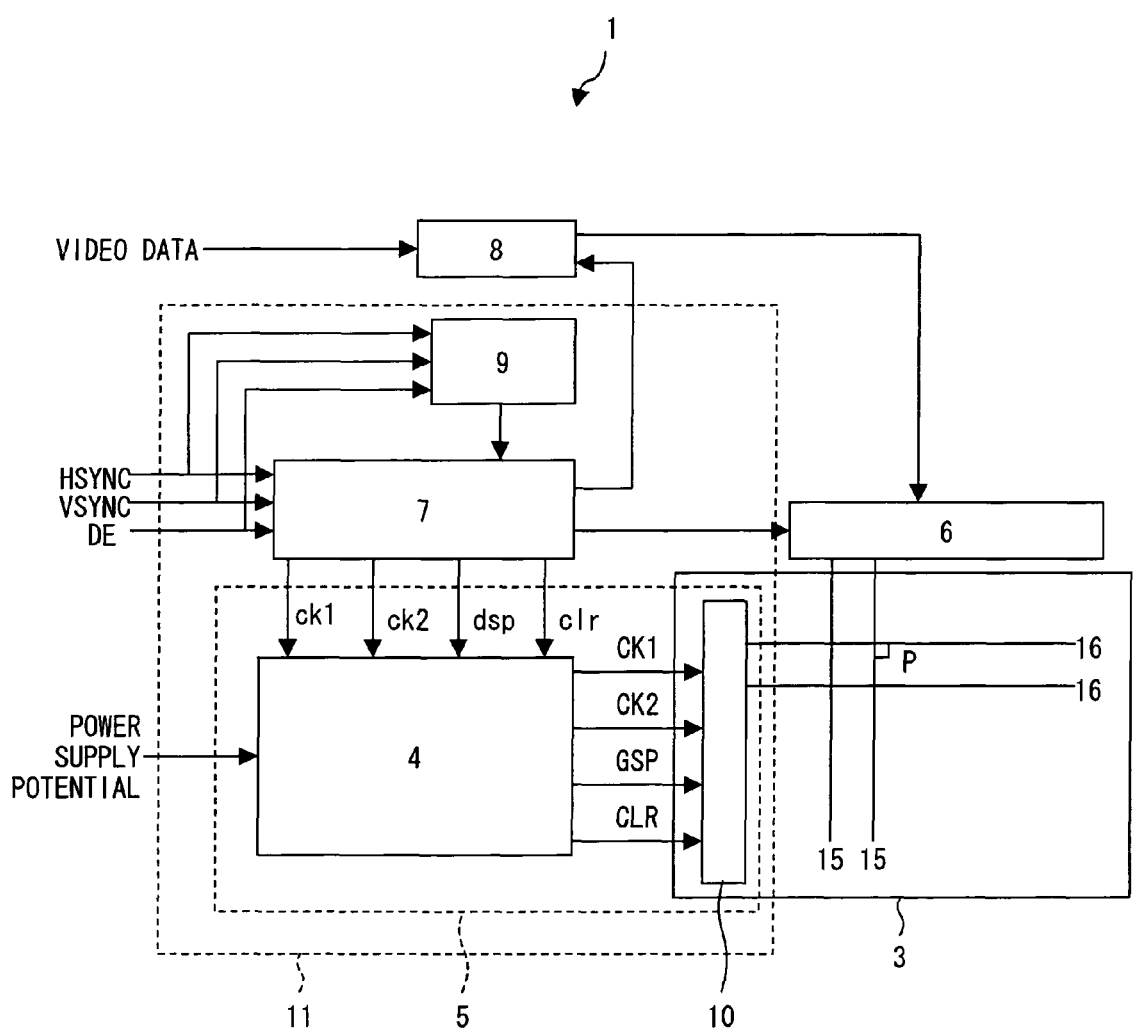

FIG. 29
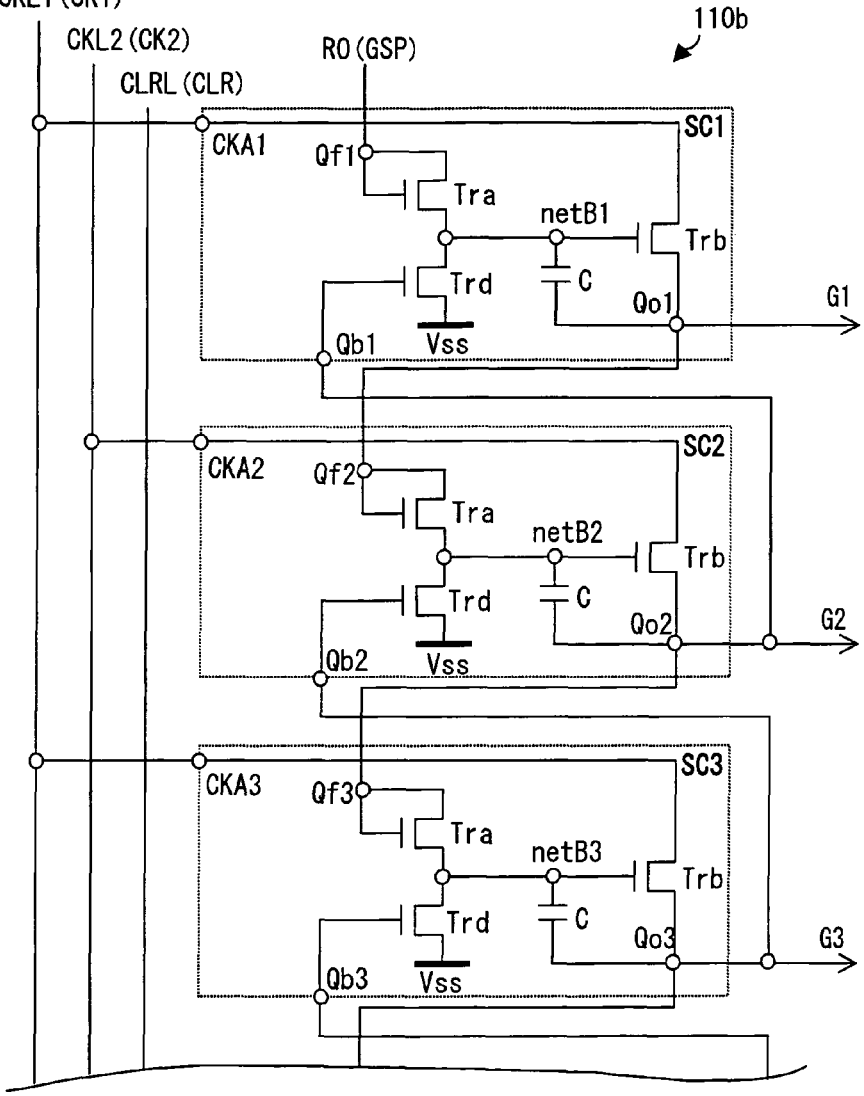
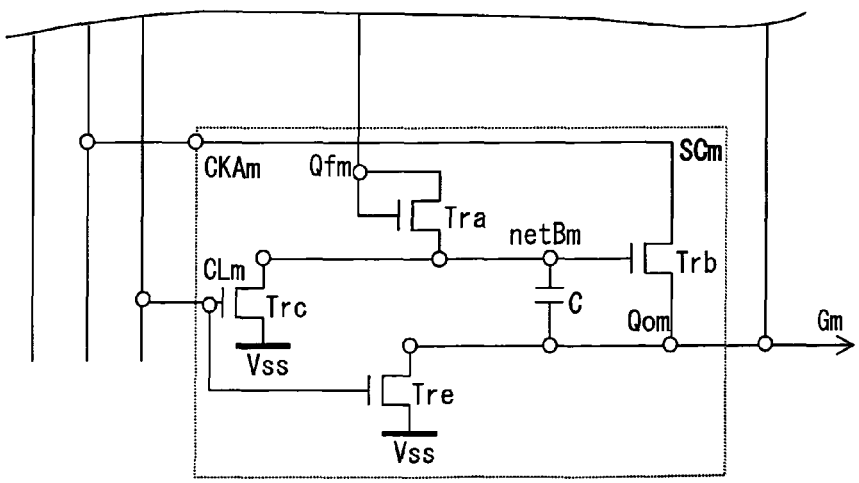

FIG. 35
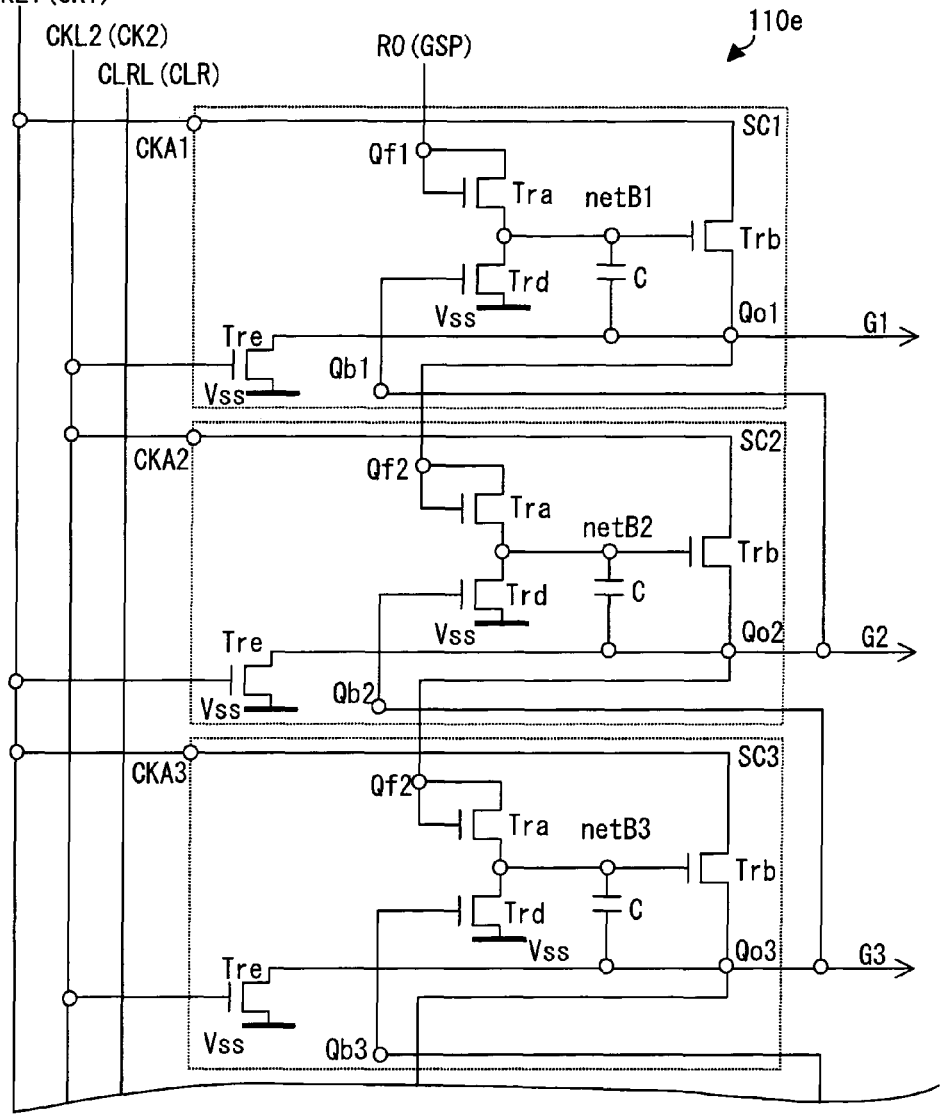
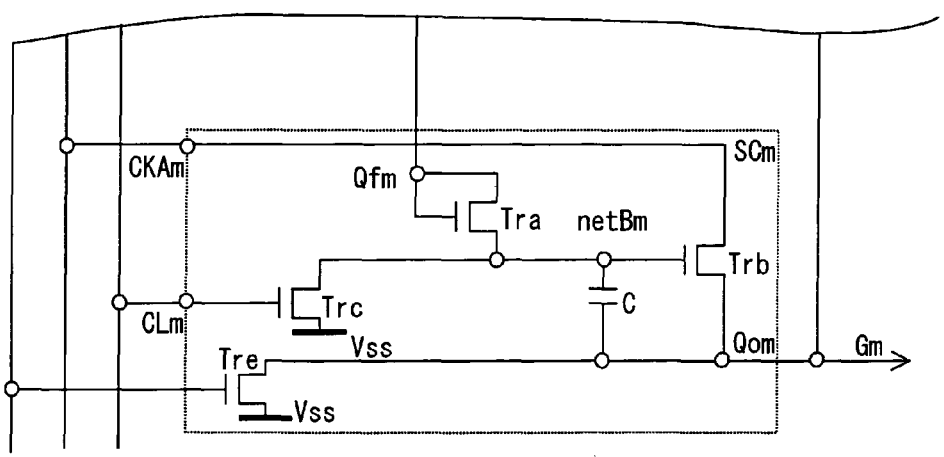

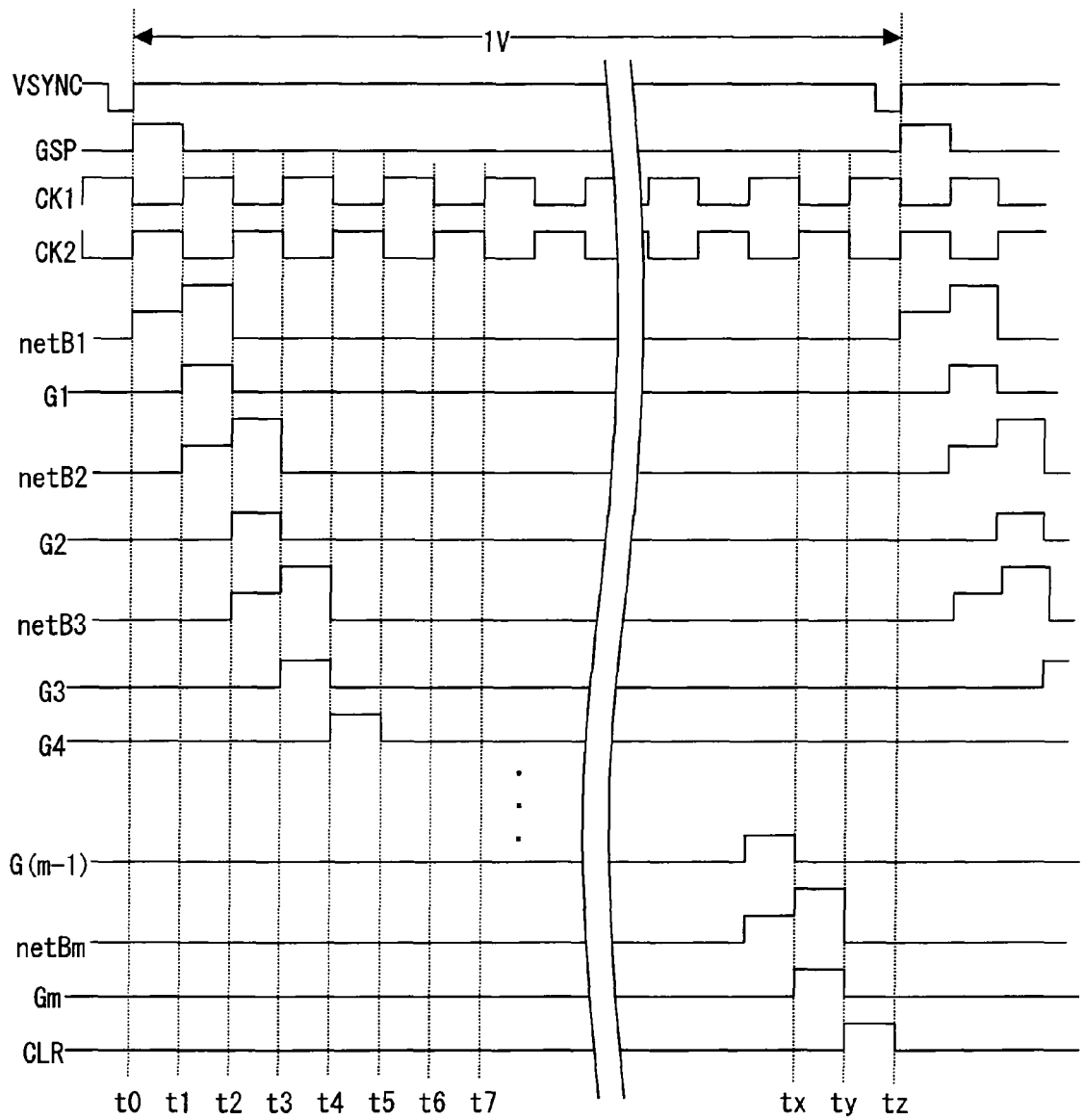
F I G. 3 6

F I G. 4 1   PRIOR ART

SHIFT REGISTER AND LIQUID CRYSTAL DISPLAY DEVICE FOR DETECTING ANOMALOUS SYNC SIGNAL

TECHNICAL FIELD

The present invention relates to a display panel driving circuit and a shift register for use in such a display panel driving circuit.

BACKGROUND ART

FIG. 40 is a circuit diagram illustrating a conventional shift register for use in a gate driver that is included in a liquid crystal display device. As shown in FIG. 40, a conventional shift register 100 is made up of a plurality of shift circuits (unit circuits) sc1, sc2, ... scm, and scd, which are connected in stages. Each of the shift circuits sci (i=1, 2, 3, ... or m) includes input nodes qfi, qbi, and CKAi, and an output node qoi. The shift circuit scd, which is a dummy shift circuit, includes input nodes qfd and CKAd and an output node qod.

The shift circuit sc1 has its node qf1 be connected to an output terminal via which a gate start pulse signal GSP is outputted, has its node qb1 be connected to the node qo2 of the shift circuit sc2, and has its node CKA1 be connected to a first clock line CKL1 to which a first clock signal is supplied; and from its node qo1, a gate on-pulse signal (signal line selection signal) g1 is outputted. Further, each of the shift circuits sci (i=2, 3, ... or m−1) has its node qfi be connected to the node qo(i-1) of the shift circuit sc(i−1), has its node qbi be connected to the node qo(i+1) of the shift circuit sc(i+1), and has its node CKAi be connected to the first clock line CKL1 or a second clock line CKL2 to which a second clock signal is supplied; and from its node qoi, a gate on-pulse signal (signal line selection signal) gi is outputted. In a case where i is an odd number, the node CKAi is connected to the first clock line CKL1, and in a case where i is an even number, the node CKAi is connected to the second clock line CKL2.

The shift circuit scm has its node qfm be connected to the node qo(m−1) of the shift circuit sc(m−1), has its node qbm be connected to the node qod of the dummy shift circuit scd, and has its node CKAm be connected to the first clock line CKL1 or the second clock line CKL2; and from its node qom, the gate on-pulse signal (signal line selection signal) gm is outputted. In a case where m is an odd number, the shift circuit scm has its node CKAi be connected to the first clock line CKL1, and in a case where m is an even number, the shift circuit scm has its node CKAi be connected to the second clock line CKL2. The dummy shift circuit scd has its node qfd be connected to the node qom of the shift circuit scm, and its node CKAd be connected to the first clock line CKL1 or the second clock line CKL2. In the case where m is an odd number, the dummy shift circuit scd has its node CKAd be connected to the second clock line CKL2, and in the case where m is an even number, the dummy shift circuit scd has its node CKAd be connected to the first clock line CKL1.

FIG. 41 is a timing chart illustrating waveforms of a vertical sync signal VSYNC, the gate start pulse signal GSP, the first clock signal CK1, the second clock signal CK2, gate on-pulse signals gi (i=1 to m), and an output via the node qod. Note that each of the first clock signal CK1 and the second clock signal CK2 includes, in one cycle, one "H (high)" (active) clock period and one "L (low)" (non-active) clock period; synchronously with activation (rise) of one of the clock signals CK1 and CK2, the other one of the clock signals CK1 and CK2 is inactivated (falls).

In the shift circuit sc1 in a first stage, an electric potential of the node qf1 rises upon activation of the gate start pulse signal GSP. As a result, the first clock signal CK1 is outputted via the node qo1, and accordingly the gate on-pulse signal g1 is activated. Moreover, in the shift circuit sc2 in a subsequent stage, an electric potential of the node qf2 rises upon activation of the gate on-pulse signal g1. As a result, the second clock signal CK2 is outputted via the node qo2, and accordingly the gate on-pulse signal g2 is activated. This activation of the gate on-pulse signal g2 makes the first clock signal CK1 no longer be outputted via the node qo1 in the shift circuit sc1 but a lower-potential side power supply potential be outputted via the node qo1. Consequently, the gate on-pulse signal g1 is inactivated after being active for a certain period of time, which as a result generates a pulse P1.

That is, in the shift circuit sci (i=2, 3, ... or m−1), an electric potential of the node qfi rises upon activation of the gate on-pulse signal g(i−1). As a result, the clock signal (CK1 or CK2) is outputted via the node qoi, and accordingly the gate on-pulse signal gi is activated. Moreover, in the shift circuit sc(i+1) in a subsequent stage, an electric potential of the node qf(i+1) rises upon activation of the gate on-pulse signal gi. As a result, the clock signal (CK2 or CK1) is outputted via the node qo(i+1), and accordingly the gate on-pulse signal g(i+1) is activated. This activation of the gate on-pulse signal g(i+1) makes the clock signal no longer be outputted via the node qoi in the shift circuit sci but a lower-potential side power supply potential be outputted via the node qoi. Consequently, the gate on-pulse signal gi is inactivated after being active for a certain period of time, which as a result generates a pulse P1.

Moreover, in the shift circuit scm, an electric potential of the node qfm rises upon activation of the gate on-pulse signal g(m−1). As a result, the clock signal (CK1 or CK2) is outputted via the node qom, and accordingly the gate on-pulse signal gm is activated. Further, in the dummy shift circuit scd in a subsequent stage, an electric potential of the node qfd rises upon activation of the gate on-pulse signal gm. As a result, the clock signal (CK2 or CK1) is outputted via the node qod (i.e., an electric potential at the node qod rises). The rise of the potential of the node qod makes the clock signal no longer be outputted via the node qom in the shift circuit scm, but a lower-potential side power supply potential be outputted via the node qom. Therefore, the gate on-pulse signal gm is inactivated after being active for a certain period of time, which as a result generates a pulse Pm.

As discussed above, in the shift register 100, the gate on pulse signals outputted from respective shift circuits are successively activated for a certain period of time, and a pulse is outputted successively from respective shift circuits in order of ordinal number starting from the shift circuit sc1 in the first stage until the shift circuit scm in an end stage. Note that the following Patent Literatures 1 through 3 are known documents relevant to the technique described above.

Patent Literature 1
Japanese Patent Application Publication, Tokukai, No. 2001-273785 A (Publication Date: Oct. 5, 2001)
Patent Literature 2
Japanese Patent Application Publication, Tokukai, No. 2006-24350 A (Publication Date: Jan. 26, 2006)
Patent Literature 3
Japanese Patent Application Publication, Tokukai, No. 2007-114771 A (Publication Date: May 10, 2007)

SUMMARY OF INVENTION

In the conventional shift register, the gate start pulse signal GSP is activated in connection with an output of a pulse of the vertical sync signal VSYNC. In this case, as illustrated in FIG. 42, for example if a noise generates in the vertical sync signal VSYNC, the gate start pulse signal GSP becomes activated in connection with the noise, thereby causing two pulses be outputted from two shift circuits, simultaneously. This anomalousness that two pulses are simultaneously outputted may continue until the end stage of the shift register. Moreover, for example if a noise generates in the horizontal sync signal HSYNC, the clock signal becomes disordered, and anomalousness that a pulse width of the gate on-pulse signal becomes small may continue until the end stage of the shift register.

As described above, with the conventional shift register, anomalousness in the gate on-pulse signal continues until the end stage in the case where a sync signal such as the vertical sync signal VSYNC, the horizontal sync signal HSYNC, a data enable signal DE or the like includes an anomalousness such as a noise. This causes disorder in display on the panel, and gives a great load to a power source, in driving the panel.

The present invention proposes a display panel driving circuit which allows holding down (i) disorder of display and (ii) increase in load to the power source, in a case where anomalousness occurs in a sync signal (VSYNC or HSYNC, or DE). The present invention further proposes a shift register for use in such a display panel driving circuit.

Further, the conventional shift register requires providing a shift circuit scd (dummy stage) for resetting the shift circuit scm (end stage). This causes the circuit area in the shift register to increase in size.

The present invention proposes a display panel driving circuit which allows holding down the size of the circuit area in a shift register. The present invention further proposes a shift register for use in such a display panel driving circuit.

A display panel drive circuit of the present invention is a display panel drive circuit receiving a sync signal from outside, the display panel drive circuit including a shift register constructed of unit circuits connected in stages, the unit circuits outputting signal line selection signals, respectively, each of the signal line selection signals being made active for a respective certain period of time to form a respective pulse, the pulses being outputted successively from respective unit circuits in order of ordinal number starting from a first stage until an end stage, each of the unit circuits receiving (i) a clock signal, (ii) a start pulse signal or a signal line selection signal generated in a stage different from its own stage, and (iii) a clear signal, the clear signal being made active in a case where anomalousness is included in at least the sync signal, and no pulse is outputted from the shift register after the clear signal is made active, until a subsequent vertical scanning period starts.

Moreover, a display panel drive circuit of the present invention is a display panel drive circuit receiving a sync signal from outside, the display panel drive circuit including a shift register constructed of unit circuits connected in stages, each of the unit circuits receiving a clock signal and outputting a respective pulse by use of the received clock signal, the pulses being outputted successively from each of the stages, each of the unit circuits having an output transistor provided between an input terminal of the clock signal and an output terminal of the respective unit circuit, a clear signal being generated and inputted into each of the unit circuits, the clear signal being made active in a case where anomalousness is included in at least the sync signal, and once the clear signal is made active, the output transistor provided in each of the unit circuits being turned OFF until a subsequent vertical scanning period starts.

According to the display panel drive circuit of the present invention, once a clear signal is made active due to anomalousness in a sync signal, pulse output from the shift register stops thereafter. Therefore, it is possible to prevent disorder of display and hold down an increase in load given to the power source.

The display panel drive circuit may be configured in such a manner that the clock signal, the start pulse signal, and the clear signal are generated based on the sync signal.

The display panel drive circuit may be configured in such a manner that the sync signal includes at least one of a vertical sync signal, a horizontal sync signal, and a data enable signal.

The display panel drive circuit may be configured in such a manner that, regardless of whether or not anomalousness is included in the sync signal, the clear signal is made active after the end stage outputs its respective pulse, so that the signal line selection signal outputted from the end stage remains inactive.

The display panel drive circuit may be configured in such a manner that regardless of whether or not anomalousness is included in the sync signal, the clear signal is made active after the pulse is outputted from a unit circuit in the end stage, so that the output transistor in each of the unit circuits is turned OFF until the subsequent vertical scanning period starts.

The display panel drive circuit may be configured in such a manner that the clear signal is made active at a timing in which no pulse is outputted or at a timing in which the pulse is made inactive.

The display panel drive circuit of the present invention may be configured in such a manner that each of the unit circuits except for that in the end stage includes a set transistor, an output transistor, a reset transistor, a clear transistor, and a capacitor, the set transistor, output transistor, reset transistor, and clear transistor each having a control terminal, a first conductive terminal, and a second conductive terminal, and the capacitor having a first electrode and a second electrode, the clear transistor receiving the clear signal via its control terminal, the reset transistor receiving, via its control terminal, a signal line selection signal outputted from a stage subsequent to its own stage, the set transistor receiving, via its control terminal, the start pulse signal or a signal line selection signal outputted from a stage previous to its own stage, the output transistor receiving the clock signal via its first conductive terminal, the second conductive terminal of the output transistor being connected to the first electrode of the capacitor, the control terminal of the set transistor and the first conductive terminal of the set transistor being connected to each other, and the second conductive terminal of the set transistor being connected to (i) the control terminal of the output transistor and (ii) the second electrode of the capacitor, the first conductive terminal of the clear transistor being connected to the control terminal of the output transistor, and the second conductive terminal of the clear transistor being connected to the constant potential source, the first conductive terminal of the reset transistor being connected to the control terminal of the output transistor, and the second conductive terminal of the reset transistor being connected to a constant potential source, and the second conductive terminal of the output transistor serving as an output terminal of the respective unit circuit. Note that, in the present application, one of the source terminal and drain terminal of a transistor is defined as the first conductive terminal, and the other one of the source terminal and drain terminal of the transistor is defined as the second conductive terminal. Depending on the design of the transistor, the first conductor of all the transistors may be the source terminal, or the first transistor of a certain transistor may be the drain terminal and the first transistors of the remaining transistors may be the source terminal.

The display panel drive circuit of the present invention may be configured in such a manner that each of the unit circuits except for that in the end stage further includes a potential supplying transistor, the potential supplying transistor having a control terminal, a first conductive terminal, and a second conductive terminal, the first conductive terminal of the potential supplying transistor being connected to the second conductive terminal of the output transistor, and the second conductive terminal of the potential supplying transistor being connected to the constant potential source, the potential supplying transistor receiving, via its control terminal, a signal line selection signal outputted from a stage subsequent to its own stage.

The display panel drive circuit of the present invention may be configured in such a manner that each of the unit circuits except for that in the end stage further includes a potential supplying transistor, the potential supplying transistor having a control terminal, a first conductive terminal, and a second conductive terminal, the first conductive terminal of the potential supplying transistor being connected to the second conductive terminal of the output transistor, and the second conductive terminal of the potential supplying transistor being connected to the constant potential source, the potential supplying transistor receiving, via its control terminal, a clock signal different from the clock signal received via the first conductive terminal of the output transistor.

The display panel drive circuit of the present invention may be configured in such a manner that the unit circuit in the end stage includes a set transistor, an output transistor, a clear transistor, and a capacitor, the set transistor, output transistor, and clear transistor each having a control terminal, a first conductive terminal, and a second conductive terminal, and the capacitor having a first electrode and a second electrode, the clear transistor receiving the clear signal via its control terminal, the set transistor receiving, via its control terminal, a signal line selection signal outputted from a stage previous to its own stage, and the output transistor receiving the clock signal via its first conductive terminal, the second conductive terminal of the output transistor being connected to the first electrode of the capacitor, the control terminal of the set transistor and the first conductive terminal of the set transistor being connected to each other, and the second conductive terminal of the set transistor being connected to (i) the control terminal of the output transistor and (ii) the second electrode of the capacitor, the first conductive terminal of the clear transistor being connected to the control terminal of the output transistor, and the second conductive terminal of the clear transistor being connected to the constant potential source, and the second conductive terminal of the output transistor serving as an output terminal of the unit circuit in the end stage.

The display panel drive circuit of the present invention may be configured in such a manner that the unit circuit in the end stage further includes a potential supplying transistor, the potential supplying transistor having a control terminal, a first conductive terminal, and a second conductive terminal, the potential supplying transistor receiving the clear signal via its control terminal, the first conductive terminal of the potential supplying transistor being connected to the second conductive terminal of the output transistor, and the second conductive terminal of the potential supplying transistor being connected to the constant potential source.

The display panel drive circuit of the present invention may be configured in such a manner that the clear signal is made active at a timing in which the signal line selection signal received from a respective stage is made inactive, or is made active while the signal line selection signal received from the respective stage is inactive.

The display panel drive circuit of the present invention may be configured in such a manner that a plurality of clock signals each having phases different from each other are inputted into the shift register, the plurality of clock signals being received by the output transistors of different unit circuits, respectively.

The display panel drive circuit of the present invention may be configured in such a manner that each of the plurality of clock signals have an inactive period that partially coincides with an inactive period of another of the plurality of clock signals.

The display panel drive circuit of the present invention may be configured in such a manner that the plurality of clock signals include two clock signals which are shifted in phase by half a cycle.

The display panel drive circuit of the present invention may be configured in such a manner that at least one of the plurality of clock signals is made inactive while the clear signal is made active.

The display panel drive circuit of the present invention may be configured in such a manner that each of the set transistor, the output transistor, the reset transistor, and the clear transistor is an N-channel transistor.

The display panel drive circuit of the present invention may be configured in such a manner that each of the set transistor, the output transistor, the reset transistor, the clear transistor, and the potential supplying transistor is an N-channel transistor.

The display panel drive circuit of the present invention may be configured in such a manner that the first conductive terminal of each of the transistors is a drain terminal, and the second conductive terminal of each of the transistors is a source terminal.

The display panel drive circuit of the present invention may be configured in such a manner that the first conductive terminal of each of the transistors is a source terminal, and the second conductive terminal of each of the transistors is a drain terminal.

The display panel drive circuit of the present invention may be configured further including a timing controller into which the sync signal is inputted, for generating the clock signal, the start pulse signal, and the clear signal with use of the sync signal thus inputted.

The display panel drive circuit of the present invention may be configured further including an anomalousness detection circuit for detecting anomalousness of the sync signal, the clear signal being generated based on a result of the detection.

A liquid crystal display device of the present invention includes the display panel drive circuit; and a liquid crystal panel.

The liquid crystal display device of the present invention may be configured in such a manner that the shift register is provided monolithically in the liquid crystal panel.

In the liquid crystal display device of the present invention, the liquid crystal panel may be formed by use of amorphous silicone. Moreover, the liquid crystal panel may be formed by use of polysilicon.

A shift register of the present invention is provided in a display panel drive circuit that receives a sync signal, the shift register constructed of unit circuits connected in stages, the unit circuits generating signal line selection signals, respectively, each of the signal line selection signals being made active for a respective certain period of time to form a respective pulse, the pulses being outputted successively from respective unit circuits, in order of ordinal number starting from a first stage until an end stage, each of the unit circuits receiving (i) a clock signal, (ii) a start pulse signal or a signal line selection signal generated by a stage different from its own stage, and (iii) a clear signal, the clear signal being made active in a case where anomalousness is included in at least the sync signal, and no pulse is outputted after the clear signal is made active until a subsequent vertical scanning period starts. In this case, the shift register may be monolithically provided.

A method of the present invention for driving a display device, the display device receiving a sync signal from outside and including a shift register constructed of unit circuits connected in stages, the unit circuits generating signal line selection signals, respectively, each of the signal line selection signals being made active for a respective certain period of time to form a respective pulse, the shift register outputting the pulses successively from respective unit circuits in order of ordinal number starting from a first stage until an end stage, is a method including: inputting, to each of the unit circuits, (i) a clock signal, (ii) a start pulse signal or a signal line selection signal generated in a stage different from its own stage, and (iii) a clear signal; and activating the clear signal in a case where anomalousness is included in at least the sync signal, so that no pulse is outputted from the shift register after the clear signal is made active, until a subsequent vertical scanning period starts.

A display panel drive circuit of the present invention includes: a shift register constructed of unit circuits connected in stages, the unit circuits outputting signal line selection signals, respectively, each of the signal line selection signals being made active for a respective certain period of time to form a respective pulse, the shift register outputting the pulses successively from respective unit circuits in order of ordinal number starting from a first stage until an end stage, a unit circuit in the end stage receiving (i) a signal line selection signal generated in a stage different from its own stage, (ii) a clock signal, and (iii) a clear signal, and the clear signal being made active after the end stage outputs its respective pulse, so that the signal line selection signal outputted from the end stage remains inactive.

According to the display panel drive circuit of the present invention, resetting can be carried out by use of a clear signal at an end stage (unit circuit). Hence, no dummy stage (dummy shift circuit) is required as in the conventional technique, and thus it is possible to reduce circuit area of the shift register.

The display panel drive circuit of the present invention may be configured in such a manner that each of the unit circuits except for the unit circuit in the end stage includes a set transistor, an output transistor, a reset transistor, and a capacitor, the set transistor, output transistor, and reset transistor each having a control terminal, a first conductive terminal, and a second conductive terminal, and the capacitor having a first electrode and a second electrode, the set transistor receiving, via its control terminal, a start pulse signal or a signal line selection signal outputted from a stage previous to its own stage, the reset transistor receiving, via its control terminal, a signal line selection signal outputted from a stage subsequent to its own stage, and the output transistor receiving the clock signal via its first conductive terminal, the second conductive terminal of the output transistor being connected to a first electrode of the capacitor, the control terminal of the set transistor and the first conductive terminal of the set transistor being connected to each other, and the second conductive terminal of the set transistor being connected to (i) the control terminal of the output transistor and (ii) a second electrode of the capacitor, the first conductive terminal of the reset transistor being connected to the control terminal of the output transistor, and the second conductive terminal of the reset transistor being connected to a constant potential source, and the second conductive terminal of the output transistor serving as an output terminal of the respective unit circuit.

The display panel drive circuit of the present invention may be configured in such a manner that a unit circuit in the end stage includes a set transistor, an output transistor, a clear transistor provided for resetting the end stage, and a capacitor; the set transistor, output transistor, and clear transistor each having a control terminal, a first conductive terminal, and a second conductive terminal, and the capacitor having a first electrode and a second electrode, the set transistor receiving, via its control terminal, a signal line selection signal outputted from a stage previous to its own stage, the clear transistor receiving the clear signal via its control terminal, and the output transistor receiving the clock signal via its first conductive terminal, the second conductive terminal of the output transistor being connected to the first electrode of the capacitor, the control terminal of the set transistor and the first conductive terminal of the set transistor being connected to each other, and the second conductive terminal of the set transistor being connected to (i) the control terminal of the output transistor and (ii) the second electrode of the capacitor, the first conductive terminal of the clear transistor being connected to the control terminal of the output transistor, and the second conductive terminal of the clear transistor being connected to a constant potential source, and the second conductive terminal of the output transistor serving as an output terminal of the unit circuit in the end stage.

The display panel drive circuit of the present invention may be configured in such a manner that the unit circuit of the end stage further includes a potential supplying transistor, the potential supplying transistor having a control terminal, a first conductive terminal, and a second conductive terminal, the potential supplying transistor receiving the clear signal via its control terminal, the first conductive terminal of the potential supplying transistor being connected to the second conductive terminal of the output transistor, and the second conductive terminal of the potential supplying transistor being connected to the constant potential source.

A shift register of the present invention is a shift register provided in a display panel drive circuit, the shift register being constructed of unit circuits connected in stages, the unit circuits generating signal line selection signals, respectively, each of the signal line selection signals being made active for a respective certain period of time to form a respective pulse, the pulses being outputted successively from respective unit circuits in order of ordinal number starting from a first stage until an end stage, a unit circuit in the end stage receiving (i) a signal line selection signal generated in a stage different from its own stage, (ii) a clock signal, and (iii) a clear signal, and the clear signal being made active after a pulse is outputted from the end stage, so that the signal line selection signal outputted from the end stage remains inactive.

A method of the present invention for driving a display device including a shift register constructed of unit circuits connected in stages, the unit circuits generating signal line selection signals, respectively, each of the signal line selection signals being made active for a respective certain period of time to form a respective pulse, the shift register outputting the pulses successively from respective unit circuits in order of ordinal number starting from a first stage until an end stage, is a method including: inputting, to a unit circuit in the end stage, (i) a signal line selection signal generated in a stage different from its own stage, (ii) a clock signal, and (iii) a clear signal; and activating the clear signal after a pulse is outputted from the end stage, so that the signal line selection signal outputted from the end stage remains inactive.

According to the display panel driving circuit of the present invention, once a clear signal is made active due to anomalousness in a sync signal, pulse output from the shift register stops thereafter. Therefore, it is possible to prevent disorder of display and hold down an increase in load given to the power source.

Moreover, according to the display panel driving circuit of the present invention, it is possible to reset the shift register by use of the clear signal at an end stage (unit circuit). Consequently, a dummy stage (dummy shift circuit) is not required as in a conventional display panel driving circuit, thereby allowing reduction of circuit area in the shift register.

BRIEF DESCRIPTION OF DRAWINGS

FIG. 4 is a timing chart illustrating an operation (in case where a sync signal includes no anomalousness) of the shift register shown in FIG. 3.

FIG. 6 is a circuit diagram illustrating another configuration of a present shift register.

FIG. 7 is a timing chart illustrating an operation (in a case where a sync signal includes no anomalousness) of the shift register shown in FIG. 6.

FIG. 9 is a timing chart illustrating an operation (in a case where a sync signal includes no anomalousness) of the shift register shown in FIG. 8.

FIG. 14 is a timing chart illustrating an operation (in a case where a sync signal includes no anomalousness) of the shift register shown in FIG. 13.

FIG. 16 is a timing chart illustrating an operation (in a case where a sync signal includes anomalousness) of the shift register shown in FIG. 13.

FIG. 17 is a circuit diagram illustrating a through current.

FIG. 18 is a timing chart illustrating an operation (in a case where a sync signal includes anomalousness) of the shift register shown in FIG. 13.

FIG. 23 is a block diagram illustrating a configuration of a liquid crystal display device of Embodiments 1 and 2.

FIG. 29 is a circuit diagram illustrating another configuration of a present shift register.

FIG. 35 is a circuit diagram illustrating another configuration of the shift register of Embodiment 3.

FIG. 36 is a timing chart illustrating an operation (in a case where a sync signal includes no anomalousness) of the shift register shown in FIG. 35.

REFERENCE SIGNS LIST

Figure 1:
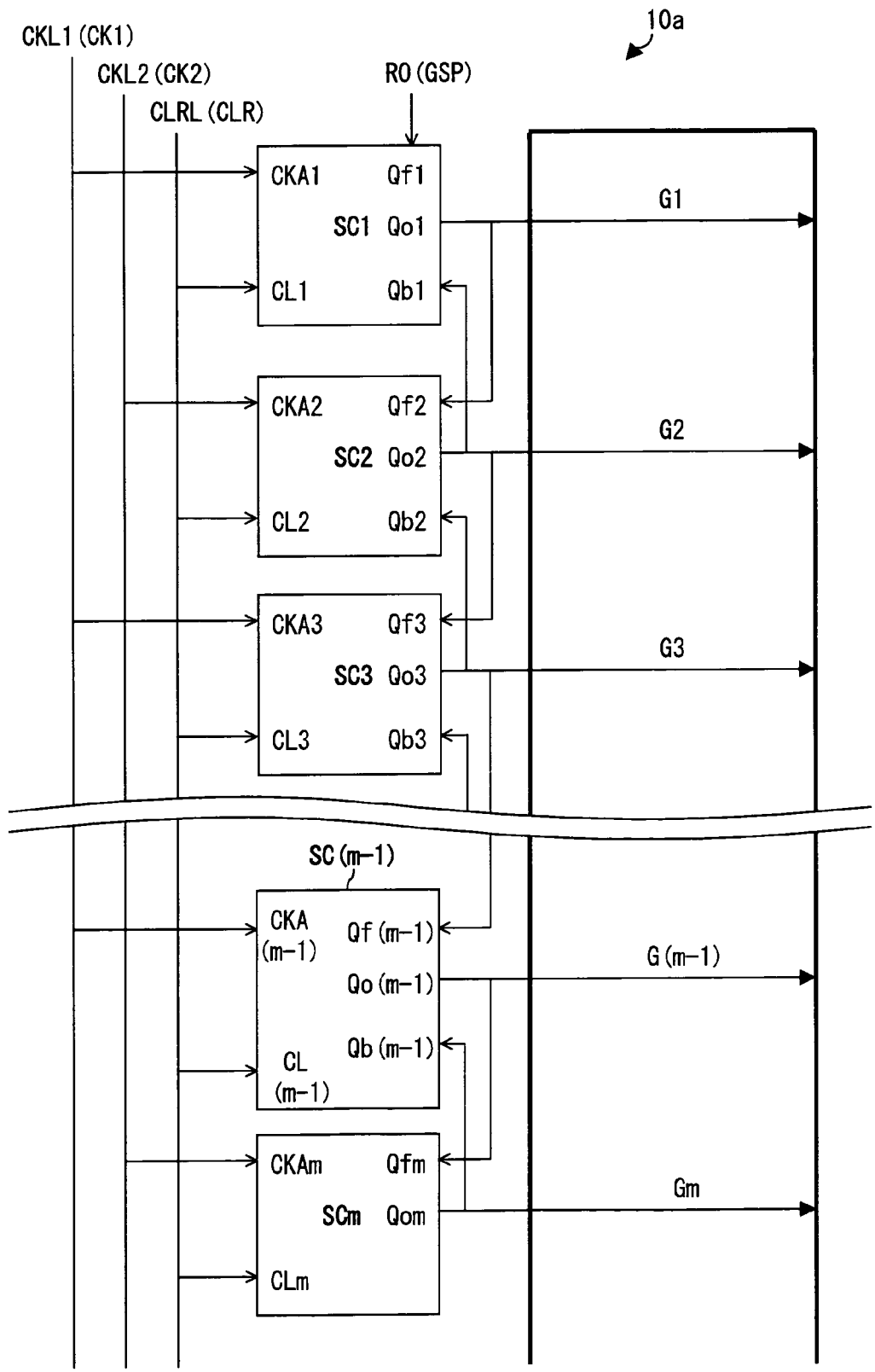
FIG. 1 is a block diagram illustrating a configuration of a present shift register.

1: Liquid crystal display device (display device)
10, 10a to 10g:
   Shift register
G1 to Gm:
   Gate on-pulse (signal line selection signal)
SC1 to SCm:
   Shift circuit (unit circuit)
GSP: Gate start pulse
CK1: First clock signal
CK2: Second clock signal
CLR: Clear signal Tra: Set transistor
Trb: Output transistor
Trc: Clear transistor
Trd: Reset transistor
Tre: Low-potential supplying transistor

DESCRIPTION OF EMBODIMENTS

The following describes one embodiment of the present invention, with reference to FIGS. 1 through 39.

FIG. 23 is a block diagram illustrating a configuration of a liquid crystal display device of the present invention. As shown in FIG. 23, a liquid crystal display device 1 of the present invention includes a liquid crystal panel 3, a gate driver 5, a source driver 6, a timing controller 7, a data processing circuit 8, and an anomalousness detection circuit 9. The gate driver 5 includes a shift register 10 and a level shifter 4. The gate driver 5, the timing controller 7, and the anomalousness detection circuit 9 make up a liquid crystal panel driving circuit 11. Note that, in the present embodiment, the level shifter 4 is included in the gate driver 5. However, the level shifter 4 can be provided outside of the gate driver 5.

The liquid crystal panel 3 includes scanning signal lines 16 driven by the gate driver 5, data signal lines 15 driven by the source driver 6, pixels P, storage capacitor wires (not illustrated), and the like. Further, the shift register 10 is monolithically provided in the liquid crystal panel 3. Each of the pixels P is provided with (i) a transistor (TFT) which is connected to one of the scanning signal lines 16 and one of the data signal lines 15 and (ii) a pixel electrode connected to the transistor. Note that the transistors provided in the pixels and a transistor of the shift register can be formed by use of amorphous silicon, polycrystalline silicon, CG silicon, or the like.

The timing controller 7 receives, from outside of the liquid crystal display device 1, a vertical sync signal VSYNC, a horizontal sync signal HSYNC, and a data-enable signal DE, each of which is a sync signal. Note that these sync signals (VSYNC, HSYNC, and DE) are supplied also to the anomalousness detection circuit 9. Moreover, the data processing circuit 8 receives video data (RGB digital data) from outside of the liquid crystal display device 1. The anomalousness detection circuit 9 detects anomalousness in the sync signals and sends an error signal to the timing controller 7 in a case where the anomalousness detection circuit 9 detects anomalousness in a sync signal. Note that the anomalousness detection circuit 9 can detect anomalousness in sync signals with use of, for example, a method disclosed in "Japanese Patent Application Publication No. 2003-167545". The timing controller 7 generates a plurality of source clock signals (ck1, ck2 etc.), a source clear signal (clr), and a source gate start pulse signal (gsp) with use of the sync signals and the error signal sent from the anomalousness detection circuit 9. Note that the source clock signals (e.g., ck1 and ck2), the source clear signal (clr), and the source gate start pulse signal (gsp) are shifted in level by the level shifter 6 so as to become clock signals (CK1, CK2 etc.), a clear signal (CLR), and a gate start pulse signal (GSP), respectively. The timing controller 7 outputs a control signal to the data processing circuit 8, and also outputs a source timing signal to the source driver 6 based on the received sync signals (VSYNC, HSYNC, and DE).

The clock signals (CKA, CKB etc.), the clear signal (CLR), and the gate start pulse signal (GSP) are supplied to the shift register 10. The clear signal (CLR) becomes "L" (inactive) in a case where the sync signals (VSYNC, HSYNC, and DE) includes no anomalousness, becomes "H" (active) in a case where at least one of the sync signals (VSYNC, HSYNC, and DE) include anomalousness, and becomes "H" (active) after a pulse is outputted from the end stage regardless of whether or not anomalousness is included in the sync signals. The shift register 10 generates gate on-pulse signals with use of these signals (CKA, CKB etc.; CLR; and GSP), and outputs the gate on-pulse signals to the scanning signal lines provided in the liquid crystal panel 3. The shift register 10 includes shift circuits connected in stages, which each of the shift circuits generates a gate on-pulse signal. The gate on-pulse signals generated in the stages (shift circuits) are successively activated for a respective given period. This causes pulses (on-pulses) to be outputted successively in order of ordinary number from the first stage until the end stage. Thereafter, in the liquid crystal panel 3, the scanning signal lines are successively selected, in accordance with the pulses.

The data processing circuit 8 carries out a predetermined process to video data, and outputs a data signal to the source driver 6 in accordance with the control signal outputted from the timing controller 7. The source driver 6 generates signal potential with use of (i) the data signal outputted from the data processing circuit 8 and (ii) the source timing signal outputted from the timing controller 7, and outputs the generated signal potential to the data signal lines provided in the liquid crystal panel 3. The signal potentials are written in pixel electrodes of the pixels via the transistors of the pixels.

Embodiment 1

FIG. 1 illustrates a configuration of a shift register 10a in accordance with the present Embodiment 1. As shown in FIG. 1, the shift register 10a is made up of a plurality of shift circuits (unit circuits) SC1, SC2, . . . and SCm connected in stages. Each of the shift circuits SCi (i=1, 2, 3, . . . and m−1) includes input nodes Qfi, Qbi, CKAi, and CLi, and an output node Qoi. The shift circuit SCm includes input nodes Qfm, CKAm, and CLm, and an output node Qom.

The shift circuit SC1 has its node Qf1 be connected to a GSP output terminal RO of the level shifter (see FIG. 23). Further, the shift circuit has its node Qb1 be connected to the node Qo2 of a shift circuit SC2, has its node CKA1 be connected to a first clock line CKL1 to which a first clock signal is supplied, and has its node CL1 be connected to a clear line CLRL to which a clear signal (CLR) is supplied. Further, the shift circuit SC1 outputs a gate on-pulse signal (signal line selection signal) G1 via its node Qo1.

Each of the shift circuits SCi (i=2 to m−1) has its node Qfi be connected to the node Qo(i−1) of the shift circuit SC(i−1) and has its node Qbi be connected to the node Qo(i+1) of the shift circuit SC(i+1). In a case where is an odd number, the node CKAi is connected to the first clock line CKL1, and in a case where i is an even number, the node CKAi is connected to the second clock line CKL2. Further, the node CLi of each of the shift circuits SCi is connected to the clear line CLRL. Moreover, each of the shift circuits SCi outputs a gate on-pulse signal (signal line selection signal) G1 via its node Qoi.

The shift circuit SCm has its node Qfm be connected to the node Qo(m−1) of the shift circuit SC(m−1), has its node CKAm be connected to the second clock line CKL2, and has its node CLm be connected to the clear line CLRL. Further, the shift circuit SCm outputs a gate on-pulse signal (signal line selection signal) Gm via its node Qom.

Figure 2:
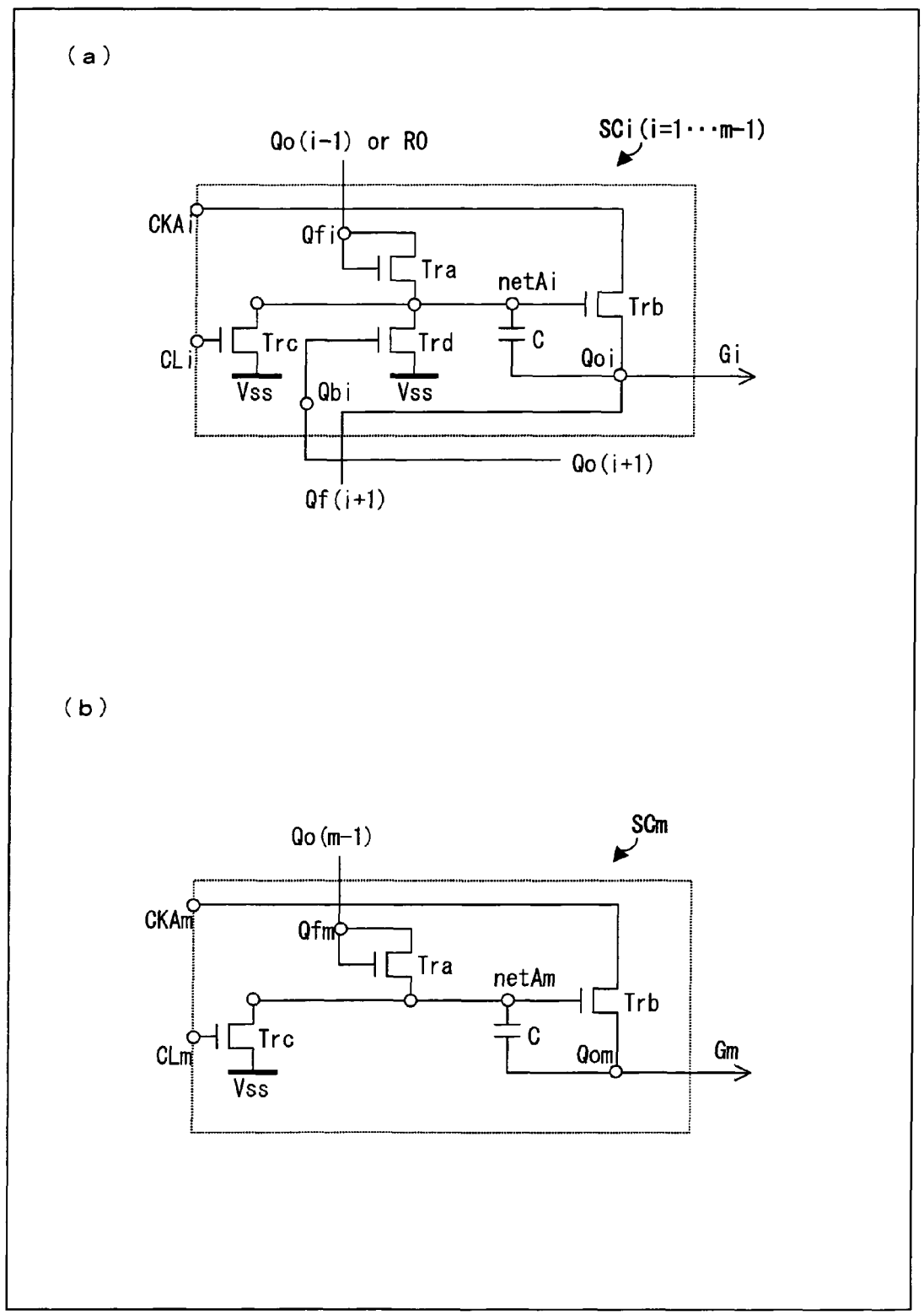
FIG. 2 Parts (a) and (b) of FIG. 2 are circuit diagrams illustrating a configuration of a unit circuit of a shift register.

Specifically illustrated in (a) of FIG. 2 is a circuit diagram of a configuration employed by each of the shift circuits SCi (i=1 to m−1). As illustrated in (a) of FIG. 2, each of the shift circuits SCi (i=1 to m−1) includes a set transistor Tra, an output transistor Trb, a clear transistor Trc, a reset transistor Trd, and a capacitor C. Note that each of the transistors Tra to Trd is an N-channel transistor.

The transistor Trb has its source terminal be connected to a first electrode of the capacitor C. The transistor Tra has its gate terminal (control terminal) and its drain terminal be connected to each other, and has its source terminal be connected to (i) a gate terminal of the transistor Trb and (ii) a second electrode of the capacitor C. The transistor Trc has its drain terminal be connected to the gate terminal of the transistor Trb and its source terminal be connected to a lower-potential-side power supply Vss. The transistor Trd has its drain terminal be connected to the gate terminal of the transistor Trb and its source terminal be connected to the lower-potential-side power supply Vss. The gate terminal of the transistor Tra is connected to the node Qfi, the transistor Trb has its drain terminal be connected to the node CKAi, the transistor Trc has its gate terminal be connected to the node CLi; the transistor Trd has its gate terminal be connected to the node Qbi; and the source terminal of the transistor Trb is connected to the node Qoi. Note that a connection point of the source terminal of the transistor Tra, the second electrode of the capacitor C, and the gate terminal of the transistor Trb is defined as a node netAi.

Specifically illustrated in (b) of FIG. 2 is a circuit diagram of a configuration of the shift circuit SCm. As illustrated in (b) of FIG. 2, the shift circuit SCm includes a set transistor Tra, an output transistor Trb, a clear transistor Trc, and a capacitor C. Note that each of the transistors Tra to Trc is an N-channel transistor, and the capacitor C can also be parasitic capacitor. The transistor Trb has its source terminal be connected to a first electrode of the capacitor C. The transistor Tra has its gate terminal (control terminal) and its drain terminal be connected to each other, and the transistor Tra has its source terminal be connected to (i) a gate terminal of the transistor Trb and (ii) a second electrode of the capacitor C. The transistor Trc has its drain terminal be connected to the gate terminal of the transistor Trb and has its source terminal be connected to a lower-potential-side power supply Vss. The gate terminal of the transistor Tra is connected to the node Qfm, the transistor Trb has its drain terminal be connected to the node CKAm, the transistor Trc has its gate terminal be connected to the node CLm, and the source terminal of the transistor Trb is connected to the node Qom. Note that a connection point of the source terminal of the transistor Tra, the second electrode of the capacitor C, and the gate terminal of the transistor Trb is defined as a node netAm.

The nodes (Qfi, Qbi, CKAi, CLi, and Qoi) in each of the shift circuits SCi (i=1 to m−1) and the nodes (Qfm, CKAm, CLm, and Qom) in the shift circuit SCm are connected to respective destinations as illustrated in FIG. 1. The configuration of an entire shift register 10a is as specifically illustrated in FIG. 3.

Figure 3:
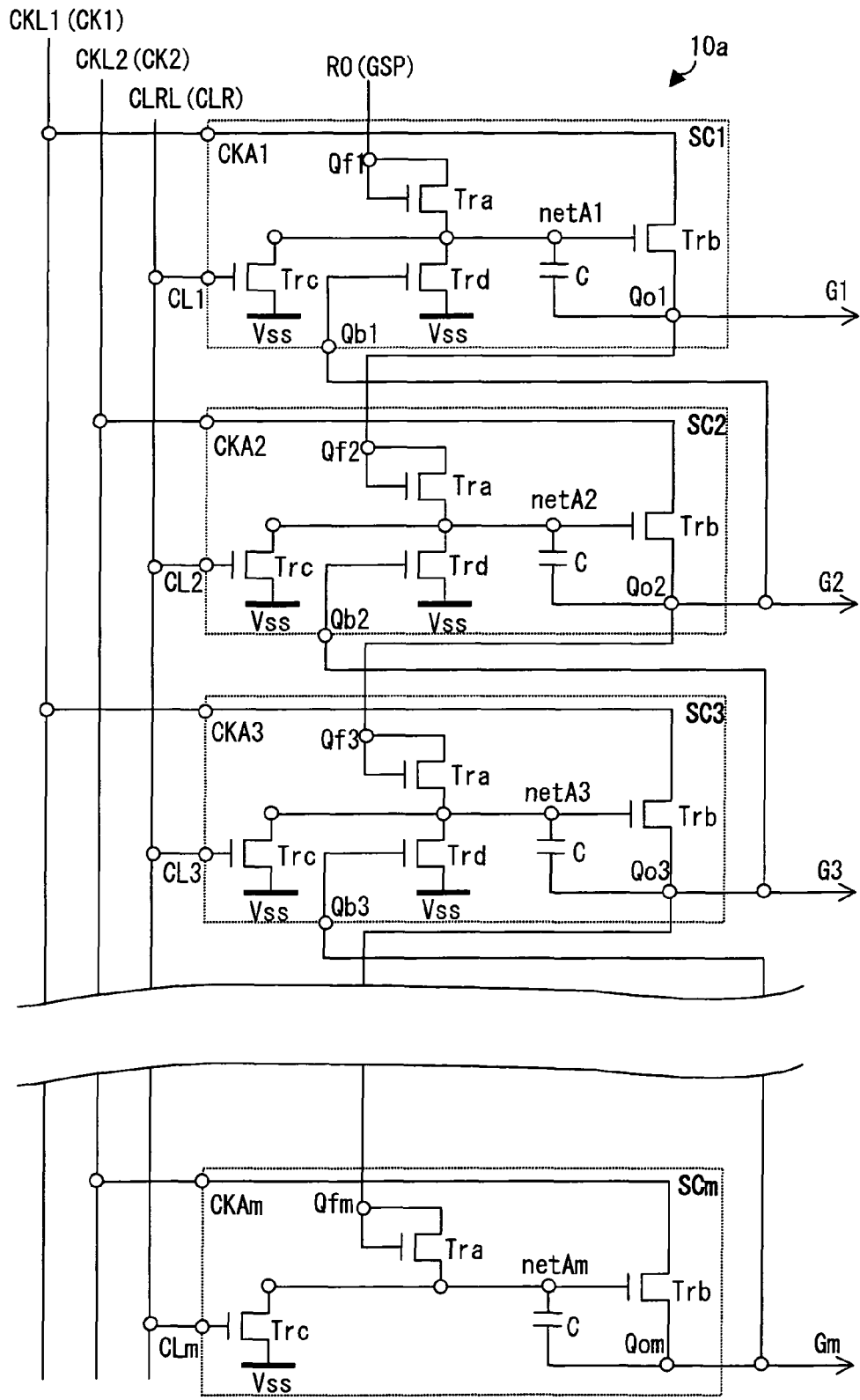
FIG. 3 is a circuit diagram illustrating a configuration of a present shift register.

The following describes operations of the shift register 10a illustrated in FIG. 3. FIG. 4 is a timing chart illustrating waveforms of a vertical sync signal VSYNC, a gate start pulse signal GSP, a first clock signal CK1, a second clock signal CK2, gate on-pulse signals Gi (i=1 to m), and a clear signal (CLR), in a case where the sync signals include no anomalousness. Note that each of the first clock signal CK1 and the second clock signal CK2 includes, in one cycle, one clock period of a "H" (active) period and three clock periods of a "L" (inactive) period. After one of the clock signals CK1 and CK2 is inactivated (falls), the other one of the clock signals CK1 and CK2 is activated (rises) with a delay of one clock period. This is merely an example of the first and second clock signals CK1 and CK2; the "H" period and "L" period may be arbitrarily set as long as there is a period in which both clock signals coincide as "L".

At t0 in FIG. 4, activation of the gate start pulse signal GSP causes a rise in electric potential of Qf1. This rise in the electric potential turns Tra of SC1 ON, thereby causing electric potential at netA1 to change from "L" to "H". As a result, Trb of SC1 is also turned ON, and accordingly CK1 is outputted via Qo1. According to the configuration, G1 remains at "L". At t1, which is a timing one clock period elapsed after t0, GSP falls (is inactivated) and becomes "L". However, the electric potential at the node netA1 is maintained at "H" by the capacitor C of SC1, and accordingly Trb of SC1 also remains turned ON.

At t2, which is a timing one clock period elapsed after t1, CK1 rises (is activated), thereby causing G1 to be activated and become "H". At this point, the electric potential at netA1 rises to an electric potential higher than "H" by the capacitor C. Moreover, the activation of G1 causes electric potential at Qf2 to rise. As a result, Tra of SC2 is turned ON, thereby causing electric potential at netA2 to change from "L" to "H". This also causes Trb of SC2 to be turned ON, and accordingly CK2 is outputted via Qo2. According to the configuration, G2 remains at "L".

At t3, which is a timing one clock period elapsed after t2, CK1 falls and becomes "L", and the electric potential at netA1 also returns back to "H". However, since Trb of SC1 remains turned ON, CK1 is continuously outputted via Qo1. According to the configuration, G1 is inactivated from "H" to "L", and this state "L" is maintained. Note that, even if G1 is inactivated and becomes "L", the electric potential at netA2 is maintained at "H" by the capacitor C of SC2, and Trb of SC2 remains turned ON.

At t4, which is a timing one clock period elapsed after t3, CK2 rises, thereby causing G2 to be activated and become "H". At this point, the electric potential at netA2 rises to an electric potential higher than "H" by the capacitor C. Moreover, the activation of G2 causes electric potential at Qb1 to rise; consequently, Trd of SC1 turns ON, which connects netA1 to Vss, thereby causing the electric potential at netA1 to change from "H" to "L". As a result, Trb of SC1 is turned OFF, and CK1 is no longer outputted via Qo1.

At t5, which is a timing one clock period elapsed after t4, CK2 falls and becomes "L" and the electric potential at netA2 also is returned back to "H". However, since Trb of SC2 remains turned ON, CK2 is continuously outputted via Qo2. According to the configuration, G2 is inactivated from "H" to "L", and this state "L" is maintained.

Further, at tx, CK2 rises, and accordingly Gm is also activated and becomes "H". At this point, the electric potential at netAm rises to an electric potential higher than "H" by the capacitor C.

At ty, which is a timing one clock period elapsed after tx, CK2 falls and becomes "L", and the electric potential at netAm is also returned back to "H". However, since Trb of SCm remains turned ON, CK2 is continuously outputted via Qom. According to the configuration, Gm is inactivated from "H" to "L", and this state "L" is maintained.

At tz, which is a timing one clock period elapsed after ty, CK2 remains at "L". However, since the clear signal CLR is activated and becomes "H", Trc of SCm turns ON, which connects netAm to Vss, thereby causing the electric potential at netAm to change from "H" to "L". As a result, Trb of SCm is turned OFF, and CK2 is no longer outputted via Qom.

Note that, in FIG. 4, the clear signal CLR is activated at tz (which is one clock period elapsed after the fall of Gm). However, the present invention is not limited to this. For example, the clear signal CLR can be activated between ty and tz (ty exclusive). However, the clear signal CLR should not be activated at ty. This is because, if the clear signal CLR is activated at ty, Gm maintains its "H" (active) state.

As described above, in a case where the sync signal includes no anomalousness, the gate-on pulse signals G1 outputted from the respective shift circuits SCi (i=1 to m) are successively made active each for a respective certain period of time in the shift register 10a, and accordingly the pulses P1 to Pm are outputted successively from respective shift circuits in an order of ordinary number, from the shift circuit SC1 in the first stage to the shift circuit SCm in the end stage.

Figure 5:
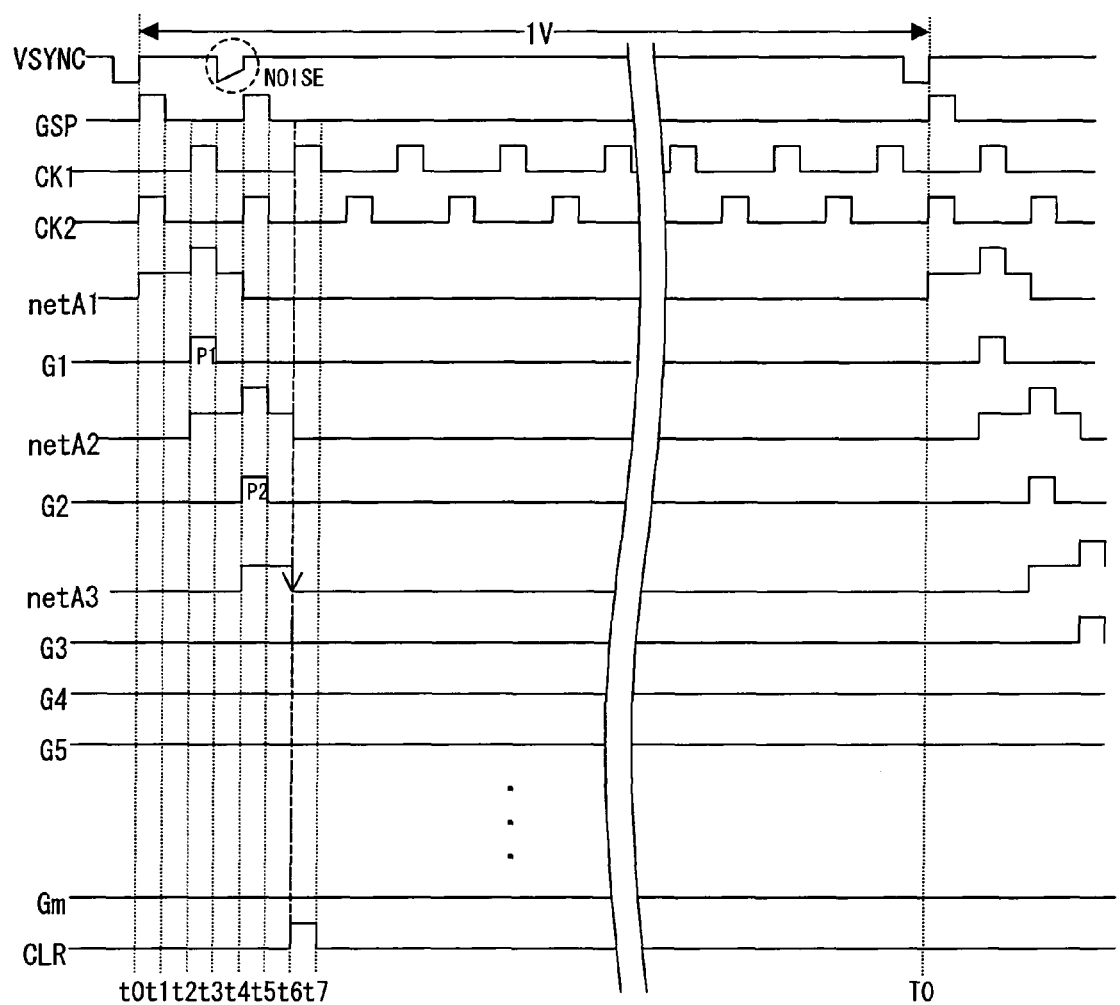
FIG. 5 is a timing chart illustrating an operation (in a case where a sync signal includes anomalousness) of the shift register shown in FIG. 3.

FIG. 5 is a timing chart illustrating waveforms of a vertical sync signal VSYNC, a gate start pulse signal GSP, a first clock signal CK1, a second clock signal CK2, gate on-pulse signals Gi (i=1 to m), and a clear signal (CLR), in a case where the sync signal includes anomalousness.

Operations of the shift resister 10a from t0 to t5 in FIG. 5 are identical to those illustrated in FIG. 4. At t5, CK2 falls and becomes "L", and the electric potential at netA2 also returns to "H"; however, since Trb of SC2 remains turned ON, CK2 is continuously outputted via Qo2. According to the configuration, G2 is inactivated from "H" to "L", and this state "L" is maintained. At t5, G2 is inactivated and becomes "L", but the electric potential at netA3 is maintained at "H" by the capacitor C of the shift circuit SC3, and accordingly the transistor Trb of the shift circuit SC3 remains turned ON.

In a case where, as illustrated in FIG. 5, noise generates in the vertical sync signal VSYNC between t3 and t4, and accordingly GSP is activated at an unexpected timing (t4), the clear signal CLR is activated and becomes "H" at t6. This causes Trc of SC3 to be turned ON, which connects netA3 to Vss, thereby causing the electric potential at netA3 to change from "H" to "L". As a result, Trb of SC3 turns OFF, and CK1 is no longer outputted via Qo3. Accordingly, G3 remains at "L" (inactive). According to the configuration, no pulse is outputted from SC3; this avoids Trb of SC4, SC5, . . . and SCm to be turned ON, which shift circuits are the shift circuits in the subsequent stages, and as a result no pulse is outputted from these shift circuits. Hence, during a current vertical scanning period, no pulse is outputted from the shift circuits subsequent to the shift circuit SC2 (pulse P2), and accordingly the gate on-pulse signals outputted from the respective stages remain at "L" (inactive) until a subsequent vertical scanning period (T0) starts.

Note that, in FIG. 5, the clear signal CLR is activated at t6, however the present invention is not limited to this. The clear signal CLR can be activated between t5 and t6.

According to the embodiment, the clear signal CLR becomes "H" (active) in a case where the sync signal (VSYNC, HSYNC, or DE) includes anomalousness, and no pulse is outputted from the shift register thereafter until the subsequent vertical scanning period starts. This makes it possible to prevent occurrence of display disorder and to hold down increase of load given on the power source.

Note that the shift register 10a illustrated in FIG. 3 can be configured as like a shift register 10b illustrated in FIG. 6. The shift register 10b, in addition to the configuration of the shift register 10a, includes a N-channel low-potential supplying transistor Tre in the shift circuit SCm in the end stage. The transistor Tre has its source terminal be connected to the lower-potential-side power supply, its drain terminal be connected to the node Qom, and its gate terminal be connected to the node CLm.

According to the configuration of the shift register 10b, it is possible to cause Gm to fall by activating the clear signal CLR. Accordingly, as shown in FIG. 7, the clear signal CLR is activated synchronously with the fall (inactivation) of Gm, at ty.

Figure 8:
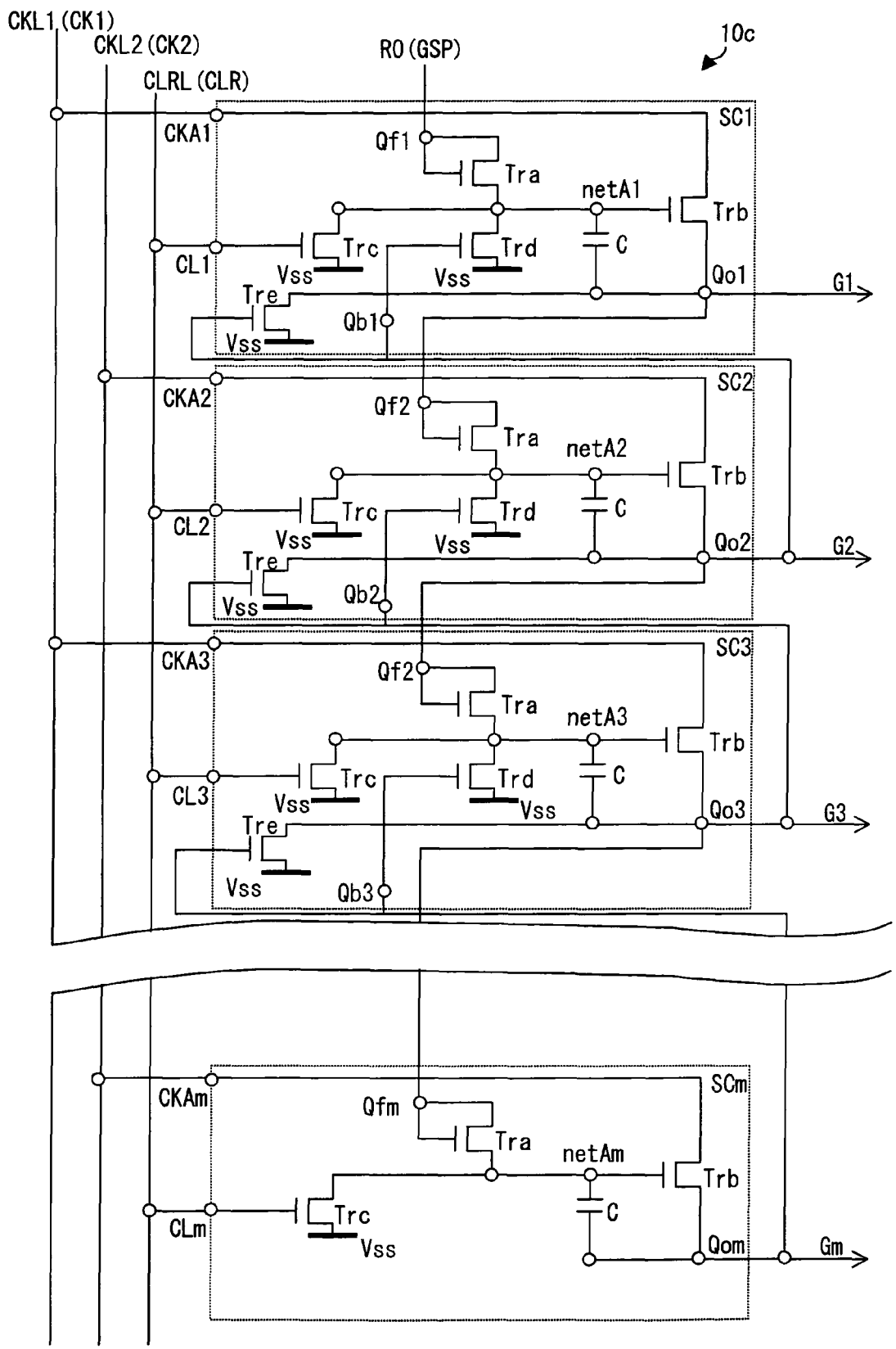
FIG. 8 is a circuit diagram illustrating another configuration of a present shift register.

Alternatively, the shift register 10a illustrated in FIG. 3 can be configured as like a shift register 10c illustrated in FIG. 8. The shift register 10c, in addition to the configuration of the shift register 10a, includes an N-channel low-potential supplying transistor Tre in each of the shift circuits SCi (i=1 to m−1). The transistor Tre has its source terminal connected to the lower-potential-side power supply, its drain terminal connected to the node Qoi, and its gate terminal connected to the node Qbi.

The following describes operations of the shift register 10c illustrated in FIG. 8. FIG. 9 is a timing chart illustrating waveforms of a vertical sync signal VSYNC, a gate start pulse signal GSP, a first clock signal CK1, a second clock signal CK2, gate on-pulse signals Gi (i=1 to m), and a clear signal (CLR), each in a case where the sync signal includes no anomalousness. Note that each of the first clock signal CK1 and the second clock signal CK2 includes, in one cycle, one clock period of a "H" (active) period and one clock period of a "L" (inactive) period. Upon fall of one of the clock signals CK1 and CK2, the other one of the clock signals CK1 and CK2 synchronously rises.

At t0 in FIG. 9, activation of GSP causes a rise in electric potential of Qf1. This rise in the electric potential turns Tra of SC1 ON, thereby causing electric potential at netA1 to change from "L" to "H". As a result, Trb of SC1 turns ON, and accordingly CK1 is outputted via Qo1. According to the configuration, the gate on-pulse signal G1 remains at "L".

At t1, which is a timing one clock period elapsed after t0, GSP falls (is inactivated) and becomes "L". However, no fall occurs to the electric potential at netA1 by the capacitor C of SC1, and accordingly Trb of SC1 remains turned ON. According to the configuration, the rise of CK1 causes G1 to activate, and makes G1 be "H". At this point, the electric potential at netA1 rises to an electric potential higher than "H" by the capacitor C. Moreover, the activation of G1 causes electric potential at Qf2 to rise. As a result, Tra of SC2 is turned ON, thereby causing electric potential at netA2 to change from "L" to "H". This also causes Trb of SC2 to be turned ON, and accordingly CK2 is outputted via Qo2. According to the configuration, G2 remains at "L".

At t2, which is a timing one clock period elapsed after t1, CK2 rises, thereby causing G2 to activate and become "H". At this point, the electric potential at netA2 rises to an electric potential higher than "H" by the capacitor C. Moreover, the activation of G2 causes electric potential at Qb1 to rise; consequently, Trd of SC1 is turned ON, which connects netA1 to Vss, thereby causing the electric potential at netA1 to change from "H" to "L". As a result, Trb of SC1 is turned OFF, and CK1 is no longer outputted via Qo1. Moreover, the activation of G2 causes electric potential of Qb1 to rise; consequently, Tre of SC1 is turned ON, which connects Qo1 to Vss, thereby causing electric potential at Qo1 to change from "H" to "L". According to the configuration, G1 is inactivated from "H" to "L", and this state "L" is maintained. Note that, even if G1 is inactivated and becomes "L", the electric potential at netA2 is maintained by the capacitor C of SC2, and accordingly Trb of SC2 remains turned ON. Moreover, when the gate on-pulse signal G2 is activated and electric potential of Qf3 rises, Tra of SC3 turns ON, and accordingly electric potential at netA3 is changed from "L" to "H". As a result, Trb of SC3 is turned on, which causes CK1 be outputted via Qo3. According to the configuration, G3 remains at "L".

At t3, which is a timing one clock period elapsed after t2, CK1 rises, thereby causing G3 to be activated and become "H". Moreover, the activation of G3 causes electric potential of Qb2 to rise. As a result, Trd of the shift circuit SC2 turns ON, which connects netA2 to Vss, thereby causing electric potential at netA2 to change from "H" to "L". Accordingly, Trb of SC2 is turned OFF and CK2 is no longer outputted via Qo2. Moreover, the activation of G3 causes electric potential of Qb2 to rise. As a result, Tre of SC2 is turned ON, which connects Qo2 to Vss, and thus the electric potential at Qo2 is changed from "H" to "L". According to the configuration, G2 is inactivated from "H" to "L", and this state "L" is maintained.

Further, at tx, CK2 rises, and accordingly Gm is also activated and becomes "H". At this point, the electric potential at netAm rises to an electric potential higher than "H" by the capacitor C.

At ty, which is a timing one clock period elapsed after tx, CK2 falls and becomes "L", and the electric potential at netAm also is returned back to "H". However, since Trb of SCm is remained turned ON, CK2 is continuously outputted via Qom. According to the configuration, Gm is inactivated from "H" to "L", and this state "L" is maintained.

At tz, which is a timing one clock period elapsed after ty, the clear signal CLR is activated and becomes "H". Accordingly, Trc of SCm is turned ON, which connects netAm to Vss, thereby causing the electric potential at netAm to change from "H" to "L". As a result, Trb of SCm is turned OFF, and CK2 is no longer outputted via Qom.

Note that, in FIG. 9, the clear signal CLR is activated at tz (which is one clock period elapsed after the fall of Gm). However, the present invention is not limited to this. For example, the clear signal CLR can be activated between ty and tz (ty exclusive). However, the clear signal CLR should not be activated at ty. This is because, if the clear signal CLR is activated at ty, Gm maintains its "H" (active) state.

As described above, in a case where the sync signal includes no anomalousness, the gate on-pulse signals Gi outputted from the respective shift circuits SCi (i=1 to m) are successively activated each for a respective certain period of time in the shift register 10b, and accordingly the pulses are outputted successively from respective shift circuits in the order of ordinary number, from the shift circuit SC1 in the first stage until the shift circuit SCm in the end stage.

Figure 10:
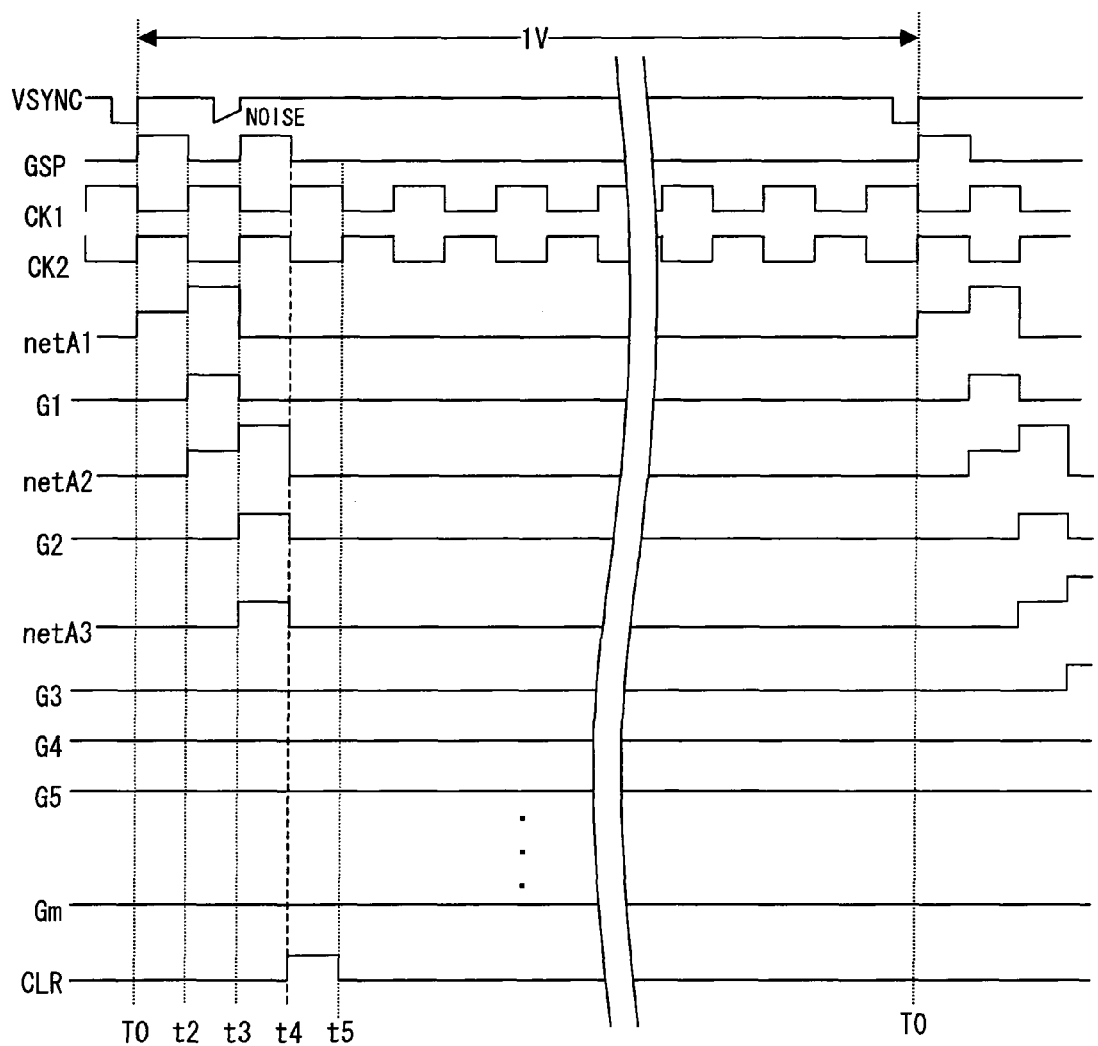
FIG. 10 is a timing chart illustrating an operation (in a case where a sync signal includes no anomalousness) of the shift register shown in FIG. 8.

FIG. 10 is a timing chart illustrating waveforms of a vertical sync signal VSYNC, a gate start pulse signal GSP, a first clock signal CK1, a second clock signal CK2, gate on-pulse signals Gi (i=1 to m), and a clear signal (CLR), in a case where the sync signal includes anomalousness.

Operations of the shift resister 10c from t0 to t3 in FIG. 10 are identical to those shown in FIG. 9. In a case where noise generates in the vertical sync signal VSYNC between t2 and t3 and accordingly GSP is activated at an unexpected timing (t3) (see FIG. 10), the clear signal CLR is activated and becomes "H" at t4. This causes Trc of SC3 to be turned ON, which connects netA3 to Vss, thereby causing the electric potential at netA3 to change from "H" to "L". As a result, Trb of SC3 turns OFF, and CK1 is no longer outputted via Qo3. Accordingly, the gate on-pulse signal G3 remains at "L" (inactive). According to the configuration, no pulse is outputted from SC3; this avoids Trb of SC4, SC5, ... and SCm to be turned ON, which shift circuits are the shift circuits in the subsequent stages, and as a result no pulse is outputted from these shift circuits. Accordingly, during a current vertical scanning period, no pulse is outputted from the shift circuits subsequent to the shift circuit SC2, and accordingly the gate on-pulse signals outputted from the respective stages remain at "L" (inactive) until a subsequent vertical scanning period (T0) starts.

Note that, in FIG. 10, the clear signal CLR is activated at t4, however the present invention is not limited to this. The clear signal CLR can also be activated at t5.

Figure 11:
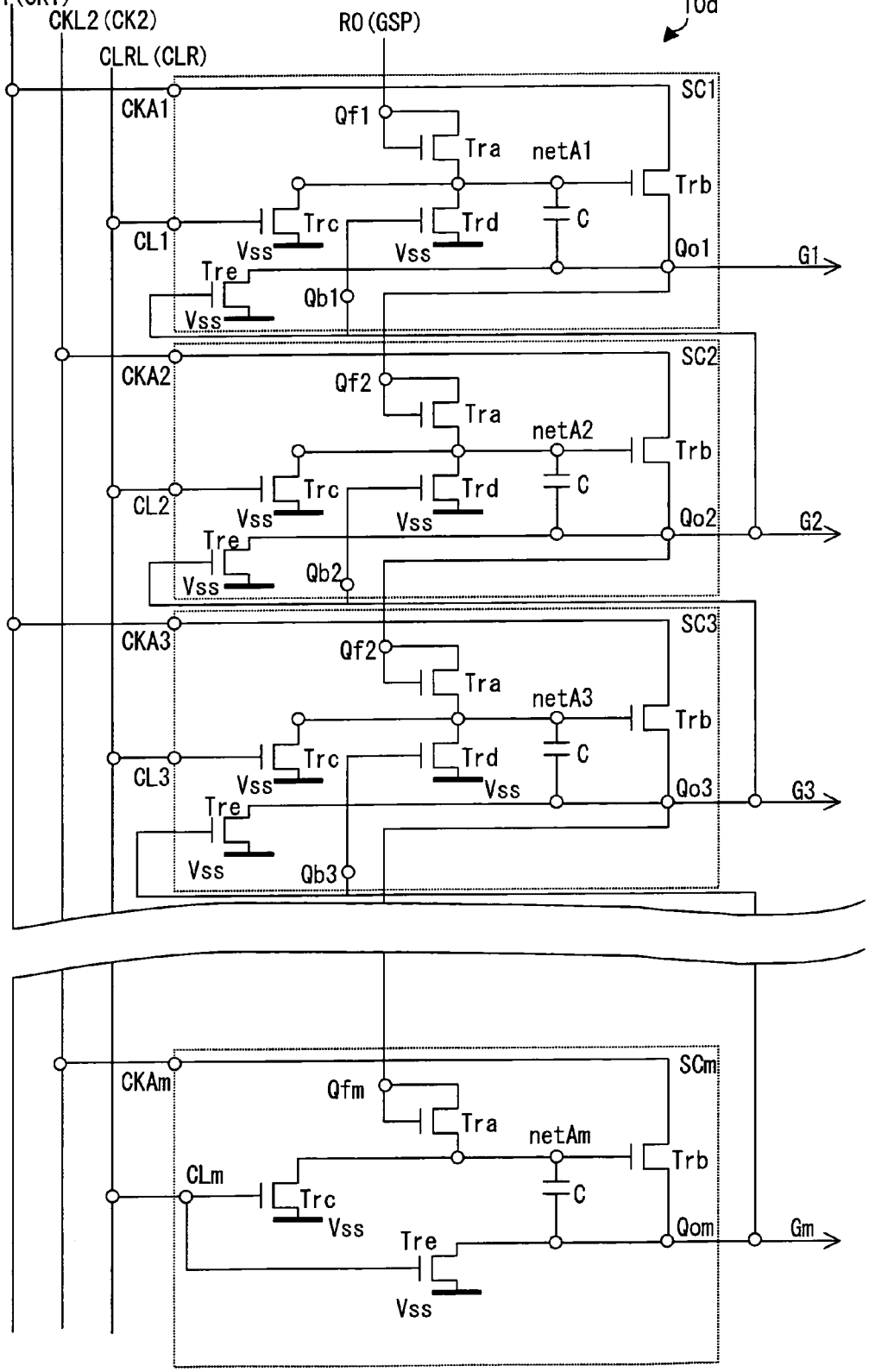
FIG. 11 is a circuit diagram illustrating another configuration of a present shift register.

Note that the shift register 10c illustrated in FIG. 8 can be configured as like a shift register 10d illustrated in FIG. 11. The shift register 10d, in addition to the configuration of the shift register 10c, includes an N-channel low-potential supplying transistor Tre in the shift circuit SCm in the end stage. The transistor Tre has its source terminal be connected to the lower-potential-side power supply, its drain terminal be connected to the node Qom, and its gate terminal be connected to the node CLm.

Figure 12:
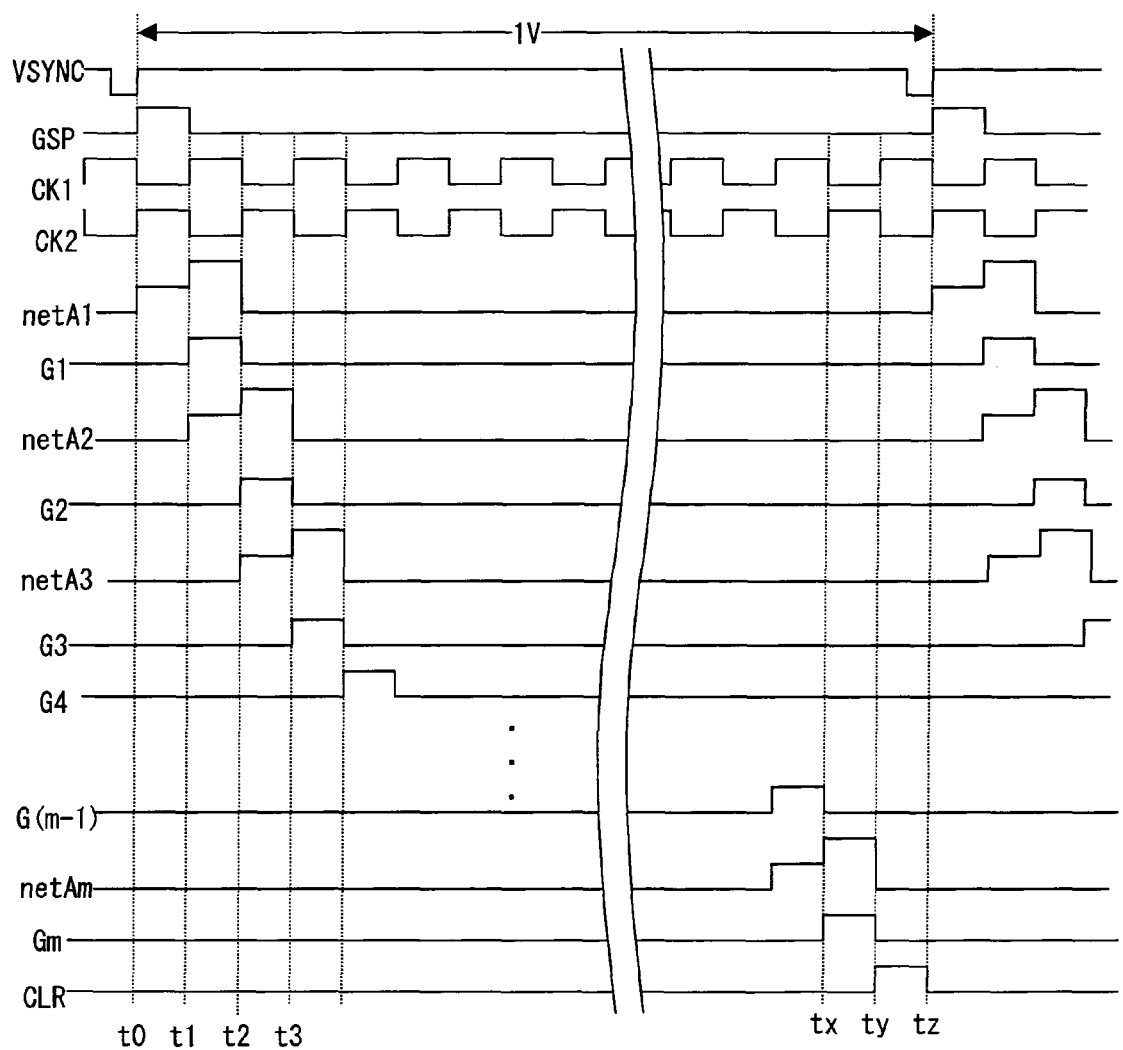
FIG. 12 is a timing chart illustrating an operation (in a case where a sync signal includes no anomalousness) of the shift register shown in FIG. 11.

According to the configuration of the shift register 10d, it is possible to cause Gm to fall by activating the clear signal CLR. Accordingly, as shown in FIG. 12, the clear signal CLR is activated synchronously with the fall (inactivation) of Gm, at ty.

Figure 13:
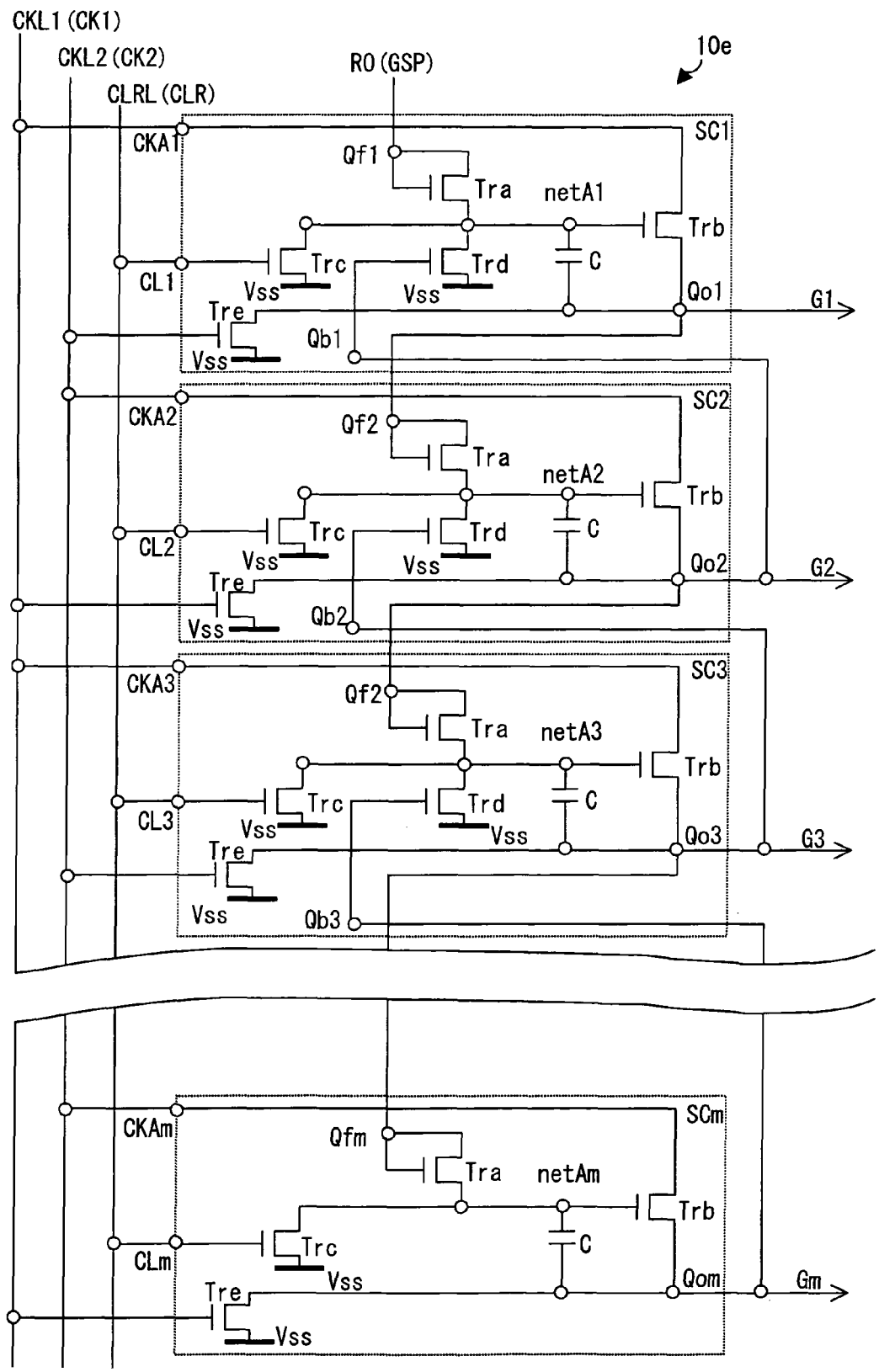
FIG. 13 is a circuit diagram illustrating another configuration of a present shift register.

Alternatively, the shift register 10a illustrated in FIG. 3 can be configured as like a shift register 10e illustrated in FIG. 13. The shift register 10e, in addition to the configuration of the shift register 10a, includes an N-channel low-potential supplying transistor Tre in each of the shift circuits SCi (i=1 to m). The transistor Tre has its source terminal be connected to the lower-potential-side power supply, its drain terminal be connected to the node Qoi, and its gate terminal be connected to the first clock line CKL1 or the second clock line CKL2. Note that, in a case where i is an odd number, the gate terminal of the transistor Tre of the shift circuit SCi is connected to the second clock line CKL2, and in a case where i is an even number, the gate terminal of the transistor Tre is connected to the first clock line CKL1.

The following describes operations of the shift register 10e illustrated in FIG. 13. FIG. 14 is a timing chart illustrating waveforms of a vertical sync signal VSYNC, a gate start pulse signal GSP, a first clock signal CK1, a second clock signal CK2, gate on-pulse signals Gi (i=1 to m), and a clear signal (CLR), in a case where the sync signal includes no anomalousness. Note that each of the first clock signal CK1 and the second clock signal CK2 includes, in one cycle, one clock period of a "H" (active) period and one clock period of a "L" (inactive) period. Upon fall of one of the clock signals CK1 and CK2, the other one of the clock signals CK1 and CK2 synchronously rises.

At t0 in FIG. 14, activation of GSP causes a rise in electric potential of Qf1. The rise in the electric potential turns Tra of SC1 ON, thereby causing electric potential at netA1 to change from "L" to "H". As a result, Trb of SC1 is turned ON, and accordingly CK1 is outputted via Qo1.

At t1, which is a timing one clock period elapsed after t0, GSP falls (is inactivated) and becomes "L". However, no fall occurs to the electric potential at netA1 by the capacitor C of SC1, and accordingly Trb of SC1 remains turned ON. According to the configuration, the rise of CK1 causes G1 to activate, and makes G1 be "H". At this point, the electric potential at netA1 rises to an electric potential higher than "H" by the capacitor C. Moreover, the activation of G1 causes electric potential at Qf2 to rise. As a result, Tra of SC2 is turned ON, thereby causing electric potential at netA2 to change from "L" to "H". This also causes Trb of SC2 to be turned ON, and accordingly CK2 is outputted via Qo2. According to the configuration, G2 remains at "L".

At t2, which is a timing one clock period elapsed after t1, CK2 rises, thereby causing G2 to be activated and become "H". At this point, the electric potential at netA2 rises to an electric potential higher than "H" by the capacitor C. Moreover, the activation of G2 causes electric potential at Qb1 to rise; consequently, Trd of SC1 is turned ON, which connects netA1 to Vss, thereby causing the electric potential at netA1 to change from "H" to "L". As a result, Trb of SC1 is turned OFF, and CK1 is no longer outputted via Qo1. Moreover, since CK2 rises at t2, Tre of SC1 is turned ON, which connects Qo1 to Vss, thereby causing the electric potential at Qo1 to change from "H" to "L". According to the configuration, the gate on-pulse signal G1 is inactivated from "H" to "L", and this state "L" is maintained. Note that, even if G1 is inactivated and becomes "L", the electric potential at netA2 is maintained by the capacitor C of SC2, and accordingly Trb of SC2 remains turned ON. Moreover, when the gate on-pulse signal G2 is activated and electric potential of Qf3 rises, Tra of SC3 turns ON, and accordingly electric potential at netA3 is changed from "L" to "H". As a result, Trb of SC3 is turned on, which causes CK1 be outputted via Qo3. According to the configuration, G3 remains at "L".

At t3, which is a timing one clock period elapsed after t2, CK1 rises, thereby causing G3 to be activated and become "H". Moreover, the activation of G3 causes electric potential of Qb2 to rise. As a result, Trd of SC2 is turned ON, which connects netA2 to Vss, thereby causing electric potential at netA2 to change from "H" to "L". Accordingly, Trb of SC2 is turned OFF and CK2 is no longer outputted via Qo2. Moreover, at t3, CK1 rises. This causes Tre of SC2 to be turned ON, which connects Qo2 to Vss, thereby causing the electric potential at node Qo2 to change from "H" to "L". According to the configuration, G2 is inactivated from "H" to "L", and this state "L" is maintained.

Note that, in the shift register 10e, CK2 is at "H" during t4 to t5 and during t6 to t7. Accordingly, Tre of SC1 is turned ON, which connects Qo1 to Vss. This makes it possible to have G1 fall to "L" again (i.e., be drawn to "L"). Similarly, CK1 is at "H" during t5 to t6. Accordingly, Tre of SC2 is turned ON, which connects Qo2 to Vss. This makes it possible to have G2 fall to "L" again (be drawn to "L").

Further, at tx, CK2 rises; accordingly, Gm is activated and becomes "H". At this point, the electric potential at netAm rises to an electric potential higher than "H" by the capacitor C.

At ty, which is a timing one clock period elapsed after tx, the clear signal CLR is activated and becomes "H". Accordingly, the transistor Trc of the shift circuit SCm is turned ON, which connects netAm to Vss. This causes the electric potential at netAm to fall to "L". As a result, Trb of SCm is turned OFF, and CK2 is no longer outputted via Qom. Further, at ty, CK1 rises. Accordingly, Tre of SCm is turned ON, which connects Qom to Vss. As a result, Gm is inactivated and becomes "L".

Note that, in FIG. 14, the clear signal CLR is activated at ty, however the present invention is not limited to this. For example, the clear signal CLR can be activated between ty and tz (ty and tz inclusive).

As described above, in a case where the sync signal includes no anomalousness, the gate on-pulse signals G1 outputted from the respective shift circuits SCi (i=1 to m) are successively activated each for a respective certain period of time in the shift register 10e, and accordingly the pulses are outputted successively from respective shift circuits in the order of ordinal number, from the shift circuit SC1 in the first stage until the shift circuit SCm in the end stage.

Figure 15:
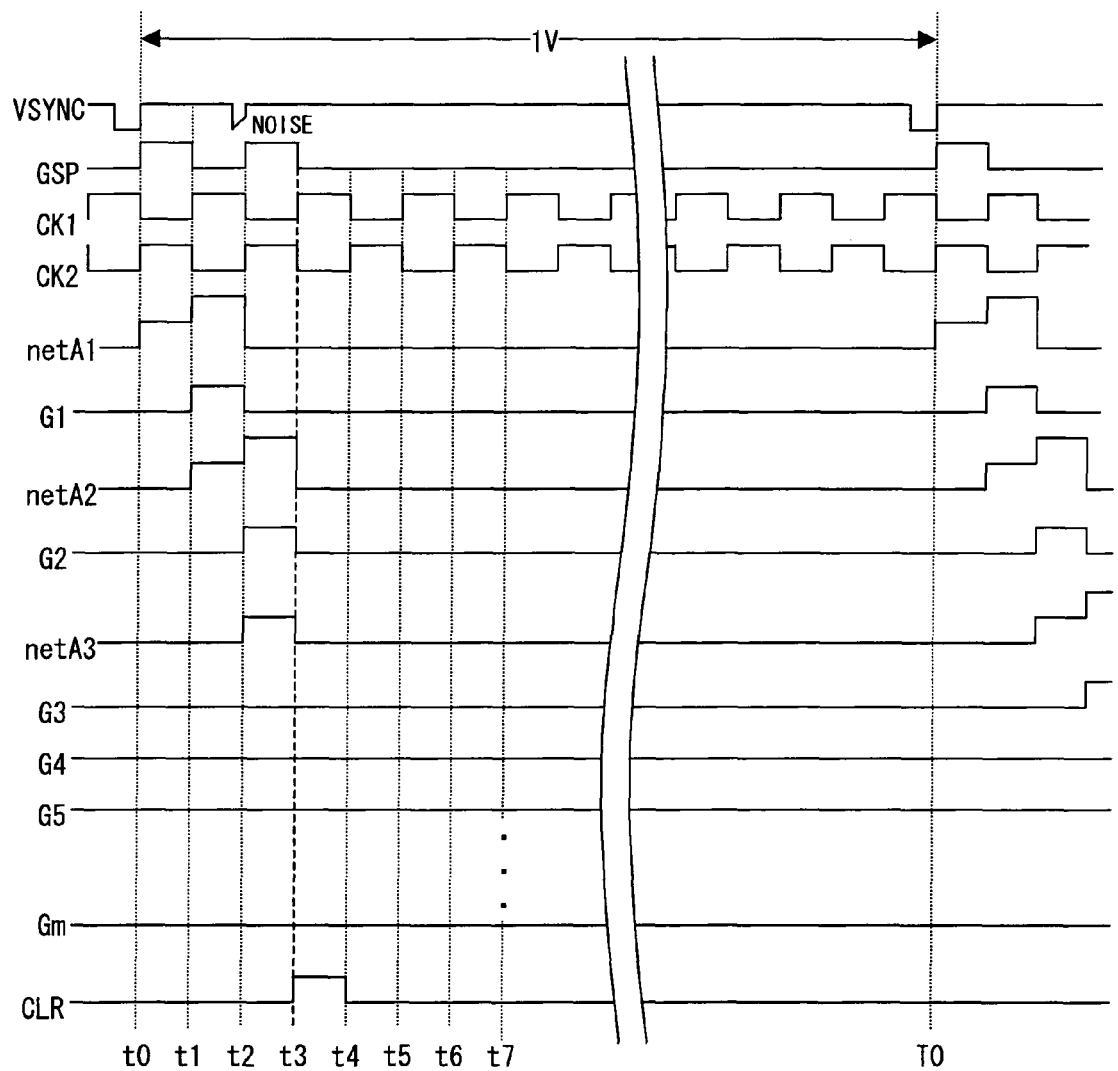
FIG. 15 is a timing chart illustrating an operation (in a case where a sync signal includes anomalousness) of the shift register shown in FIG. 13.

FIG. 15 is a timing chart illustrating waveforms of a vertical sync signal VSYNC, a gate start pulse signal GSP, a first clock signal CK1, a second clock signal CK2, gate on-pulse signals Gi (i=1 to m), and a clear signal (CLR), in a case where the sync signal includes anomalousness.

Operations of the shift register 10b from t0 to t3 in FIG. 15 are identical to those illustrated in FIG. 14. In a case where noise generates in the vertical sync signal VSYNC between t1 and t2, and accordingly the gate start pulse signal GSP is activated at an unexpected timing (t2) (see FIG. 15), the clear signal CLR is activated and becomes "H" at t3. This causes Trc of SC3 to be turned ON, which connects netA3 to Vss, thereby causing the electric potential at netA3 to change from "H" to "L". As a result, Trb of SC3 is turned OFF, and CK1 is no longer outputted via Qo3. Accordingly, G3 remains at "L" (inactive). According to the configuration, no pulse is outputted from SC3; this avoids Trb of SC4, SC5, . . . and SCm to be turned ON, which shift circuits are the shift circuits in the subsequent stages, and as a result no pulse is outputted from these shift circuits. Accordingly, during the current vertical scanning period, no pulse is outputted from the shift circuits subsequent to the shift circuit SC2, and accordingly the gate on-pulse signals outputted from the respective stages remain at "L" (inactive) until a subsequent vertical scanning period (T0) starts.

In this case also, CK2 is at "H" during t4 to t5 and during t6 to t7. Accordingly, Tre of SC1 is turned ON, which connects Qo1 to Vss. This makes it possible to have G1 fall to "L" again (i.e., drawn to "L"). Similarly, CK1 is at "H" during t5 to t6. Accordingly, the transistor Tre of the shift circuit SC2 is turned ON, which connects Qo2 to Vss. This makes it possible to have G2 fall to "L" again (drawn to "L").

Note that, in FIG. 15, the clear signal CLR is activated at t3, however the present invention is not limited to this. The clear signal CLR can be activated between t3 and t4 (t4 and t5 inclusive). For example, FIG. 16 illustrates a case where the clear signal CLR is activated between t3 and t4. That is, at ta, Trc of SC3 is turned ON, which connects netA3 to Vss, thereby causing the electric potential at netA3 to change from "H" to "L". As a result, Trb of SC3 is turned OFF, and CK1 is no longer outputted via Qo3. This causes G3 to remain at "H" (active). Moreover, at ta, Trc of SC4 is turned ON, which connects netA4 to Vss, thereby causing the electric potential at netA4 to change from "H" to "L". As a result, Trb of SC4 is turned OFF; CK2 is no longer outputted via Qo4 and G4 remains at "L" (inactive). Note that, at t4, CK2 rises. This causes Tre of SC3 to be turned ON, which connects Qo3 to Vss. As a result, G3 is inactivated and becomes "L" (inactive).

In the case of FIG. 16, a through current flows from CKL1 to Vss, during the period between ta and t4, via a path indicated by the arrow illustrated in FIG. 17. This may exert load on a power supply voltage. In view of this, in cases where the clear signal CLR is activated at ta, such a through current in FIG. 17 is prevented by causing CK1 to fall to "L" during a period in which the clear signal CLR is at "H" (active), as illustrated in FIG. 18.

Embodiment 2

Figure 19:
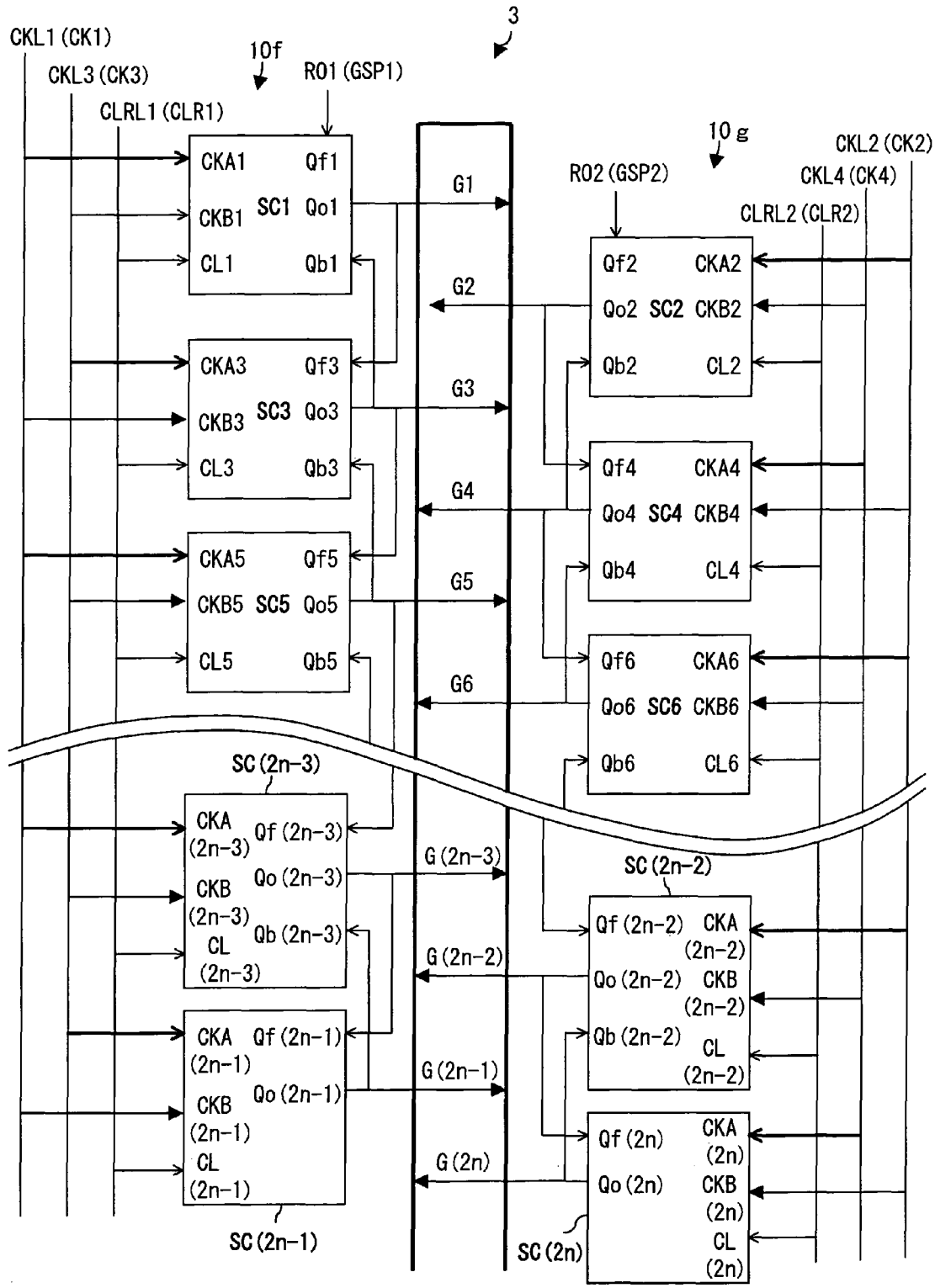
FIG. 19 is a block diagram illustrating another configuration of a present shift register.

FIG. 19 illustrates a configuration of a liquid crystal panel of the present Embodiment 2. According to the liquid crystal panel illustrated in FIG. 19, a shift register 10f is provided on a left end of the liquid crystal panel, and a shift register 10g is provided on a right end of the liquid crystal panel. The shift register 10f is made up of a plurality of shift circuits SCi (i=1, 3, 5, . . . and 2n+1) connected in stages, and a plurality of shift circuits SCi (i=2, 4, 6, . . . and 2n) connected in stages. Each of the shift circuits SCi (i=1, 2, 3, . . . and 2n−2) includes input nodes Qfi, Qbi, CKAi, CKBi, and CLi, and an output node Qoi. A shift circuit SC(2n−1) includes input nodes Qf(2n−1), CKA(2n−1), CKB(2n−1), and CL(2n−1), and an output node Qo(2n−1). Moreover, a shift circuit SC(2n) includes input nodes Qf(2n), CKA(2n), CKB(2n), and CL(2n), and an output node Qo(2n).

The shift circuit SC1 has its node Qf1 be connected to a GSP1 output terminal RO1 of a level shifter (see FIG. 23). Further, the shift circuit SC1 has its node Qb1 be connected to the node Qo3 of the shift circuit SC3, has its node CKA1 be connected to a first clock line CKL1 to which a first clock signal is supplied, has its node CKB1 be connected to a third clock line CKL3 to which a third clock signal is supplied, and has its node CL1 be connected to a first clear line CLRL1 to which a first clear signal (CLR1) is supplied. Further, the shift circuit SC1 outputs a gate on-pulse signal (signal line selection signal) G1 via its node Qo1.

The shift circuit SC2 has its node Qf2 be connected to a GSP2 output terminal RO2 of the level shifter. Further, the shift circuit SC2 has its node Qb2 be connected to a node Qo4 of a shift circuit SC4, has its node CKA2 be connected to a second clock line CKL2 to which a second clock signal is supplied, has its node CKB2 be connected to a fourth clock line CKL4 to which a fourth clock signal is supplied, and has its node CL2 be connected to a second clear line CLRL2 to which a second clear signal (CLR2) is supplied. Further, the shift circuit SC2 outputs a gate on-pulse signal (signal line selection signal) G2 via its node Qo2.

Each of the shift circuits SCi (i=3 to 2n−2) has its node Qfi be connected to the node Qo(i−2) of the shift circuit SC(i−2), and has its node Qbi be connected to the node Qo(i+2) of the shift circuit SC(i+2). In a case where is an odd number, the node CLi is connected to the first clear line CLRL1, and in a case where i is an even number, the node CLi is connected to the second clear line CLRL2. Moreover, in a case where i is a multiple of 4+1, the node CKAi is connected to the first clock line CKL1 and the node CKBi is connected to the third clock line CKL3; in a case where i is a multiple of 4+2, the node CKAi is connected to the second clock line CKL2 and the node CKBi is connected to the fourth clock line CKL4; in a case where i is a multiple of 4+3, the node CKAi is connected to the third clock line CKL1 and the node CKBi is connected to the first clock line CKL3; and in a case where i is a multiple of 4, the node CKAi is connected to the fourth clock line CKL4 and the node CKBi is connected to the second clock line CKL2. Further, each of the shift circuits SCi (i=3 to 2n−2) output a gate on-pulse signal (signal line selection signal) G1 via the node Qoi.

The shift circuit SC(2n−1) has its node Qf(2n−1) be connected to the node Qo(2n−3) of the shift circuit SC(2n−3), has its node CKA(2n−1) be connected to the third clock line CKL3, has its node CKB(2n−1) be connected to the first clock line CKL1, and has its node CL(2n−1) be connected to the first clear line CLRL1. Further, the shift circuit SC(2n−1) outputs a gate on-pulse signal (signal line selection signal) G(2n−1) via its node Qo(2n−1).

The shift circuit SC(2n) has its node Qf(2n) be connected to the node Qo(2n−2) of the shift circuit SC(2n−2), has its node CKA(2n) be connected to the fourth clock line CKL4, has its node CKB(2n) be connected to the second clock line CKL2, and has its node CL(2n) be connected to the second clear line CLRL2. Further, the shift circuit SC(2n) outputs a gate on-pulse signal (signal line selection signal) G(2n) via its node Qo(2n).

Figure 20:
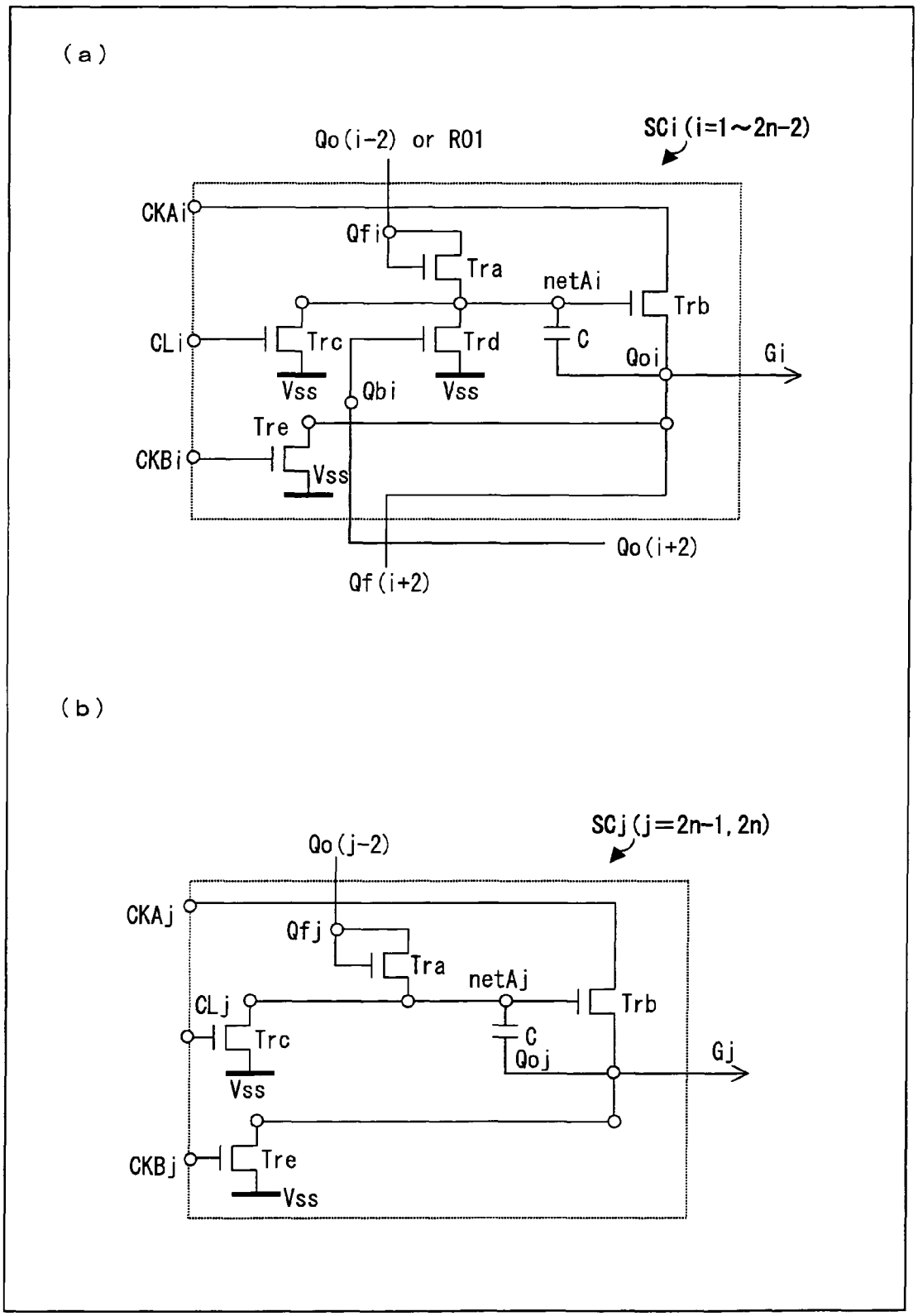
FIG. 20 Parts (a) and (b) of FIG. 20 are circuit diagrams illustrating a configuration of a unit circuit of a present shift register.

Specifically illustrated in (a) of FIG. 20 is a circuit diagram of a configuration employed in each of the shift circuits SCi (i=1 to 2n−2). As illustrated in (a) of FIG. 20, each of the shift circuits SCi (i=1 to 2n−2) includes a set transistor Tra, an output transistor Trb, a clear transistor Trc, a reset transistor Trd, a low-potential supplying transistor Tre, and a capacitor C. Note that each of the transistors Tra to Tre is an N-channel transistor.

Trb has its source terminal be connected to a first electrode of the capacitor C. Tra has its gate terminal (control terminal) and its drain terminal be connected to each other, and Tra has its source terminal be connected to (i) a gate terminal of Trb and (ii) a second electrode of the capacitor C. Trc has its drain terminal be connected to the gate terminal of Trb, and Trc has its source terminal connected to a lower-potential-side power supply Vss. Moreover, Trd has its drain terminal be connected to the gate terminal of Trb, and Trd has its source terminal be connected to the lower-potential-side power supply Vss. Tre has its drain terminal be connected to the source terminal of Trb, and Tre has its source terminal be connected to the lower-potential-side power supply Vss. The gate terminal of Tra is connected to the node Qfi, and the drain terminal of Trb is connected to the node CKAi. Tre has its gate terminal be connected to the node CKBi, Trc has its gate terminal be connected to the node CLi, Trd has its gate terminal be connected to the node Qbi, and the source terminal of Trb is connected to the node Qoi. Note that a connection point of the source terminal of Tra, the second electrode of the capacitor C, and the gate terminal of Trb is defined as a node netAi.

Specifically illustrated in (b) of FIG. 20 is a circuit diagram of a configuration of the shift circuit SCj (j=(2n−1) or 2n). As illustrated in (b) of FIG. 20, the shift circuit SCj includes a set transistor Tra, an output transistor Trb, a clear transistor Trc, a potential supplying transistor Tre, and a capacitor C. Note that each of the transistors Tra to Trc and Tre is an N-channel transistor.

In the embodiment, Trb has its source terminal be connected to a first electrode of the capacitor C. Tra has its gate terminal (control terminal) and its drain terminal be connected to each other, and Tra has its source terminal be connected to (i) a gate terminal of Trb and (ii) a second electrode of the capacitor C. Trc has its drain terminal be connected to the gate terminal of Trb and has its source terminal be connected to a lower-potential-side power supply Vss. Tre has its drain terminal be connected to the source terminal of Trb and has its source terminal be connected to the lower-potential-side power supply Vss. The gate terminal of Tra is connected to the node Qfj. Trb has its drain terminal be connected to the node CKAj. Tre has its gate terminal be connected to the node CKBj. Trc has its gate terminal be connected to the node CLj. Further, the source terminal of the transistor Trb is connected to the node Qoj. A connection point of the source terminal of Tra, the second electrode of the capacitor C, and the gate terminal of Trb is defined as a node netAj.

The nodes (Qfi, Qbi, CKAi, CKBi, CLi, and Qoi) in each of the shift circuits SCi (i=1 to 2n−2) and the nodes (Qfj, CKAj, CKBj, CLj, and Qoj) in the shift circuit SCj (j=(2n−1) or 2n) are connected to respective destinations as illustrated in FIG. 19.

Figure 21:
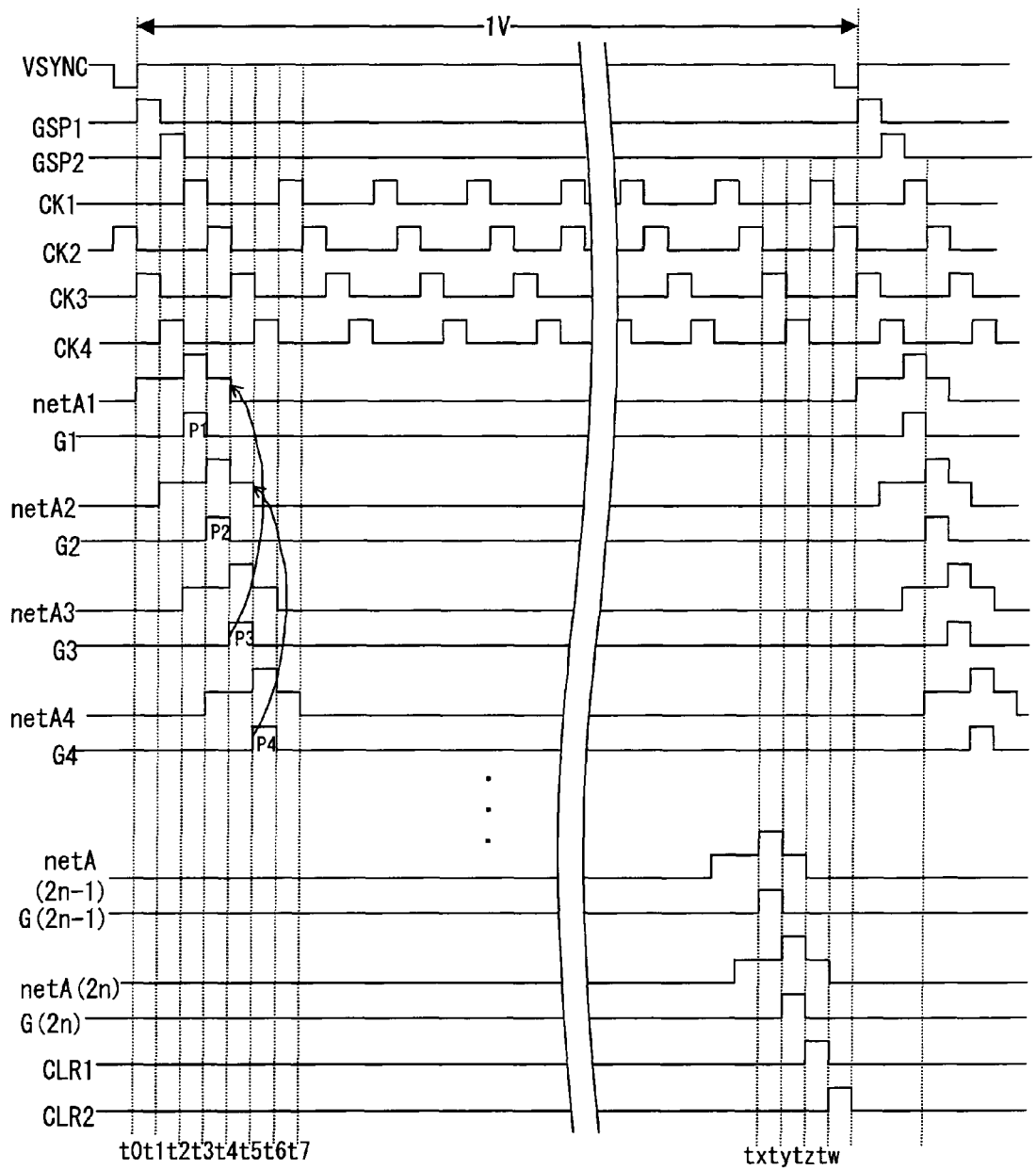
FIG. 21 is a timing chart illustrating an operation (in a case where a sync signal includes no anomalousness) of the shift register shown in FIG. 19.

The following describes operations of the shift registers 10f and 10g illustrated in FIG. 19. FIG. 21 is a timing chart illustrating waveforms of a vertical sync signal VSYNC, gate start pulse signals GSP1 and GSP2, a first clock signal CK1, a second clock signal CK2, a third clock signal CK3, a fourth clock signal CK4, gate on-pulse signals Gi (i=1 to 2n), a first clear signal CLR1, and a second clear signal CLR2, in a case where the sync signal includes no anomalousness. Note that each of CK1 to CK4 has, in one cycle, one clock period of a "H" (active) period and three clock periods of a "L" (inactive) period. Upon fall of CK1, CK2 synchronously rises, upon fall of CK2, CK3 synchronously rises, upon fall of CK3, CK4 synchronously rises, and upon fall of CK4, CK1 synchronously rises. Further, GSP2 rises one clock period elapsed after the rise of GSP1.

At t0 in FIG. 21, activation of GSP1 causes a rise in electric potential of Qf1. This rise in the electric potential turns Tra of SC1 ON, thereby causing electric potential at netA1 to change from "L" to "H". As a result, Trb of SC1 is also turned ON, and accordingly CK1 is outputted via Qo1. According to the configuration, G1 remains at "L".

At t1, which is a timing one clock period elapsed after t0, GSP1 falls to "L". However, the electric potential at netA1 is maintained at "H" by the capacitor C of SC1, and accordingly Trb of SC1 remains turned ON. Moreover, at t1, the activation of GSP2 causes electric potential of Qf2 to rise. As a result, Tra of SC2 is turned ON, which causes electric potential at netA2 to change from "L" to "H". This also causes Trb of SC2 to be turned ON, and accordingly CK2 is outputted via Qo2. According to the configuration, G2 remains at "L".

At t2, which is a timing one clock period elapsed after t1, CK1 rises, thereby causing G1 to be activated and become "H". At this point, the electric potential at netA1 rises to an electric potential higher than "H" by the capacitor C. Moreover, the activation of G1 causes electric potential of Qf3 to rise. As a result, Tra of SC3 is turned ON, and accordingly the electric potential at netA3 changes from "L" to "H". This also causes Trb of c SC3 to be turned ON, and accordingly CK3 is outputted via Qo3. According to the configuration, G3 remains at "L". Moreover, at t2, GSP2 falls to "L", however the electric potential at netA2 is maintained at "H" by the capacitor C of SC2, and Trb of SC2 remains turned ON.

At t3, which is a timing one clock period elapsed after t2, CK1 falls and becomes "L", and the electric potential at netA1 is also returned back to "H". However, since Trb of SC1 remains turned ON, CK1 is continuously outputted via Qo1. As a result, the gate on-pulse signal G1 is inactivated from "H" to "L", and this state "L" is maintained. Note that, even if G1 is inactivated and becomes "L", the electric potential at netA3 is maintained at "H" by the capacitor C of SC3, and the transistor Trb of SC3 remains turned ON. Moreover, at t3, CK2 rises; consequently, G2 also is activated and becomes "H". At this point, the electric potential at netA2 rises to an electric potential higher than "H" by the capacitor C. Moreover, at t3, the activation of G2 causes electric potential of Qf4 to rise; consequently, Tra of SC4 turns ON, which causes the electric potential at netA4 to change from "L" to "H". As a result, Trb of SC4 also turns ON, and CK4 is outputted via Qo4. According to the configuration, G4 remains at "L".

At t4, which is a timing one clock period elapsed after t3, CK3 rises, thereby causing G3 to be activated and become "H". At this point, the electric potential at netA3 rises to an electric potential higher than "H" by the capacitor C. Moreover, the activation of G3 causes electric potential at Qb1 to rise; consequently, Trd of SC1 turns ON, which connects netA1 to Vss, thereby causing the electric potential at netA1 to change from "H" to "L". As a result, Trb of SC1 is turned OFF, and CK1 is no longer outputted via Qo1. Moreover, at t4, CK3 rises; consequently, Tre of SC1 is turned ON, which connects Qo1 to Vss, thereby causing the electric potential at Qo1 to fall to "L" (i.e., G1 is drawn to "L"). Moreover, at t4, CK2 falls to "L" and the electric potential at netA2 also returns to "H". However, since Trb of SC2 remains turned ON, CK2 is continuously outputted via Qo2. According to the configuration, G2 is inactivated from "H" to "L", and this state "L" is maintained.

At t5, which is a timing one clock period elapsed after t4, CK4 rises, thereby causing G4 to be activated and become "H". At this point, the electric potential at netA4 rises to an electric potential higher than "H" by the capacitor C. Moreover, the activation of G4 causes an electric potential of Qb2 to rise. As a result, Trd of SC2 is turned ON, which connects netA2 to Vss, thereby causing the electric potential at netA2 to change from "H" to "L". This causes Trb of SC2 to be turned OFF, and CK2 is no longer outputted via Qo2. Moreover, at t5, CK4 rises; consequently, Tre of SC2 also is turned ON, which connects Qo2 to Vss, and accordingly the electric potential at Qo2 falls and becomes "L" (i.e., G2 is drawn to "L"). Moreover, at t5, CK3 falls and becomes "L" and the electric potential at netA3 also returns back to "H". However, since Trb of SC3 remains turned ON, CK3 is continuously outputted via Qo3. As a result, G3 is inactivated from "H" to "L", and this state "L" is maintained.

At t6, which is a timing one clock period elapsed after t5, CK1 rises, thereby causing G5 to be activated and become "H". At this point, the electric potential at netA5 rises to an electric potential higher than "H" by the capacitor C. Moreover, the activation of G5 causes an electric potential of Qb3 to rise; consequently, Trd of SC3 is turned ON, which connects netA3 to Vss, thereby causing the electric potential at netA3 to change from "H" to "L". Accordingly, Trb of SC3 is turned OFF, and CK3 is no longer outputted via Qo3. Moreover, at t6, CK1 rises; consequently, Tre of SC3 is turned ON, which connects Qo3 to Vss, and accordingly the electric potential at Qo3 falls and becomes "L" (i.e., G3 is drawn to "L"). Moreover, at t6, CK4 falls and becomes "L", and the electric potential at netA4 also returns back to "H". However, since Trb of SC4 remains turned ON, CK4 is continuously outputted via Qo4. As a result, G4 is inactivated from "H" to "L", and this state "L" is maintained.

At t7, which is a timing one clock period elapsed after t6, CK2 rises, thereby causing G6 to be activated and become "H". At this point, the electric potential at netA6 rises to an electric potential higher than "H" by the capacitor C. Moreover, the activation of G6 causes electric potential of Qb4 to rise. As a result, Trd of SC4 is turned ON, which connects netA4 to Vss, thereby causing the electric potential at netA4 to change from "H" to "L". This causes Trb of SC4 to be turned OFF, and CK4 is no longer outputted via Qo4. Moreover, at t7, CK2 rises; consequently, Tre of SC4 is turned ON, which connects Qo4 to Vss, and accordingly the electric potential at Qo4 falls to "L" (i.e., G4 is drawn to "L").

At tx, CK3 rises, thereby causing the G(2n−1) to be activated and become "H". At this point, the electric potential at netA(2n−1) rises to an electric potential higher than "H" by the capacitor C.

At ty, which is a timing one clock period elapsed after tx, CK4 rises, whereby G(2n) activates and becomes "H" (active). At this point, the electric potential at netA(2n) rises to an electric potential higher than "H" by the capacitor C. Moreover, at ty, CK3 falls and becomes "L" and the electric potential at netA(2n−1) is also returned back to "H". However, since the transistor Trb of the shift circuit SC(2n−1) remains turned on, CK3 is continuously outputted via Qo(2n−1). As a result, G(2n−1) is inactivated from "H" to "L", and this state "L" is maintained.

At tz, which is a timing one clock period elapsed after ty, the first clear signal CLR1 is activated and becomes "H"; consequently, Trc of SC(2n−1) is turned ON, which connects netA(2n−1) to Vss, thereby causing the electric potential at netA(2n−1) to change from "H" to "L". As a result, Trb of SC(2n−1) is turned OFF, and CK3 is no longer outputted via Qo(2n−1). Further, CK1 rises; consequently, Tre of SC(2n−1) is turned ON, which connects Qo(2n−1) to Vss, and accordingly the electric potential at Qo(2n−1) falls to "L" (i.e., G(2n−1) is drawn to "L"). Moreover, at tz, CK4 falls and becomes "L", and the electric potential at netA(2n) is also returned back to "H". However, since Trb of SC(2n) remains turned ON, CK4 is continuously outputted via Qo(2n). As a result, G(2n) is inactivated from "H" to "L", and this state "L" is maintained.

At tw, which is a timing one clock period elapsed after ty, the second clear signal CLR2 is activated and becomes "H"; consequently, Trc of SC(2n) is turned ON, which connects netA(2n) to Vss, thereby causing the electric potential at netA(2n) to change from "H" to "L". As a result, Trb of SC(2n) is turned OFF, and CK4 is no longer outputted via Qo(2n). Further, CK2 rises; consequently, Tre of SC(2n) is turned ON, which connects Qo(2n) to Vss, and accordingly the electric potential at Qo(2n) falls to "L" (i.e., G(2n) is drawn to "L").

As described above, in a case where the sync signal includes no anomalousness, the gate-on pulse signals G1 outputted from the respective shift circuits SCi (i=1, 3, 5, . . . and 2n−1) are successively activated each for a respective certain period of time in the shift register 10f, and accordingly the pulses P1, P3, . . . and P(2n−1) are outputted successively from respective shift circuits in the order of odd ordinal numbers, from the shift circuit SC1 in the first stage until the shift circuit SC(2n−1) in the end stage. Moreover, the gate-on pulse signals G1 outputted from the respective shift circuits SCi (i=2, 4, 6, . . . and 2n) are successively made active each for a respective certain period of time in the shift register 10g, and accordingly the pulses P1, P2, . . . and P(2n) are outputted successively from the respective shift circuits in the order of even ordinal number, from the shift circuit SC2 in the first stage until the shift circuit SC(2n) in the end stage.

Figure 22:
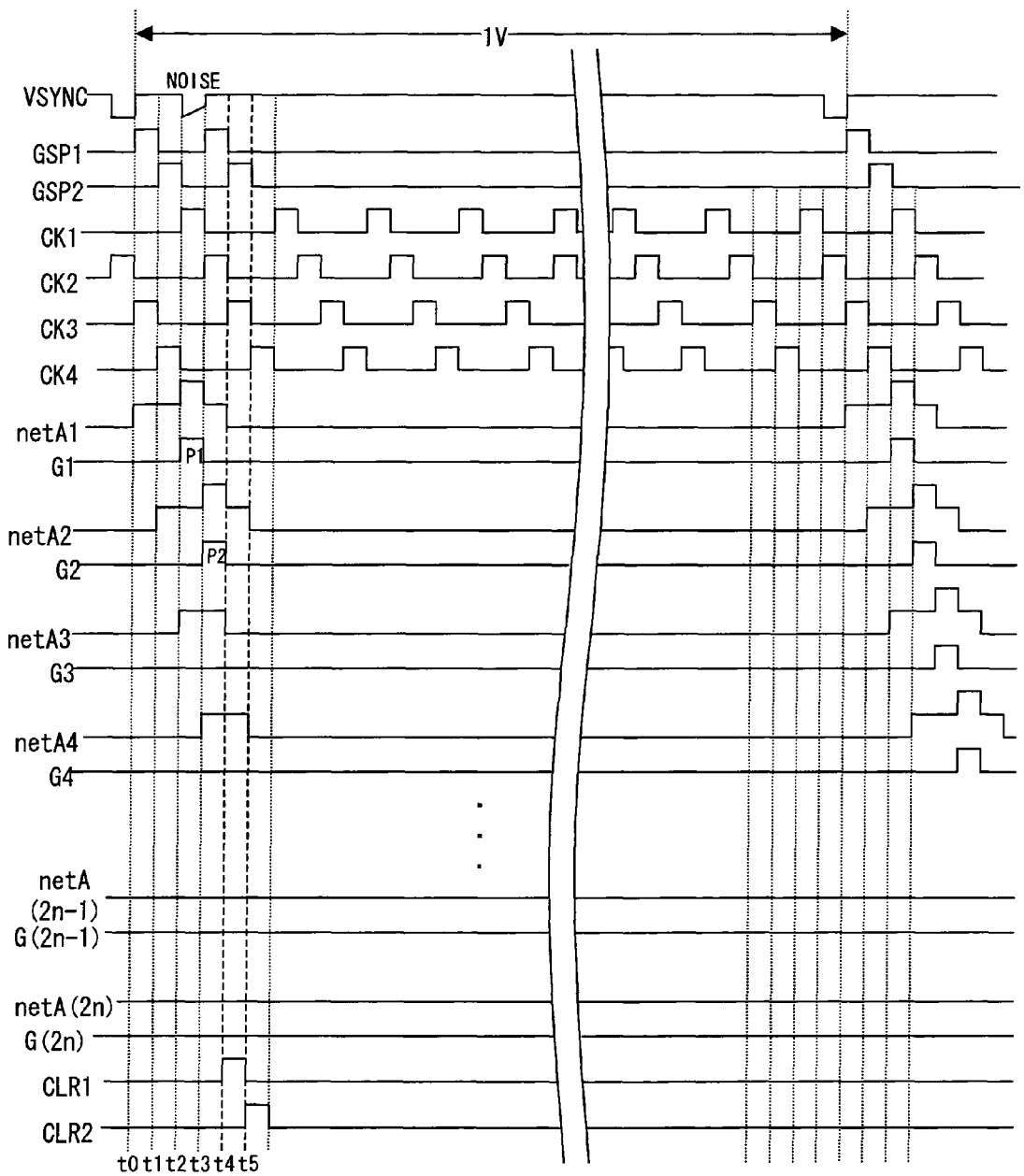
FIG. 22 is a timing chart illustrating an operation (in a case where a sync signal includes anomalousness) of the shift register shown in FIG. 19.

FIG. 22 is a timing chart illustrating waveforms of a vertical sync signal VSYNC, gate start pulse signals GSP1 and GSP2, a first clock signal CK1, a second clock signal CK2, a third clock signal CK3, a fourth clock signal CK4, gate on-pulse signals Gi (i=1 to 2n), a first clear signal CLR1, and a second clear signal CLR2, in a case where the sync signal includes anomalousness.

Operations of the shift resisters 10f and 10g from t0 to t3 in FIG. 22 are identical to those illustrated in FIG. 21. In a case where, as illustrated in FIG. 22, noise generates in the vertical sync signal VSYNC between t2 and t3, and accordingly GSP1 is activated at an unexpected timing (t3) and GSP2 is activated at an unexpected timing (t4), the first clear signal CLR1 is activated and becomes "H" at t4 and the second clear signal CLR2 is activated and becomes "H" at t5. As a result, at t4, Trc of SC3 is turned ON, which connects netA3 to Vss, thereby causing electric potential at netA3 to change from "H" to "L". Accordingly, Trb of SC3 is turned OFF, and CK3 is no longer outputted via Qo3, and further G3 remains at "L" (inactive). According to the configuration, no pulse is outputted from SC3; this avoids Trb of SC5, SC7, . . . and SC(2n−1) to be turned ON, which shift registers are the shift registers provided in the subsequent stages, and as a result no pulse is outputted from these shift circuits. At t4, CK3 rises; consequently, Trc of SC1 is turned ON, which connects Qo1 to Vss, and accordingly the electric potential at Qo1 falls to "L" (i.e., G1 is drawn to "L").

At t5, Trc of SC4 is turned ON, which connects netA4 to Vss, thereby causing the electric potential at netA4 to change from "H" to "L". As a result, Trb of SC4 is turned OFF, and CK4 is no longer outputted via Qo4. Accordingly, G4 remains at "L" (inactive). According to the configuration, no pulse is outputted from SC4; this avoids Trb of SC6, SC8, . . . and SC(2n) to be turned ON, which shift circuits are the shift circuits provided in the subsequent stages, and as a result no pulse is outputted from these shift circuits. At t5, CK4 rises; consequently, Tre of SC2 is turned ON, which connects Qo2 to Vss, and accordingly the electric potential at Qo2 falls to "L" (i.e., G2 is drawn to "L").

According to the configuration of the shift register 10f, no pulse is outputted from the shift circuits subsequent to the shift circuit SC1 during a current vertical scanning period, and accordingly the gate on-pulse signals outputted from the respective stages (SC1, SC3, . . . and SC(2n−1)) remain at "L" (inactive) until a subsequent vertical scanning period (T0) starts. Moreover, in the shift register 10g, no pulse is outputted from the shift circuits subsequent to the shift circuit SC2 during the current vertical scanning period, and accordingly the gate on-pulse signals outputted from the respective stages (SC2, SC4, . . . and SC(2n)) remain at "L" (inactive) until the subsequent vertical scanning period (T0) starts.

According to Embodiment 2 described above, the first and second clear signals CLR1 and CLR2 become "H" (active) in a case where the sync signal (VSYNC, HSYNC, or DE) includes anomalousness, and no pulse is outputted from the shift registers (10f, 10g) thereafter until the subsequent vertical scanning period starts. This makes it possible to prevent occurrence of display disorder and to hold down increase of load given on the power source.

Note that, with the shift registers 10f and 10g illustrated in FIG. 19, GSP1 and GSP2 can be a common gate start pulse signal. In this case, for example in FIG. 21, both the gate start pulse signals GSP1 and GSP2 are made "H" (active) at t0. Moreover, CLR1 and CLR2 can be a common clear signal. In this case, for example in FIG. 21, both CLR1 and CLR2 are made "H" (active) at tw, and in FIG. 22, both CLR1 and CLR2 are made "H" (active) at t5.

The above description deals with a case where a clear signal is activated caused by anomalousness included in VSYNC. However, it is a matter of course that the clear signal is activated in cases where HSYNC or DE includes anomalousness.

Embodiment 3

Embodiment 3 is as described below, with reference to FIGS. 24 to 36.

Figure 24:
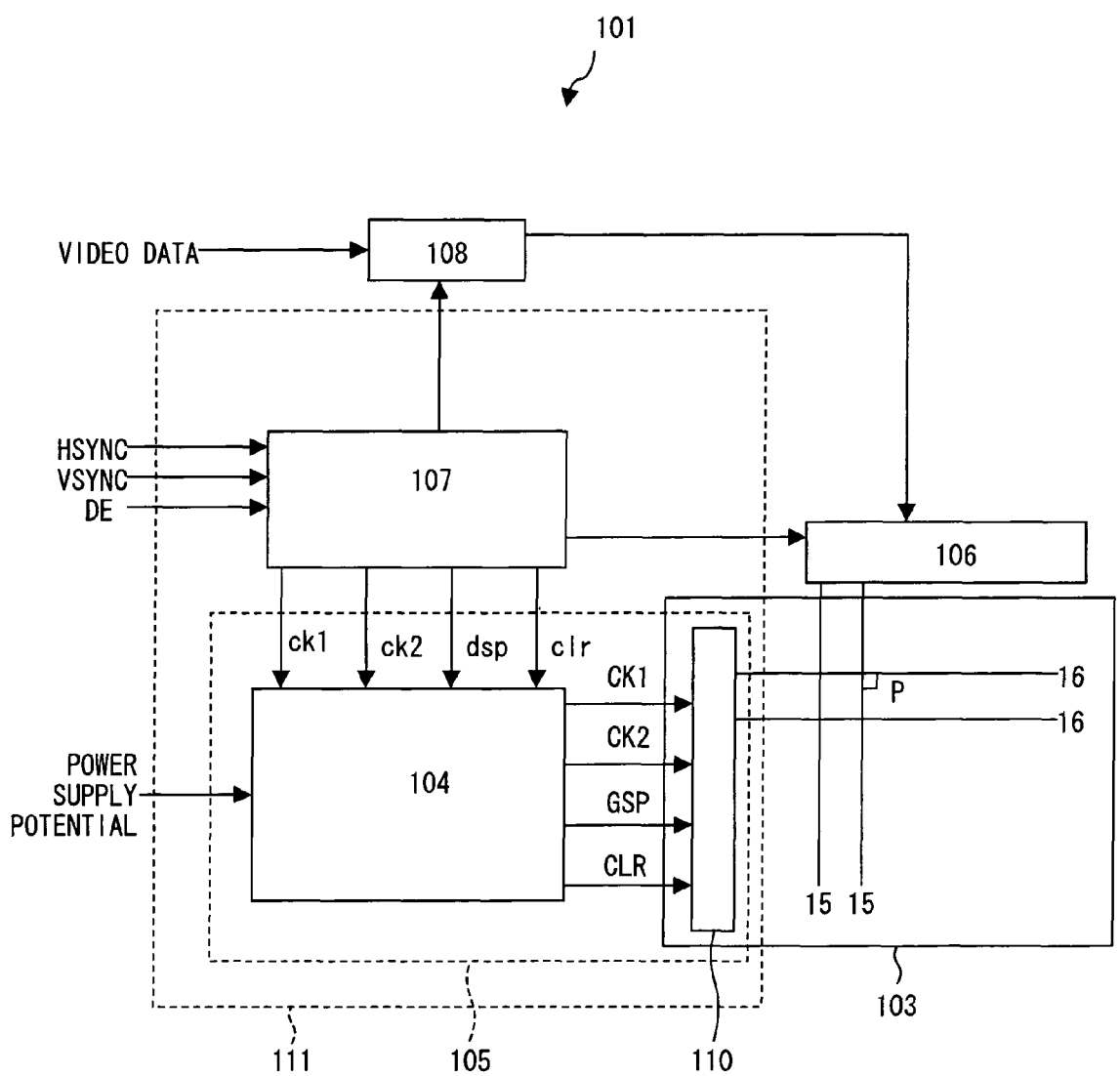
FIG. 24 is a block diagram illustrating a configuration of a liquid crystal display device Embodiments 3 and 4.

FIG. 24 is a block diagram illustrating a configuration of the present liquid crystal display device. As illustrated in FIG. 24, the present liquid crystal display device 101 includes a liquid crystal panel 103, a gate driver 105, a source driver 106, a timing controller 107, and a data processing circuit 108. The gate driver 105 includes a shift register 110 and a level shifter 104, and the gate driver 105 and the timing controller 107 construct a liquid crystal panel driving circuit 111. In the present embodiment, the level shifter 104 is included in the gate driver 105; however, the level shifter 104 may be provided outside of the gate driver 105.

The present liquid crystal panel 103 includes scanning signal lines 16 that are driven by the gate driver 105, data signal lines 15 that are driven by the source driver 106, pixels P, retention capacitor wires (not illustrated) and the like, and the shift register 110 is provided monolithically to the liquid crystal panel 103. Each of the pixels P includes (i) a transistor (TFT) connected to one of the scanning signal lines 16 and one of the data signal lines 15 and (ii) a pixel electrode connected to the transistor. Note that the transistor provided in the pixels and the transistor of the shift register can be formed by use of material such as amorphous silicone or polysilicon (e.g., CG silicon).

The timing controller 107 receives a vertical sync signal VSYNC, a horizontal sync signal HSYNC, and a data enable signal DE, each of which is a sync signal. These signals are received from outside of the liquid crystal display device 101. Moreover, the data processing circuit 108 receives video data (RGB digital data) from outside of the liquid crystal display device 101. The timing controller 107 generates, with use of the sync signals, a plurality of source clock signals (e.g., ck1, ck2), a source clear signal (clr), and a source gate start pulse signal (gsp). The source clock signals (e.g., ck1, ck2), source clear signal (clr), and source gate start pulse signal (gsp) are shifted in level by the level shifter 106, to generate clock signals (e.g., CK1, CK2), a clear signal (CLR), and a gate start pulse signal (GSP), respectively. Moreover, the timing controller 107 outputs a control signal to the data processing circuit 108 in accordance with the received sync signals (VSYNC, HSYNC, and DE), and outputs a source timing signal to the source driver 106.

The clock signals (CKA, CKB, etc.), clear signal (CLR), and gate start pulse signal (GSP) are supplied to the shift register 110. The clear signal (CLR) is a signal used for resetting the end stage, and becomes "H" (active) after a pulse is outputted from the end stage. The shift register 110 generates a gate on-pulse signal with use of the foregoing signals (CKA, CKB etc.; CLR; and GSP) and this gate on-pulse signal is outputted to the scanning signal lines in the liquid crystal panel 103. The shift register 110 includes shift circuits connected in stages, which each of the shift circuits generates a gate on-pulse signal. The gate on-pulse signals generated in the stages (shift circuits) are successively activated for a respective certain period of time. This causes pulses (on-pulses) to be outputted successively from respective shift circuits in order of ordinal number, from a first stage until an end stage. Thereafter, in the liquid crystal panel 103, the scanning signal lines are successively selected, in accordance with the pulses.

The data processing circuit 108 carries out a predetermined process to video data, and outputs a data signal to the source driver 106 in accordance with the control signal outputted from the timing controller 107. The source driver 106 generates a signal electric potential by use of the data signal outputted from the data processing circuit 108 and the source timing signal outputted from the timing controller 107, and outputs this electric potential to the data signal lines in the liquid crystal panel 103. Via the transistors provided in each of the pixels, this signal electric potential is written into pixel electrodes of respective pixels.

Figure 25:
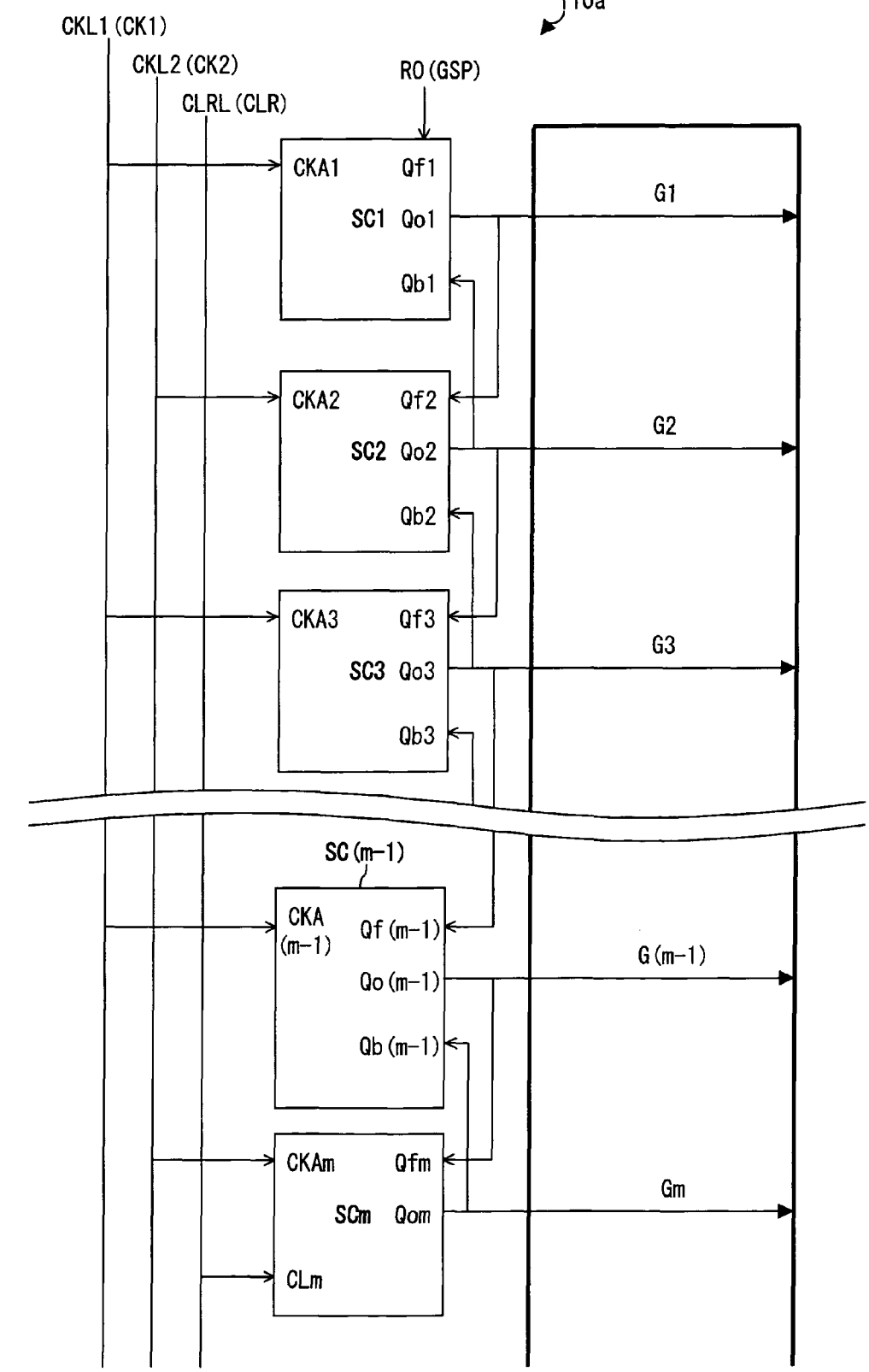
FIG. 25 is a block diagram illustrating a configuration of a shift register of Embodiment 3.

FIG. 25 illustrates a configuration of a shift register 110a according to the present embodiment. As illustrated in FIG. 25, the shift register 110a includes a plurality of shift circuits (unit circuits) SC1, SC2, . . . SCm that are connected in stages. Each of shift circuits SCi (i=1, 2, 3, . . . m−1) includes input nodes Qfi, Qbi, and CKAi and an output node Qoi, and the shift circuit SCm includes input nodes Qfm, CKAm, and CLm and an output node Qom.

The shift circuit SC1 has its node Qf1 be connected to a GSP output terminal RO of the level shifter (see FIG. 24). Further, the shift circuit SC1 has its node Qb1 be connected to the node Qo2 of the shift circuit SC2, and has its node CKA1 be connected to a first clock line CKL1 to which a first clock signal is supplied. Further, the shift circuit SC1 outputs a gate on-pulse signal (signal line selection signal) G1 via its node Qo1.

Each of the shift circuits SCi (i=2 to m−1) has its node Qfi be connected to the node Qo(i−1) of the shift circuit SC(i−1), and each of the shift circuits SCi (i=2 to m−1) has its node Qbi be connected to the node Qo(i+1) of the shift circuit SC(i+1). In a case where i is an odd number, each of the shift circuits SCi has its node CKAi be connected to the first clock line CKL1, and in a case where i is an even number, the node CKAi is connected to the second clock line CKL2. Further, each of the shift circuits SCi outputs a gate on-pulse signal (signal line selection signal) G1 via its node Qoi.

The shift circuit SCm has its node Qfm be connected to the node Qo(m−1) of the shift circuit SC(m−1), has its node CKAm be connected to the second clock line CKL2, and has its node CLm be connected to the clear line CLRL. Further, the shift circuit SCm outputs a gate on-pulse signal (signal line selection signal) Gm via its node Qom.

Figure 26:
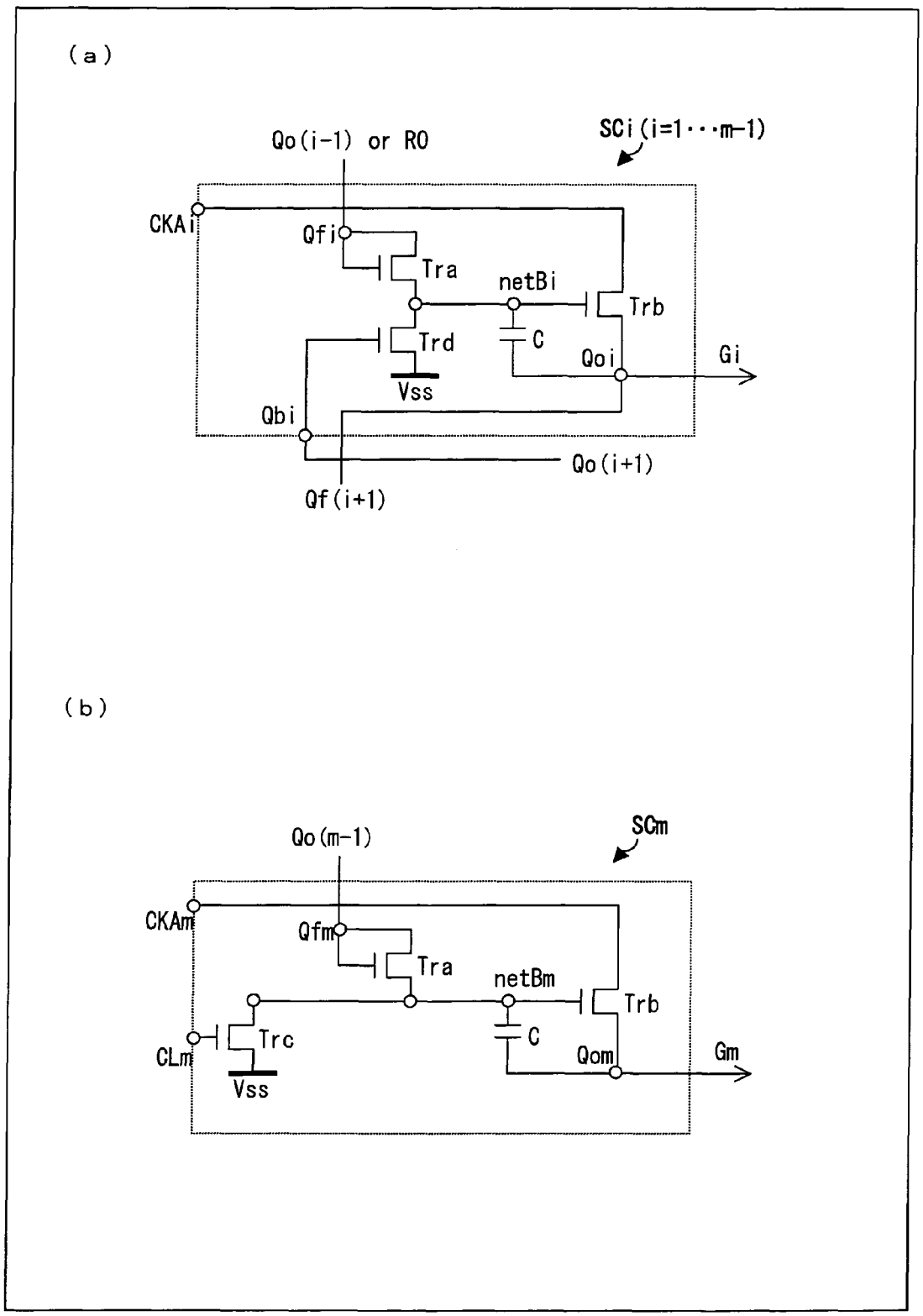
FIG. 26 Parts (a) and (b) of FIG. 26 are circuit diagrams illustrating a configuration of a unit circuit of the shift register of Embodiment 3.

Specifically illustrated in (a) of FIG. 26 is a circuit diagram of a configuration employed by each of SCi (i=1 to m−1). As illustrated in (a) of FIG. 26, each of SCi (i=1 to m−1) includes the set transistor Tra, the output transistor Trb, the reset transistor Trd, and the capacitor C. Note that each of the transistors is an N-channel transistor.

In the embodiment, Trb has its source terminal be connected to a first electrode of the capacitor C. Tra has its gate terminal (control terminal) and its drain terminal be connected to each other, and has its source terminal be connected to (i) a gate terminal of Trb and (ii) a second electrode of the capacitor C. Moreover, Trd has its drain terminal be connected to the gate terminal of Trb, and Trd has its source terminal be connected to a lower-potential-side power supply Vss. Further, the gate terminal of Tra is connected to the node Qfi, Trb has its drain terminal be connected to the node CKAi, Trc has its gate terminal be connected to a node CLi, Trd has its gate terminal be connected to the node Qbi, and the source terminal of Trb is connected to the node Qoi. Note that a connection point of the source terminal of Tra, the second electrode of the capacitor C, and the gate terminal of Trb is defined as a node netBi.

Moreover, (b) of FIG. 26 is a circuit diagram specifically illustrating a configuration of SCm. As illustrated in (b) of FIG. 26, SCm includes a set transistor Tra, an output transistor Trb, a clear transistor Trc provided for resetting the end stage, and a capacitor C. Note that each of the transistors is an N-channel transistor, and the capacitor C can also be parasitic capacitor. In the embodiment, Trb has its source terminal be connected to a first electrode of the capacitor C. Tra has its gate terminal (control terminal) and its drain terminal be connected to each other, and has its source terminal be connected to (i) a gate terminal of Trb and (ii) a second electrode of the capacitor C. Moreover, Trc has its drain terminal be connected to the gate terminal of Trb, and has its source terminal be connected to a lower-potential-side power supply Vss. Furthermore, the gate terminal of Tra is connected to the node Qfm, Trb has its drain terminal be connected to the node CKAm, Trc has its gate terminal be connected to the node CLm, and the source terminal of Trb is connected to the node Qom. Note that a connection point of the source terminal of Tra, the second electrode of the capacitor C and the gate terminal of Trb is defined as a node netBm.

The nodes (Qfi, Qbi, CKAi, Qoi) in each of the shift circuits Sci (i=1 to m−1) and the nodes (Qfm, CKAm, CLm, Qom) in the shift circuit SCm are connected to respective destinations as illustrated in FIG. 25. The configuration of an entire shift register 110a is as specifically illustrated in FIG. 27.

Figure 27:
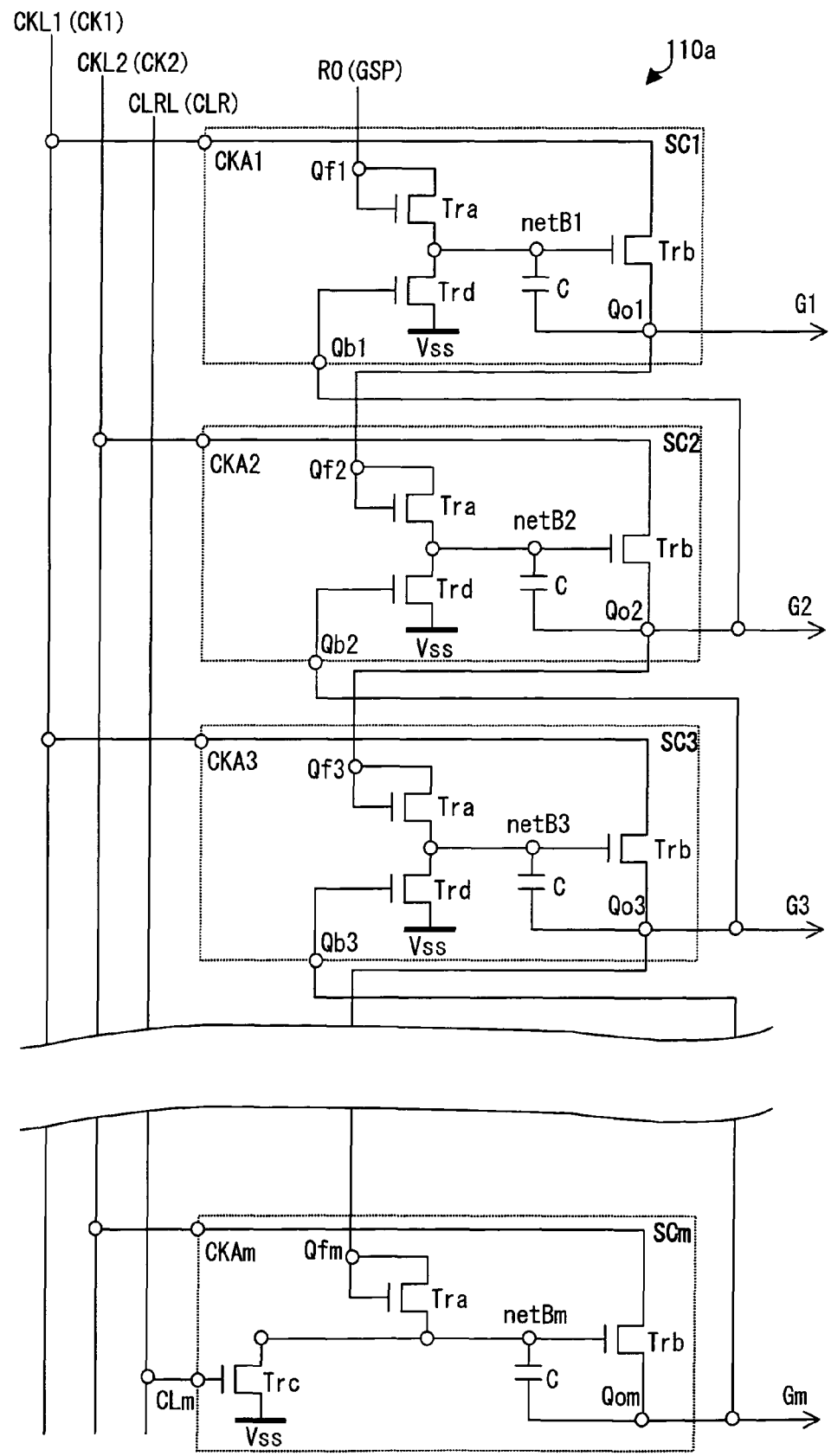
FIG. 27 is a circuit diagram illustrating a configuration of the shift register of Embodiment 3.
Figure 28:
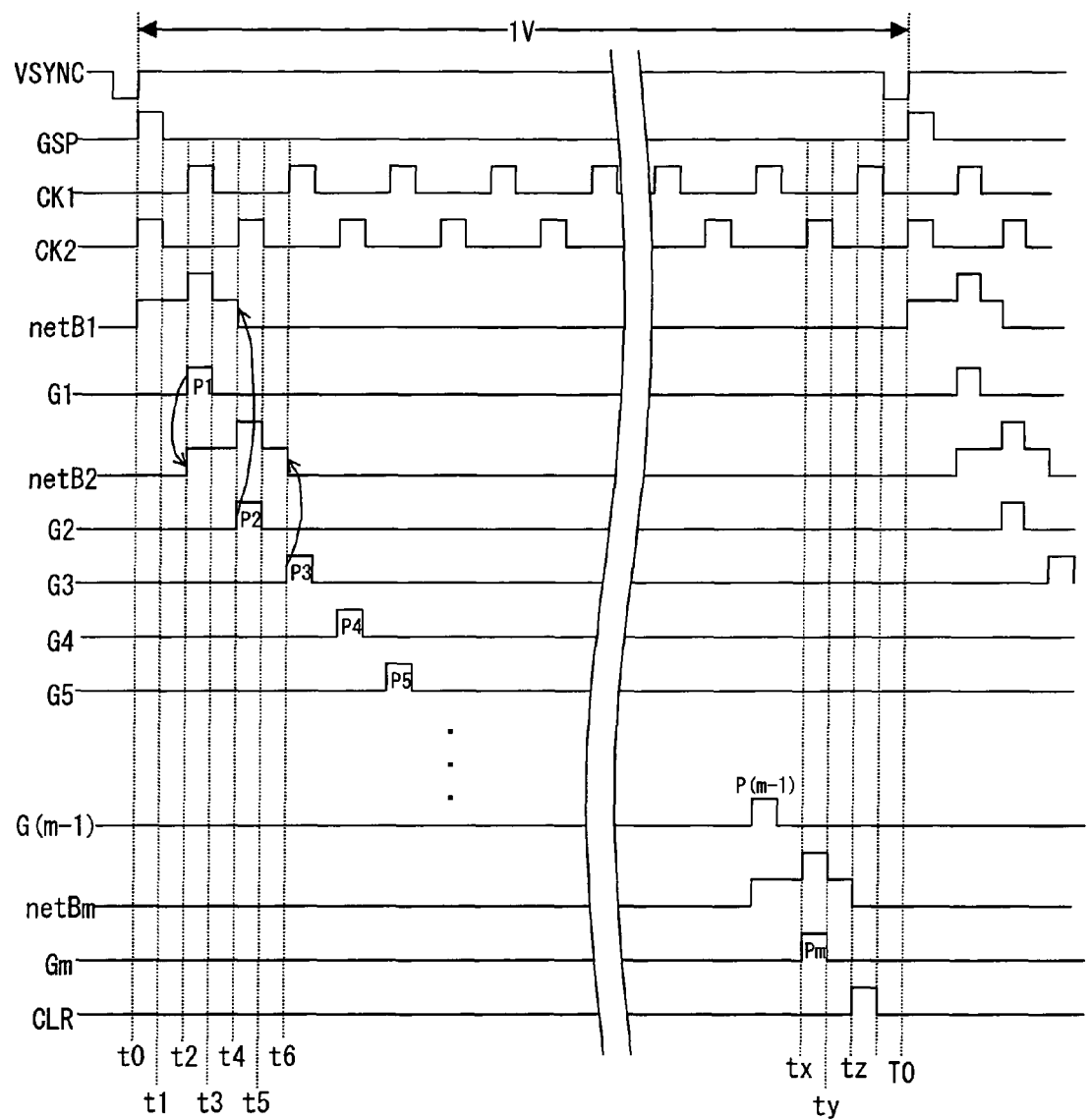
FIG. 28 is a timing chart illustrating an operation of the shift register shown in FIG. 27.

The following describes operations of the shift register 110a illustrated in FIG. 27. FIG. 28 is a timing chart illustrating waveforms of the vertical sync signal VSYNC, gate start pulse signal GSP, first clock signal CK1, second clock signal CK2, gate on-pulse signals G1 (i=1 to m), and a clear signal (CLR). Note that each of the first clock signal CK1 and second clock signal CK2 includes, in one cycle, one clock period of a "H" (active) period, and three clock periods of a "L" (inactive) period. After one of CK1 and CK2 is inactivated (falls), the other one of CK1 and CK2 is activated (rises) with a delay of one clock period. Of course, this is merely an example of the first and second clock signals CK1 and CK2; the "H" period and "L" period may be arbitrarily set as long as there is a period in which both clock signals coincide as "L".

First, at t0 in FIG. 28, activation of GSP causes a rise in electric potential of Qf1. This rise in the electric potential turns Tra of SC1 ON, thereby causing electric potential at netB1 to change from "L" to "H". As a result, Trb of SC1 turns ON, and accordingly CK1 is outputted via Qo1. According to the configuration, G1 remains at "L". At t1, which is a timing one clock period elapsed after t0, GSP falls (is inactivated) and becomes "L". However, the electric potential of netB1 is maintained at "H" by the capacitor C in SC1, and Trb of SC1 also remains turned ON.

At t2, which is a timing one clock period elapsed after t1, CK1 rises (is activated), thereby causing G1 to be activated and become "H". At this point, the electric potential at netB1 rises to an electric potential higher than "H" by the capacitor C. Moreover, the activation of G1 causes electric potential of Qf2 to rise; consequently, Tra of SC2 turns ON, thereby causing electric potential at netB2 to change from "L" to "H". As a result, Trb of SC2 also turns ON, and accordingly CK2 is outputted via Qo2. According to the configuration, G2 remains at "L".

At t3, which is a timing one clock period elapsed after t2, CK1 falls and becomes "L", and the electric potential at netB1 also returns back to "H". However, since Trb of SC1 remains turned ON, CK1 is continuously outputted via Qo1. According to the configuration, G1 is inactivated from "H" to "L", and this state "L" is maintained. Note that, even if G1 is inactivated and becomes "L", the electric potential at netB2 is maintained at "H" by the capacitor C of SC2, and accordingly Trb of SC2 remains turned ON.

At t4, which a timing one clock period elapsed after t3, CK2 rises, thereby causing G2 to be activated and become "H". At this point, the electric potential at netB2 rises to an electric potential higher than "H" by the capacitor C. Moreover, the activation of G2 causes electric potential at Qb1 to rise; consequently, Trd of SC1 turns ON, which connects netB1 to Vss, thereby causing electric potential at netB1 to change from "H" to "L". As a result, Trb of SC1 is turned OFF, and CK1 is no longer outputted via Qo1.

At t5, which is a timing one clock period elapsed after t4, CK2 falls and becomes "L" and the electric potential at netB2 also returns back to "H". However, since Trb of SC2 remains turned ON, CK2 is continuously outputted via Qo2. According to the configuration, G2 is inactivated from "H" to "L", and this state "L" is maintained.

Furthermore, at tx, CK2 rises, and accordingly Gm is also activated and becomes "H". At this point, the electric potential at netBm rises to an electric potential higher than "H" by the capacitor C.

At ty, which is a timing one clock period elapsed after tx, CK2 falls and becomes "L", and the electric potential at netBm also is returned back to "H". However, since Trb of SCm remains turned ON, CK2 is continuously outputted via Qom. According to the configuration, Gm is inactivated from "H" to "L", and this state "L" is maintained.

At tz, which is a timing one clock period elapsed after ty, CK2 remains at "L". However, since the clear signal CLR is activated and becomes "H", Trc of SCm turns ON, which connects netBm to Vss. This causes the electric potential of netBm to change from "H" to "L". As a result, Trb of SCm is turned OFF, and CK2 is no longer outputted via Qom.

In FIG. 28, the clear signal CLR is activated at tz (one clock period elapsed after the fall of Gm). However, the present invention is not limited to this example. For instance, the clear signal CLR can be activated during ty to tz (ty exclusive). Note that the clear signal CLR is to be not activated at ty, since that would cause Gm to maintain the "H" (active) state.

As described above, in the shift register 110a, gate on-pulse signals G1 outputted from respective shift circuits Sci (i=1 to m) are made successively active each for a respective certain period of time, and pulses P1 to Pm are successively outputted from respective shift circuits in order of ordinal number, from a first stage shift circuit SC1 until an end stage shift circuit SCm. The end stage (unit circuit SCm) is reset by use of the clear signal; this makes it possible to omit a dummy stage (dummy shift circuit) that is provided in the conventional technique, thereby allowing reduction of circuit area.

The shift register 110a illustrated in FIG. 27 may also be configured as like a shift register 110b illustrated in FIG. 29. In addition to the configuration of the shift register 110a, the shift register 110b includes an N-channel low-potential supplying transistor Tre in the end stage shift circuit SCm. The transistor Tre has its source terminal be connected to the lower-potential-side power supply, its drain terminal be connected to the node Qom, and its gate terminal be connected to the node CLm.

Figure 30:
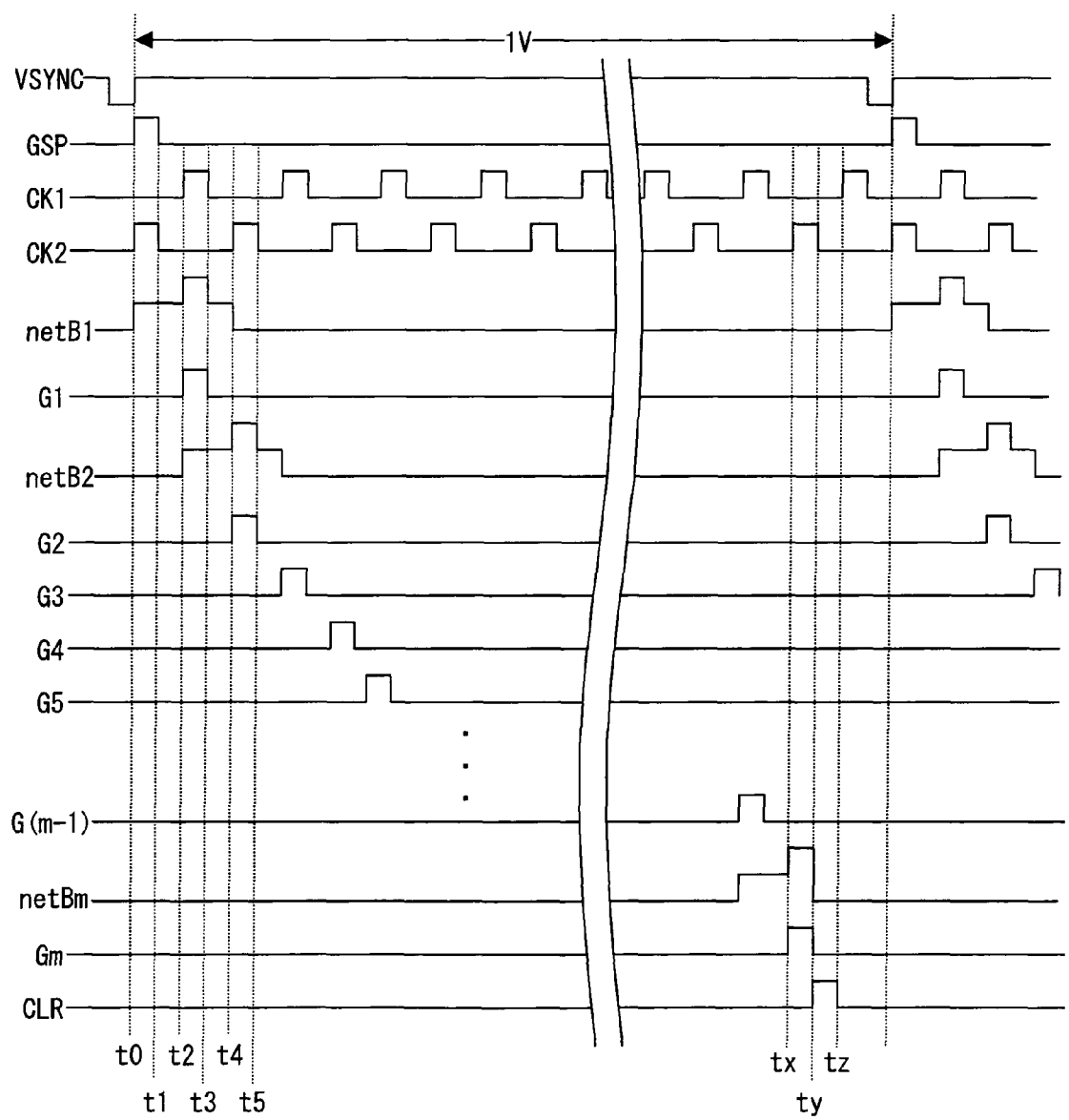
FIG. 30 is a timing chart illustrating an operation of the shift register shown in FIG. 29.

According to the configuration of the shift register 110b, activation of the clear signal CLR causes Gm to fall. Therefore, at ty, the clear signal CLR is activated by synchronizing with the fall (inactivation) of Gm, as illustrated in FIG. 30.

Figure 31:
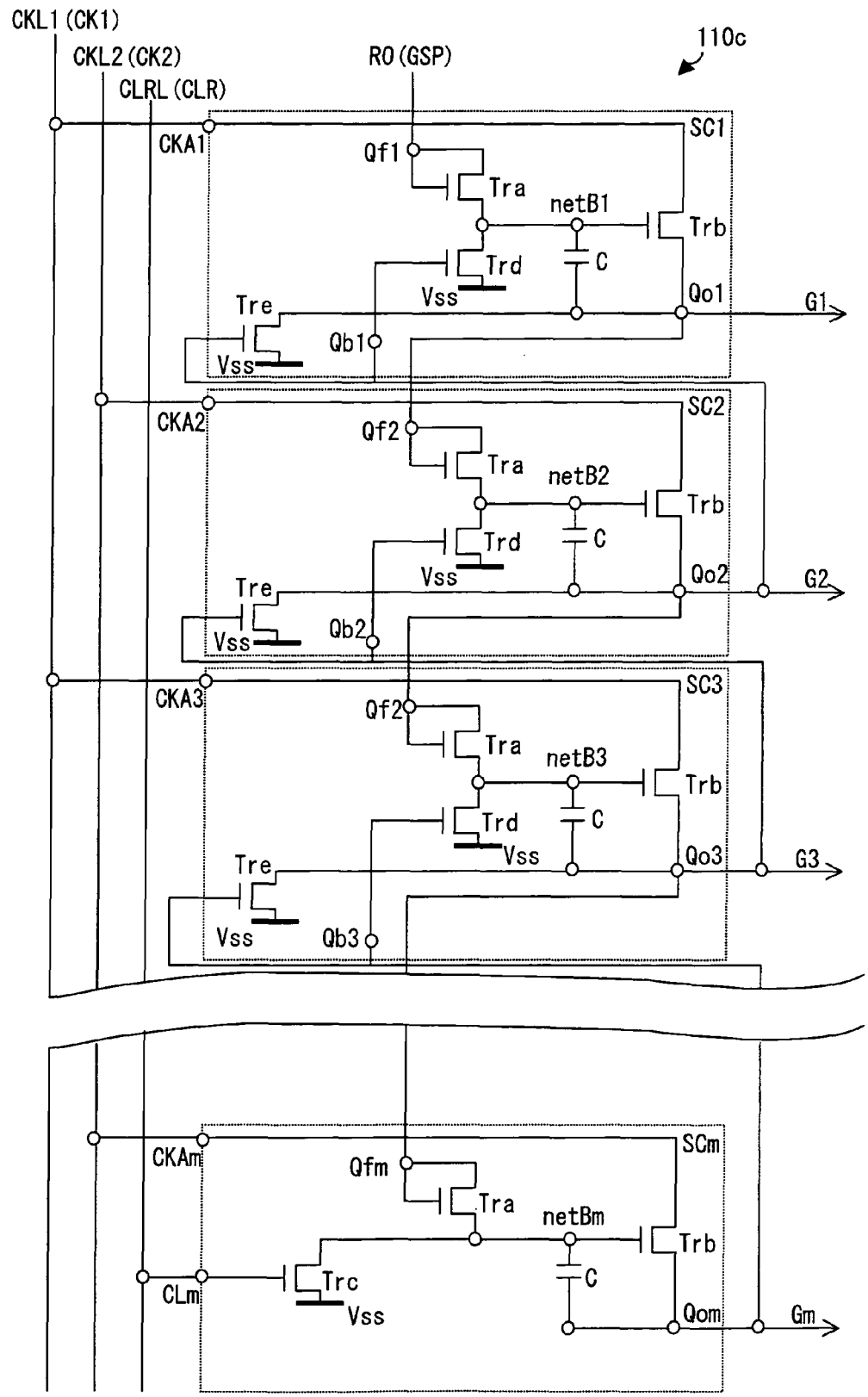
FIG. 31 is a circuit diagram illustrating another configuration of the shift register of Embodiment 3.

Moreover, it is also possible to configure the shift register 110a in FIG. 27 as like a shift register 110c illustrated in FIG. 31. In addition to the configuration of the shift register 110a, the shift register 110c includes, in each of the shift circuits Sci (i=1 to m−1), an N-channel low-potential supplying transistor Tre. The transistor Tre has its source terminal be connected to the lower-potential-side power supply, its drain terminal be connected to the node Qoi, and its gate terminal be connected to the node Qbi.

Figure 32:
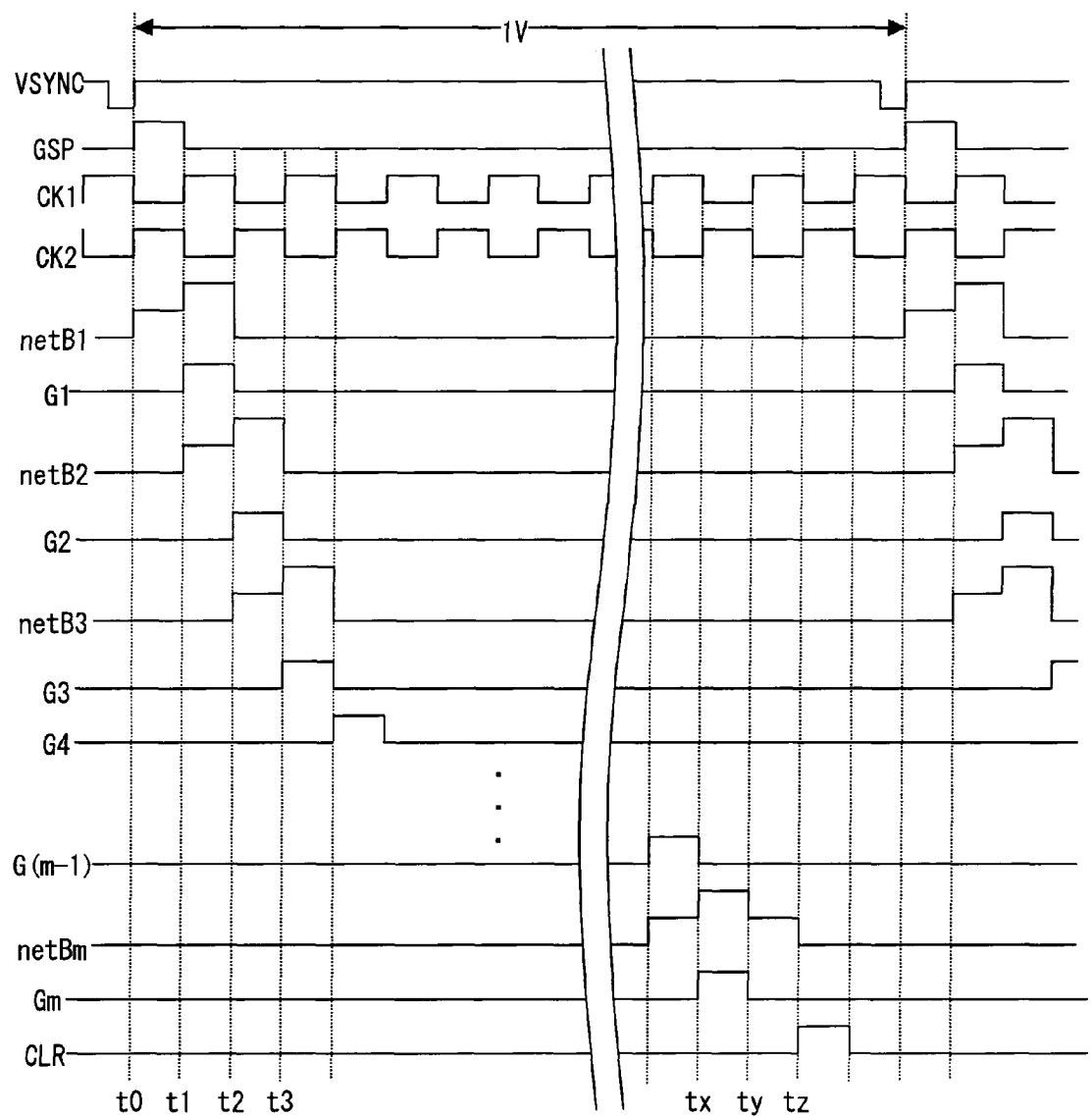
FIG. 32 is a timing chart illustrating an operation of the shift register shown in FIG. 31.

The following description explains an operation of the shift register 110c illustrated in FIG. 31. FIG. 32 is a timing chart illustrating waveforms of the vertical sync signal VSYNC, gate start pulse signal GSP, first clock signal CK1, second clock signal CK2, gate on-pulse signals Gi (i=1 to m), and clear signal (CLR). Note that the first clock signal CK1 and the second clock signal CK2 both include, in one cycle, one clock period of a "H" (active) period and one clock period of a "L" (inactive) period; upon fall of one of the CK1 and CK2, the other one of the CK1 and CK2 synchronously rises.

First, at t0 of FIG. 32, electric potential of Qf1 rises due to activation of GSP. This turns Tra of SC1 ON, thereby causing electric potential of netB1 to change from "L" to "H". As a result, Trb of SC1 also turns ON, thereby allowing CK1 to be outputted via Qo1. Namely, the G1 remains as "L".

At t1, which is a timing one clock period elapsed after t0, GSP falls (is inactivated) and becomes "L". However, the electric potential of netB1 does not fall by the capacitor C of SC1, and Trb of SC1 also remains turned ON. Namely, G1 is also activated by the rise of CK1, and G1 becomes "H". At this time, the electric potential of netB1 rises to an electric potential higher than "H", by the capacitor C. Moreover, the activation of G1 causes the electric potential of Qf2 to rise; consequently, Tra of SC2 turns ON, thereby causing the electric potential of netB2 to change from "L" to "H". As a result, Trb of SC2 also turns ON, thereby allowing CK2 to be outputted via Qo2, and G2 is maintained as "L".

At t2, which is a timing one clock period elapsed after t1, CK2 rises, thereby causing G2 to be activated and become "H". At this time, the electric potential of netB2 rises to an electric potential higher than "H", by the capacitor C. On the other hand, the activation of G2 causes electric potential of Qb1 to rise; consequently, Trd of SC1 turns ON, which connects netB1 to Vss, thereby causing the electric potential at netB1 to change from "H" to "L". As a result, Trb of SC1 turns OFF, and CK1 is no longer outputted via Qo1. Moreover, the activation of the G2 causes electric potential of Qb1 to rise; consequently, Tre of SC1 turns ON, which connects Qo1 to Vss, thereby causing the electric potential at Qo1 to change from "H" to "L". Namely, G1 is inactivated from "H" to "L", and this state "L" is maintained. Note that, even if G1 is inactivated and becomes "L", the electric potential of netB2 is maintained by the capacitor C of SC2, and Trb of SC2 remains turned ON. Moreover, upon rise of the electric potential of Qf3 due to the activation of G2, Tra of SC3 turns ON, and the electric potential of netB3 changes from "L" to "H". This also turns Trb of SC3 ON, thereby allowing CK1 to be outputted via Qo3. Namely, G3 remains as "L".

At t3, which is a timing one clock period elapsed after t2, CK1 rises, and thus G3 is also activated and becomes "H". On the other hand, the activation of G3 causes the electric potential of Qb2 to rise; consequently, Trd of SC2 turns ON, which connects netB2 to Vss, thereby causing the electric potential of netB2 to change from "H" to "L". As a result, Trb of SC2 turns OFF and CK2 is no longer outputted via Qo2. Moreover, upon rise of the electric potential of Qb2 due to the activation of G3, Tre of SC2 turns ON, which connects Qo2 to Vss, thereby causing the electric potential of Qo2 to change from "H" to "L". Namely, G2 is inactivated from "H" to "L", and this state "L" is maintained.

Furthermore, at tx, CK2 rises, and thus Gm is also activated and becomes "H". At this time, the electric potential of netBm rises to an electric potential higher than "H" by the capacitor C.

At ty, which is a timing one clock period elapsed after tx, CK2 falls and becomes "L", and the electric potential of netBm also returns back to "H". However, since Trb of SCm remains turned ON, CK2 is continuously outputted via Qom. Namely, Gm is inactivated from "H" to "L", and this state "L" is maintained.

At tz, which is a timing one clock period elapsed after ty, the clear signal CLR is activated and becomes "H". This causes Trc of SCm to be turned ON, which connects netBm to Vss; and the electric potential of the netBm is changed from "H" to "L". As a result, Trb of SCm turns OFF, and CK2 is no longer outputted via Qom.

Note that in FIG. 32, the clear signal CLR is activated at tz (one clock period elapsed after the fall of Gm). However, the present invention is not limited to this. For example, the clear signal CLR can be activated during ty to tz (ty exclusive). Note that the clear signal CLR is to be not activated at ty, since that would cause Gm to maintain the "H" (active) state.

As described, in the shift register 110b, gate on-pulse signals G1 outputted from respective shift circuits Sci (i=1 to m) are made successively active each for a respective certain period of time, and pulses are successively outputted from respective shift circuits in the order of ordinal number, from the shift circuit SC1 in the first stage until the shift circuit SCm of the end stage.

Figure 33:
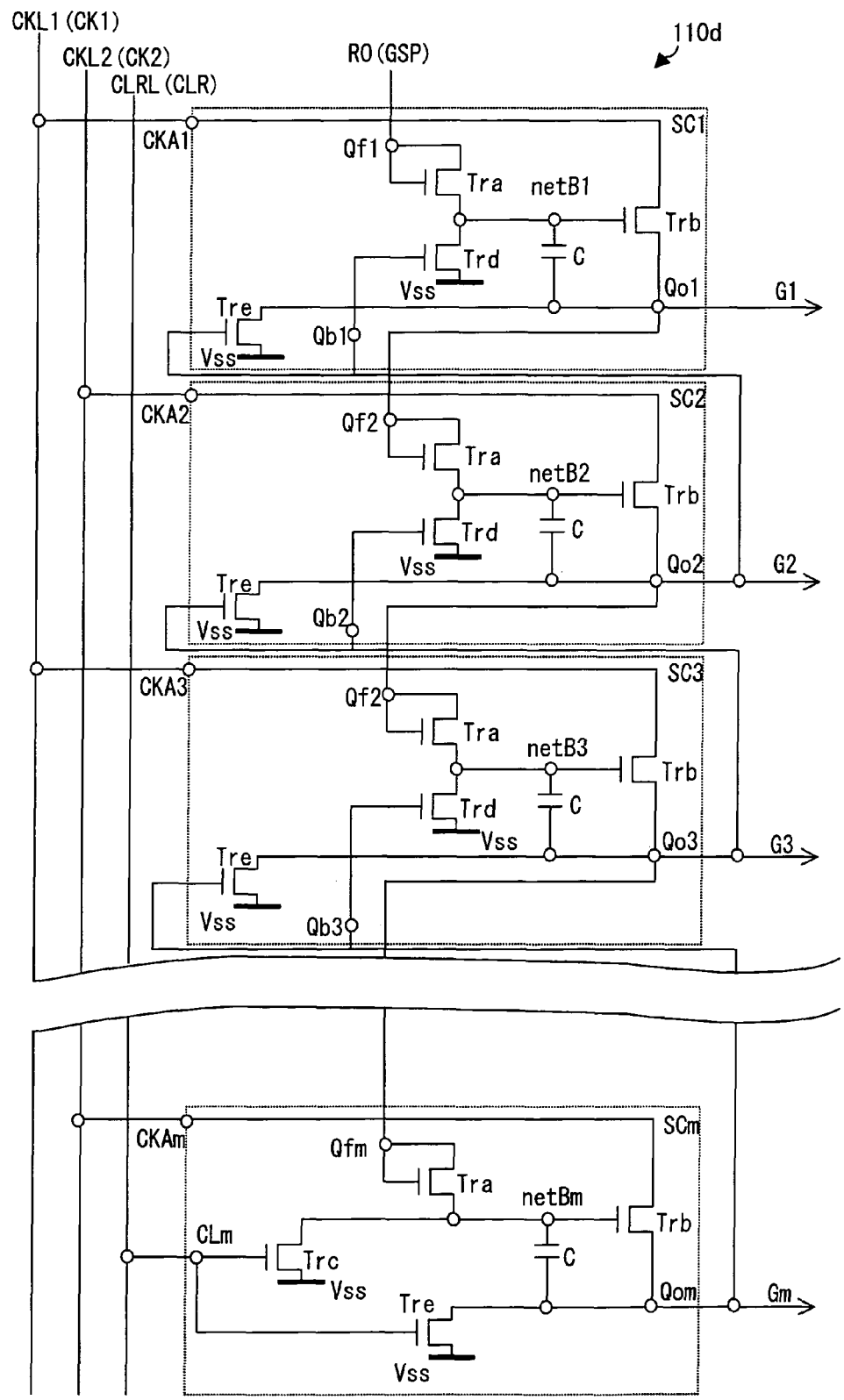
FIG. 33 is a circuit diagram illustrating another configuration of the shift register of Embodiment 3.

The shift register 110c illustrated in FIG. 31 may be configured as like a shift register 110d illustrated in FIG. 33. The shift register 110d, in addition to the configuration of the shift register 110c, includes an N-channel transistor Tre in the shift circuit SCm, which shift circuit is a shift circuit provided in the end stage. The transistor Tre has its source terminal be connected to the lower-potential-side power supply, its drain terminal be connected to the node Qom, and its gate terminal be connected to the node CLm.

Figure 34:
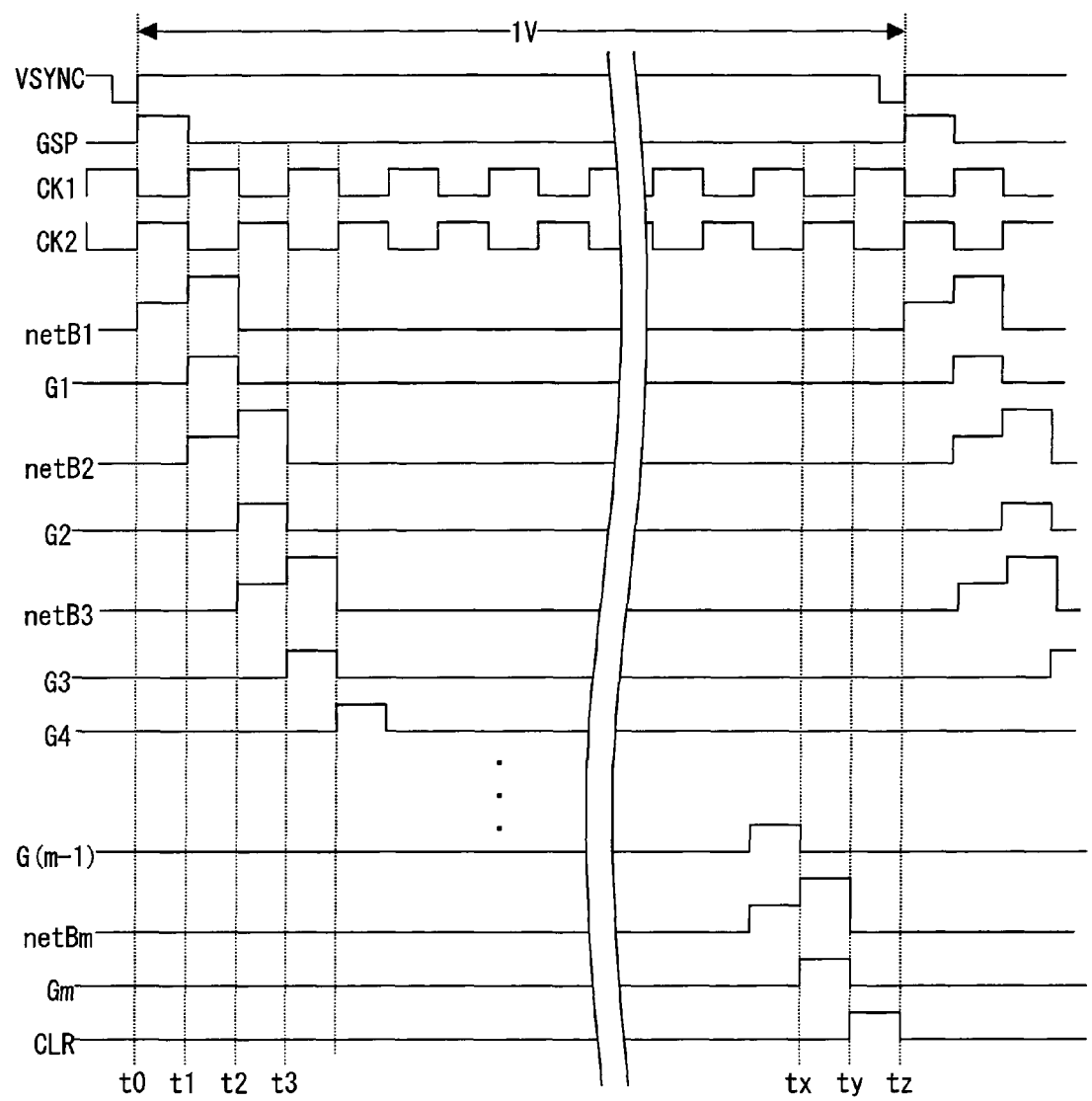
FIG. 34 is a timing chart illustrating an operation (in a case where a sync signal includes no anomalousness) of the shift register shown in FIG. 33.

According to the configuration of the shift register 110d, it is possible to cause a fall in Gm by activating the clear signal CLR. Hence, as illustrated in FIG. 34, at ty, it is possible to activate the clear signal CLR by synchronizing with a fall (inactivation) of Gm.

The shift register 110a illustrated in FIG. 27 may also be configured as like a shift register 110e illustrated in FIG. 35. The shift register 110e, in addition to the configuration of the shift register 110a, includes an N-channel transistor Tre in each of the shift circuits SCi (i=1 to m). The transistor Tre has its source terminal be connected to the lower-potential-side power supply, its drain terminal be connected to the node Qoi, and its gate terminal be connected to the first clock line CKL1 or the second clock line CKL2. If the i is an odd number, the gate terminal of the transistor Tre in the shift circuit SCi is connected to the second clock line CKL2, and if the i is an even number, the gate terminal of the transistor Tre in the shift circuit SCi is connected to the first clock line CKL1.

The following description explains operations of the shift register 110e illustrated in FIG. 35. FIG. 36 is a timing chart illustrating waveforms of the vertical sync signal VSYNC, the gate start pulse signal GSP, the first clock signal CK1, the second clock signal CK2, the gate on-pulse signals Gi (i=1 to m), and the clear signal (CLR). Each of the first clock signal CK1 and second clock signal CK2 includes, in one cycle, one clock period of a "H" (active) period and one clock period of a "L" (inactive) period; upon fall of one of CK1 and CK2, the other one of CK1 and CK2 synchronously rises.

First, at t0 in FIG. 36, activation of GSP causes a rise in electric potential of Qf1. This rise in the electric potential turns Tra of SC1 ON, thereby causing electric potential of netB1 to change from "L" to "H". As a result, Trb of SC1 turns ON, and accordingly CK1 is outputted via Qo1.

At t1, which is a timing one clock period elapsed after t0, GSP falls (is inactivated) and becomes "L". However, the electric potential of netB1 remains high by the capacitor C of SC1, and Trb of SC1 also remains turned ON. As a result, rise of CK1 also causes G1 to activate, and thus G1 becomes "H". At this point, the electric potential of netB1 rises to an electric potential higher than "H" by the capacitor C. Moreover, the activation of G1 causes rise of the electric potential of Qf2. This turns Tra of SC2 ON, which causes the electric potential of netB2 to change from "L" to "H". As a result, Trb of SC2 also is turned ON, and CK2 is outputted via Qo2. According to the configuration, G2 remains at "L".

At t2, which is a timing one clock period elapsed after t1, CK2 rises, thereby causing G2 to also be activated and become "H". At this point, the electric potential of netB2 rises to an electric potential higher than "H", by the capacitor C. Moreover, the activation of G2 causes the electric potential of Qb1 to rise; consequently, Trd of SC1 turns ON, which connects netB1 to Vss, thereby causing the electric potential of netB1 to change from "H" to "L". As a result, Trb of SC1 turns OFF, and CK1 is no longer outputted via Qo1. Moreover, at t2, CK2 rises; consequently, Tre of SC1 is turned ON, which connects Qo1 to Vss, thereby causing electric potential of the Qo1 to change from "H" to "L". As a result, G1 is inactivated from "H" to "L", and this state "L" is maintained. Note that even if the G1 is inactivated and becomes "L", the electric potential of netB2 is maintained by the capacitor C of SC2, and Trb of SC2 remains turned ON. Moreover, the activation of G2 causes the electric potential of Qf3 to rise; consequently, Tra of SC3 turns ON, thereby causing the electric potential of netB3 to change from "L" to "H". As a result, Trb of SC3 also is turned ON, and CK1 is outputted via Qo3. According to the configuration, G3 remains at "L".

At t3, which is a timing one clock period elapsed after t2, CK1 rises, thereby causing G3 to be activated and become "H". Moreover, the activation of G3 causes electric potential of Qb2 to rise; consequently, Trd of SC2 is turned ON, which connects netB2 to Vss, thereby causing electric potential of netB2 to change from "H" to "L". As a result, Trb of SC2 turns OFF, and CK2 is no longer outputted to Qo2. Moreover, at t3, CK1 rises; consequently, Tre of SC2 is turned ON, which connects Qo2 to Vss, thereby causing electric potential of Qo2 to change from "H" to "L". As a result, G2 is inactivated from "H" to "L", and this state "L" is maintained.

Note that, in the shift register 110e, CK2 is "H" during a period between t4 to t5 and a period between t6 to t7. As a result, Tre of SC1 is turned ON, which connects Qo1 to Vss, thereby causing G1 to again fall to "L" (i.e., be drawn to "L"). Similarly, during a period between t5 to t6, CK1 is "H"; as a result, Tre of SC2 is turned ON, which connects Qo2 to Vss, thereby causing G2 to again fall to "L" (be drawn to "L").

Furthermore, at tx, CK2 rises; as a result, Gm also is activated and becomes "H". At this point, the electric potential of netBm rises to an electric potential higher than "H", by the capacitor C.

At ty, which is a timing one clock period elapsed after tx, the clear signal CLR is activated and becomes "H". As a result, Trc of SCm is turned ON, which connects netBm to Vss, thereby causing the electric potential of netBm to fall to "L". Consequently, Trb of SCm is turned OFF, and CK2 is no longer outputted via Qom. Further, CK1 rises at ty, therefore Tre of SCm is turned ON, which connects Qom to Vss. As a result, Gm is inactivated and becomes "L".

In FIG. 36, the clear signal CLR is activated at ty; however, it is not limited to this. For example, the clear signal CLR may be activated during a period between ty and tz (ty and tz inclusive).

As described above, in the shift register 110e, the gate on-pulse signals G1 outputted from the shift circuits SCi (i=1 to m), respectively, are made successively active each for a respectively certain period of time, and pulses thus generated are outputted from the respective shift circuits in order of ordinal number, from the shift circuit SC1 in the first stage until the shift circuit SCm in the end stage. The end stage (unit circuit SCm) is reset with use of the clear signal; this makes it possible to omit the dummy stage (dummy shift circuit) provided in the conventional technique, thereby allowing reduction in circuit area.

Embodiment 4

Figure 37:
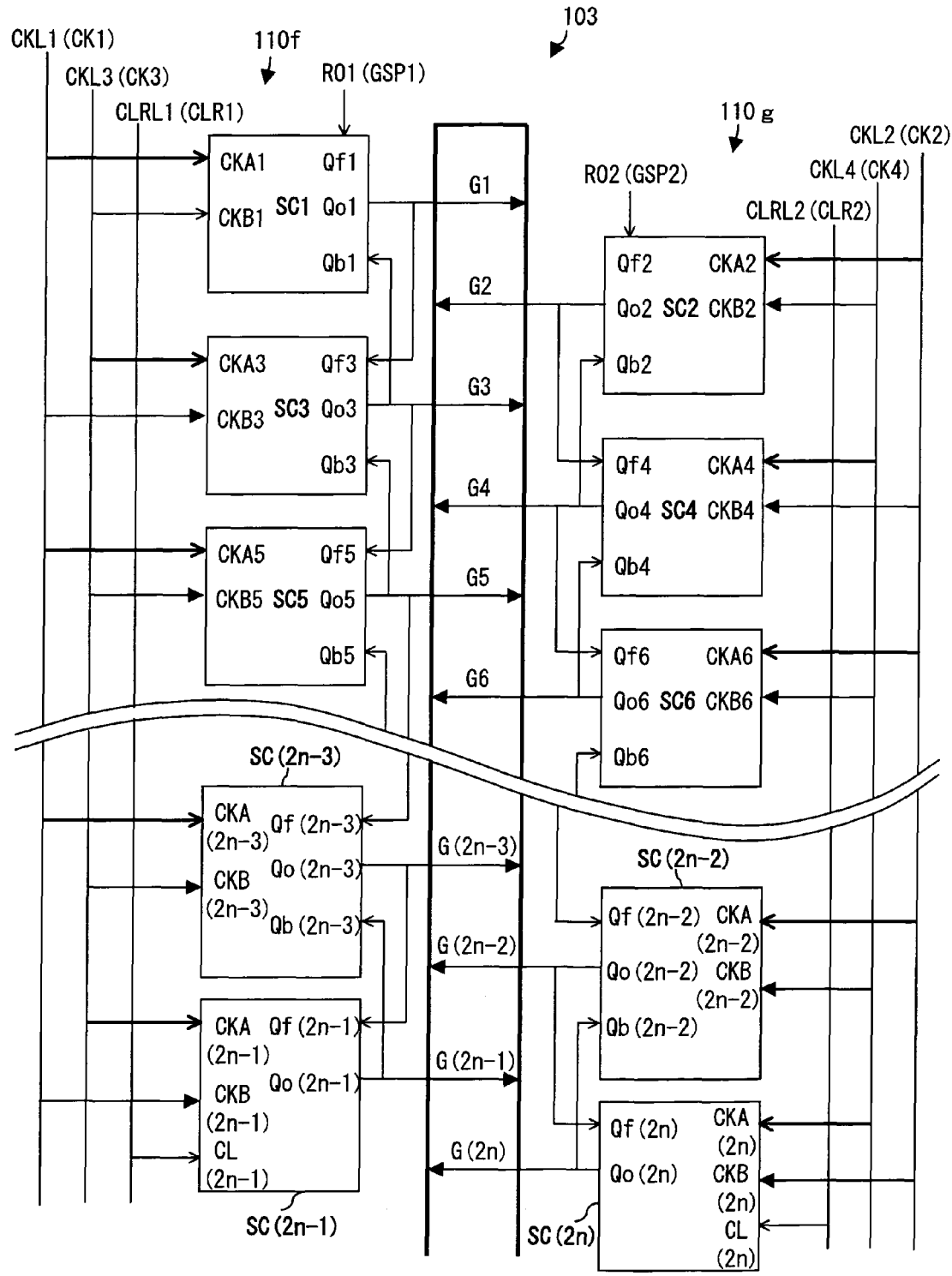
FIG. 37 is a block diagram illustrating a configuration of a shift register of Embodiment 4.

Embodiment 4 is as described below, with reference to FIGS. 37 to 39. FIG. 37 illustrates a configuration of a liquid crystal panel in accordance with the present embodiment. As illustrated in FIG. 37, the present liquid crystal panel provides a shift register 110f on a left end of the panel and a shift register 110g on a right end of the panel. The shift register 110f includes a plurality of shift circuits SCi (i=1, 3, 5, . . . 2n+1) connected in stages, and shift circuits SCi (i=2, 4, 6, . . . 2n) connected in stages. Each of the shift circuits SCi (i=1, 2, 3, . . . 2n-2) includes input nodes Qfi, Qbi, CKAi, and CKBi, and an output node Qoi. The shift circuit SC(2n-1) includes input nodes Qf(2n-1), CKA(2n-1), CKB(2n-1), and CL(2n-1), and an output node Qo (2n-1). Moreover, the shift circuit SC(2n) includes input nodes Qf(2n), CKA(2n), CKB(2n), and CL(2n), and an output node Qo(2n).

In the embodiment, the shift circuit SC1 has its node Qf1 be connected to a GSP1 outputting terminal RO1 of a level shifter, has its node Qb1 be connected to the node Qo3 of the shift circuit SC3, has its node CKA1 be connected to a first clock line CKL1 to which a first clock signal is supplied, and has its node CKB1 be connected to a third clock line CKL3 to which a third clock signal is supplied. Further, a gate on-pulse signal (signal line selection signal) G1 is outputted via its node Qo1.

The shift circuit SC2 has its node Qf2 be connected to a GSP2 outputting terminal RO2 of the level shifter, has its node Qb2 be connected to the node Qo4 of the shift circuit SC4, has its node CKA2 be connected to a second clock line CKL2 to which a second clock signal is supplied, and has its node CKB2 be connected to a fourth clock line CKL4 to which the fourth clock signal is supplied. Further, a gate on-pulse signal (signal line selection signal) G2 is outputted via its node Qo2.

Moreover, each of the shift circuits SCi (i=3 to 2n-2) has its node Qfi be connected to the node Qo (i-2) of the shift circuit SC (i-2), and its node Qbi be connected to the node Qo (i+2) of the shift circuit SC (i+2). Moreover, in a case where i is a multiple of 4+1, its node CKAi is connected to the first clock line CKL1 and its node CKBi is connected to the third clock line CKL3; in a case where i is a multiple of 4+2, its node CKAi is connected to the second clock line CKL2 and its node CKBi is connected to the fourth clock line CKL4; in a case where i is a multiple of 4+3, its node CKAi is connected to the third clock line CKL1 and its node CKBi is connected to the first clock line CKL3; and in a case where i is a multiple of 4, its node CKAi is connected to the fourth clock line CKL4 and its node CKBi is connected to the second clock line CKL2. Further, a gate on-pulse signal (signal line selection signal) G1 is outputted from the node Qoi.

The shift circuit SC(2n-1) has its node Qf(2n-1) be connected to the node Qo(2n-3) of the shift circuit SC(2n-3), has its node CKA(2n-1) be connected to the third clock line CKL3, has its node CKB(2n-1) connected to the first clock line CKL1, and has its node CL(2n-1) connected to the first clear line CLRL1. Further, a gate on-pulse signal (signal line selection signal) G(2n-1) is outputted from its node Qo(2n-1).

Moreover, the shift circuit SC(2n) has its node Qf(2n) be connected to the node Qo(2n-2) of the shift circuit SC(2n-2), has its node CKA(2n) be connected to the fourth clock line CKL4, has its node CKB(2n) be connected to the second clock line CKL2, and has its node CL(2n) be connected to the second clear line CLRL2. Further, a gate on-pulse signal (signal line selection signal) G(2n) is outputted from its node Qo(2n).

Figure 38:
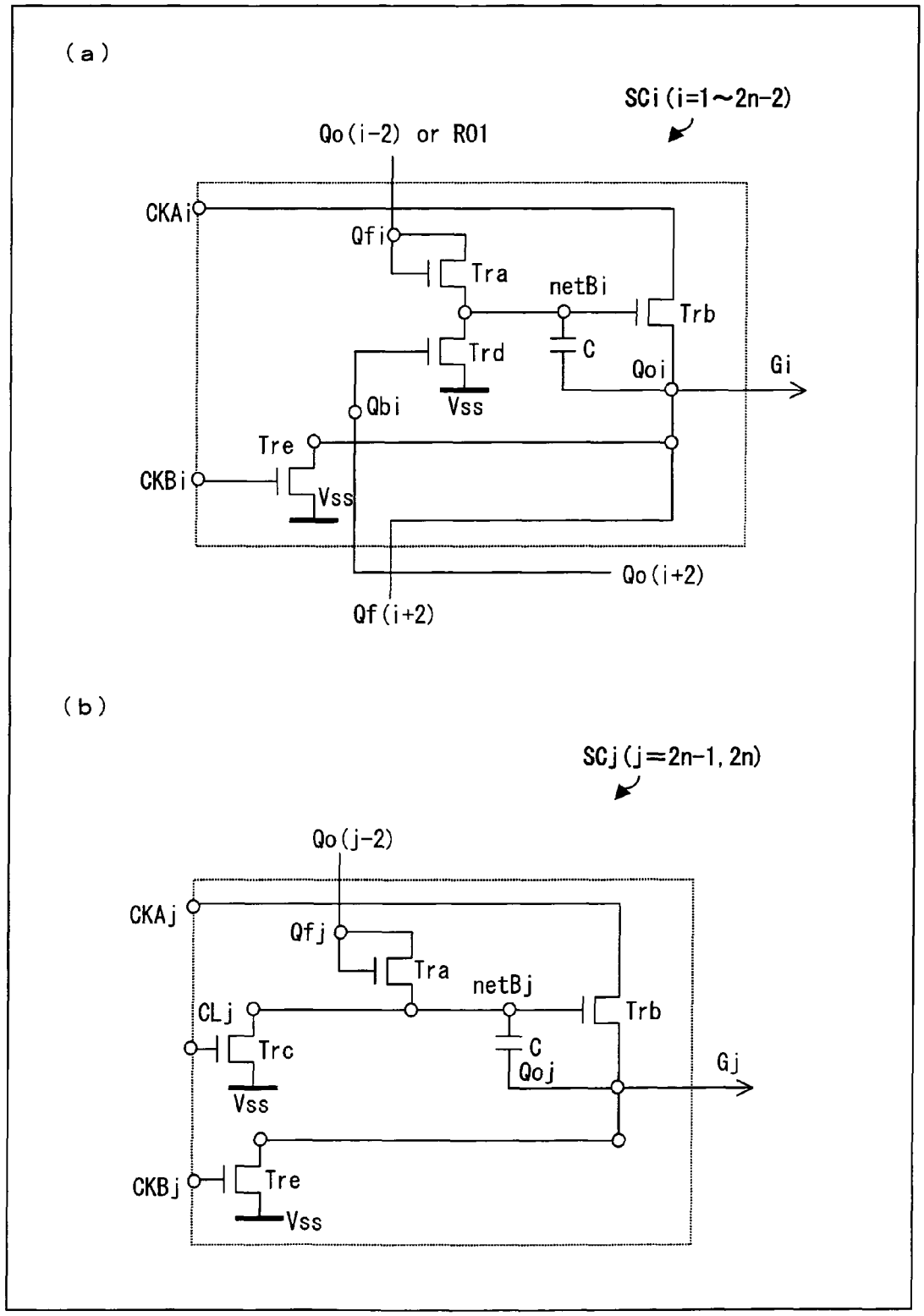
FIG. 38 Parts (a) and (b) of FIG. 38 are circuit diagrams illustrating a configuration of a unit circuit of the shift register of Embodiment 4.

Specifically illustrated in (a) of FIG. 38 is a circuit diagram of a configuration employed into each of SCi (i=1 to 2n-2). As illustrated in (a) of FIG. 38, each of SCi (i=1 to 2n-2) includes a set transistor Tra, an output transistor Trb, a reset transistor Trd, a low-potential supplying transistor Tre, and a capacitor C. Note that each of the transistors is an N-channel transistor.

In the embodiment, Trb has its source terminal be connected to a first electrode of the capacitor C. Tra has its gate terminal (control terminal) and its drain terminal be connected to each other, and further has its source terminal be connected to (i) a gate terminal of the Trb and (ii) a second electrode of the capacitor C. Moreover, Trd has its drain terminal be connected to the gate terminal of the Trb, and further has its source terminal be connected to a lower-potential-side power supply Vss. Moreover, Tre has its drain terminal be connected to the source terminal of the Trb, and further has its source terminal be connected to the lower-potential-side power supply Vss. Moreover, the gate terminal of Tra is connected to the node Qfi, Trb has its drain terminal be connected to the node CKAi, Tre has its gate terminal be connected to the node CKBi, Trc has its gate terminal be connected to the node CLi, Trd has its gate terminal be connected to the node Qbi, and the source terminal of the Trb is connected to the node Qoi. Note that a connection point of the source terminal of the Tra, the second electrode of the capacitor C, and the gate terminal of the Trb is defined as a node netBi.

Moreover, specifically illustrated in (b) of FIG. 38 is a circuit diagram of a configuration of SCj (j=(2n−1) or 2n). As illustrated in (b) of FIG. 38, SCj includes a set transistor Tra, an output transistor Trb, a clear transistor Trc provided for resetting the end stage, a low-potential supplying transistor Tre, and a capacitor C. Note that each of the transistors is an N-channel transistor.

In the embodiment, Trb has its source terminal be connected to a first electrode of the capacitor C. Tra has its gate terminal (control terminal) and its drain terminal be connected to each other, and further has its source terminal be connected to (i) a gate terminal of Trb and (ii) a second electrode of the capacitor C. Moreover, Trc has its drain terminal be connected to the gate terminal of Trb, and further has its source terminal be connected to a lower-potential-side power supply Vss. Moreover, Tre has its drain terminal connected to the source terminal of the Trb, and further has its source terminal be connected to the lower-potential-side power supply Vss. Furthermore, the gate terminal of the Tra is connected to the node Qfj, Trb has its drain terminal be connected to the node CKAj, Tre has its gate terminal connected to the node CKBj, Trc has its gate terminal be connected to the node CLj, and the source terminal of the Trb is connected to the node Qoj. Moreover, a connection point of the source terminal of the Tra, the second electrode of the capacitor C and the gate terminal of the Trb is defined as a node netBj.

The nodes (Qfi, Qbi, CKAi, CKBi, Qoi) of each of the shift circuits SCi (i=1 to 2n−2) and the nodes (Qfj, CKAj, CKBj, CLj, Qoj) of the shift circuit SCj (j=(2n−1) or 2n) are connected to respective destinations as illustrated in FIG. 37.

The following describes operations of the shift registers 110f and 110g illustrated in FIG. 37. FIG. 39 is a timing chart showing waveforms of the vertical sync signal VSYNC, the gate start pulse signals GSP1 and GSP2, the first clock signal CK1, the second clock signal CK2, the third clock signal CK3, the fourth clock signal CK4, the gate on-pulse signals Gi (i=1 to 2n), the first clear signal CLR1, and the second clear signal CLR2. Note that each of CK1 to CK4 includes, in one cycle, one clock period of a "H" period and three clock periods of a "L" period; synchronizing with a fall of CK1, CK2 rises; synchronizing with a fall of CK2, CK3 rises; synchronizing with a fall of CK3, CK4 rises; and synchronizing with a fall of CK4, CK1 rises. Moreover, GSP2 rises one clock period elapsed after the rise of GSP1.

Figure 39:
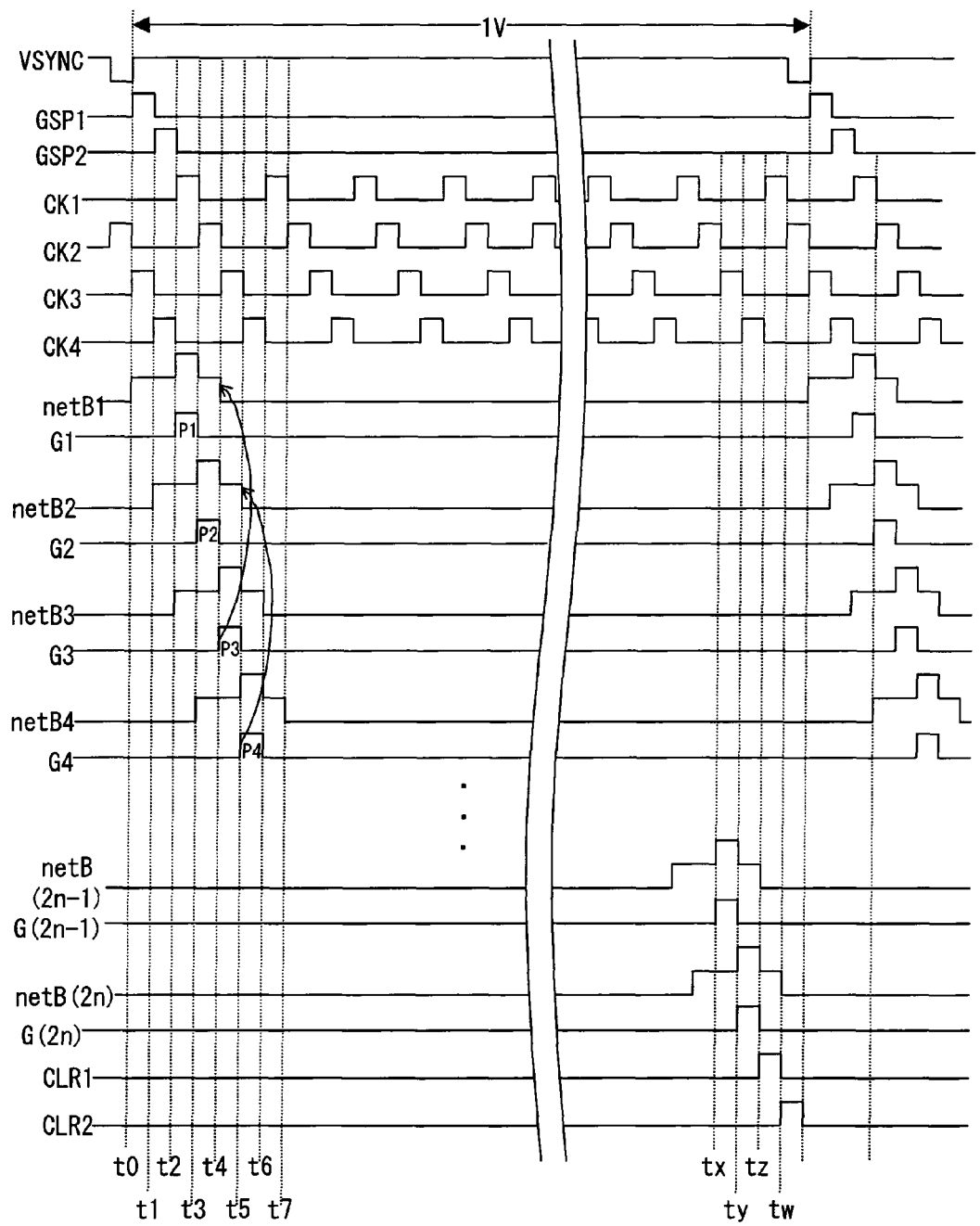
FIG. 39 is a timing chart illustrating an operation of the shift register shown in FIG. 37.
Figure 40:
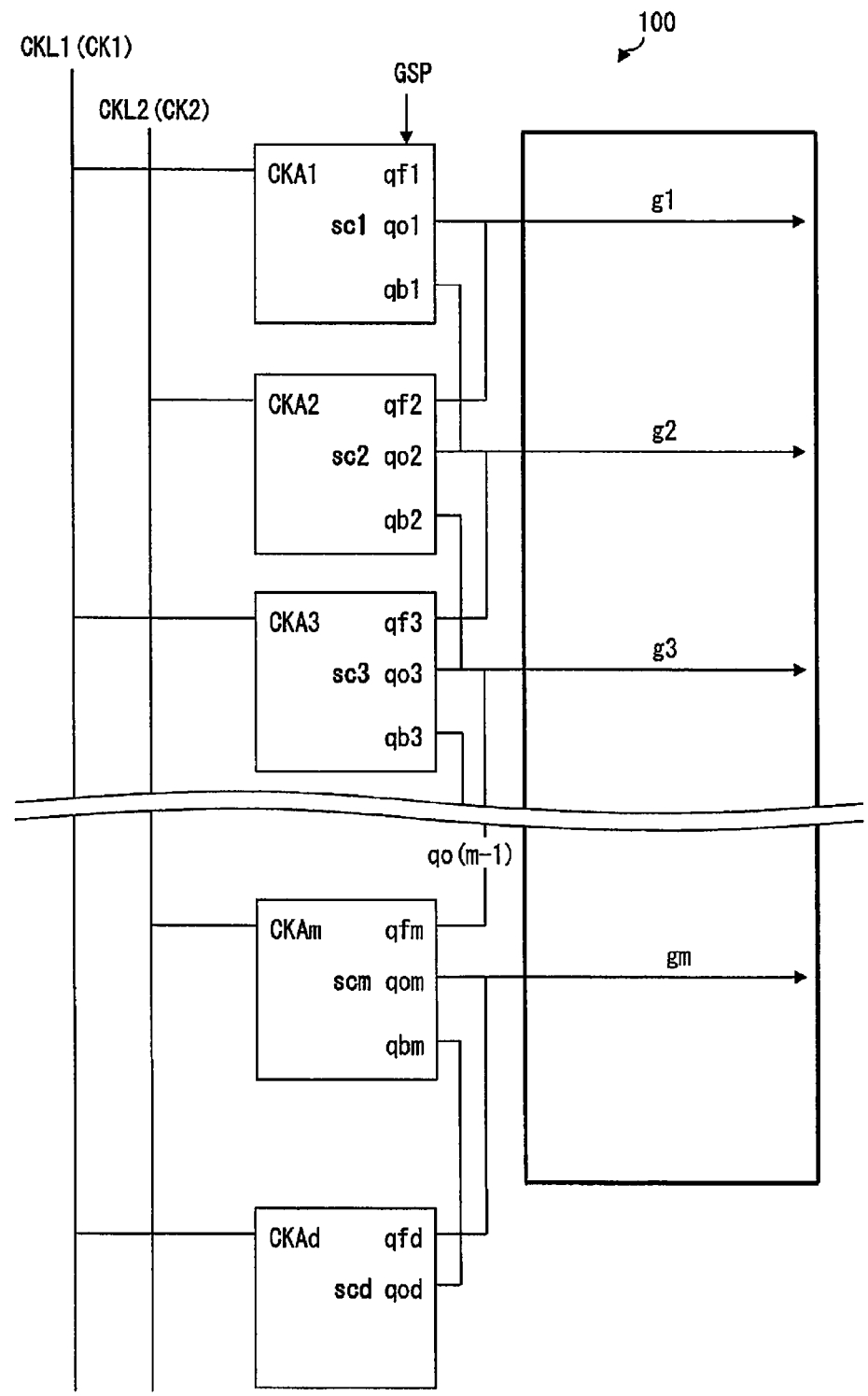
FIG. 40 is a block diagram illustrating a configuration of a conventional shift register.
Figure 41:
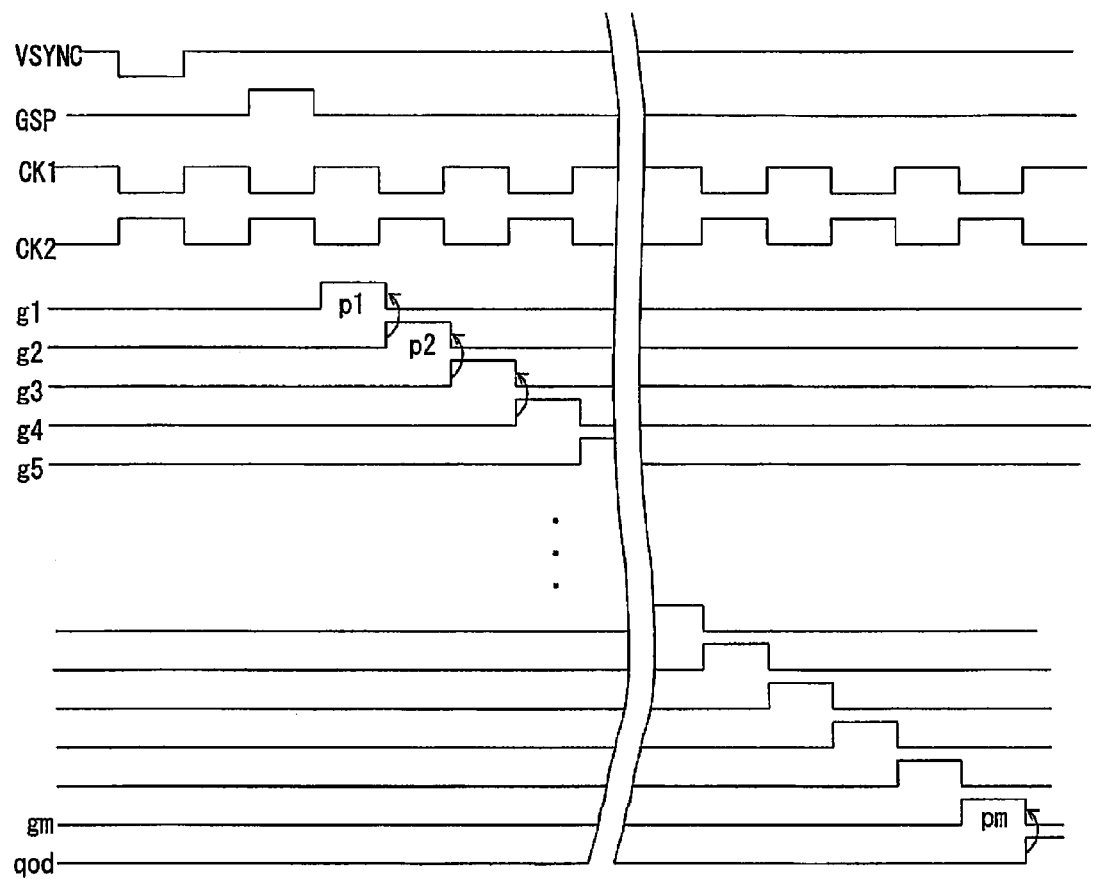
FIG. 41 is a timing chart illustrating an operation of the shift register shown in FIG. 40.
Figure 42:
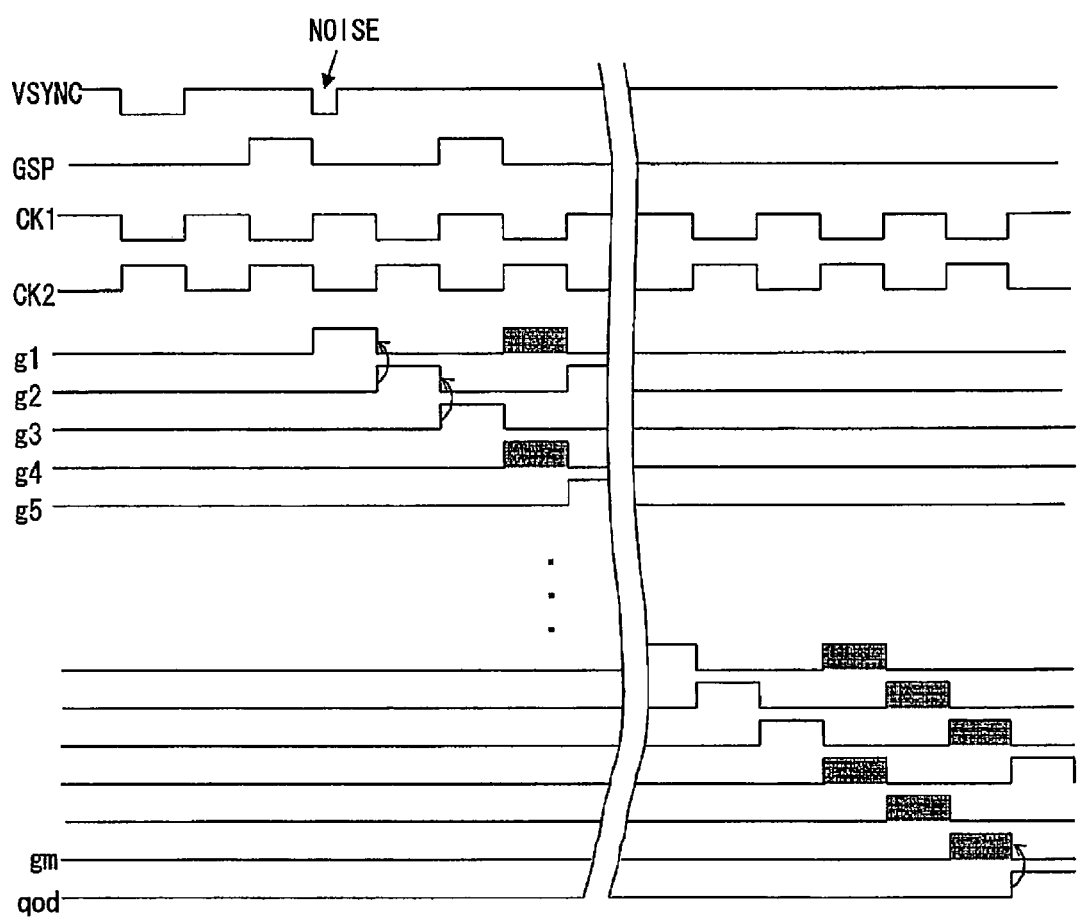
FIG. 42 is a timing chart illustrating an operation of the shift register shown in FIG. 40.

First, at t0 in FIG. 39, GSP1 is activated, which causes electric potential of Qf1 to rise. As a result, Tra of SC1 is turned ON, thereby causing electric potential of netB1 to change from "L" to "H". Consequently, Trb of SC1 also is turned on, and CK1 is outputted via Qo1. According to the configuration, G1 remains at "L".

At t1, which is a timing one clock period elapsed after t0, GSP1 falls and becomes "L", however the electric potential of netB1 is maintained as "H" by the capacitor C of SC1, and thus Trb of SC1 remains turned ON. Moreover, at t1, GSP2 is activated, which causes electric potential of Qf2 to rise. As a result, Tra of SC2 is turned ON, thereby causing electric potential of netB2 to change from "L" to "H". Consequently, Trb of SC2 also is turned ON, and CK2 is outputted via Qo2. According to the configuration, G2 remains at "L".

At t2, which is a timing one clock period elapsed after t1, CK1 rises, thereby causing G1 to be activated and become "H". At this point, electric potential of netB1 rises to an electric potential higher than "H" by the capacitor C. Moreover, the activation of G1 causes electric potential of Qf3 to rise; consequently, Tra of SC3 is turned ON, thereby causing the electric potential of netB3 to change from "L" to "H". As a result, Trb of SC3 also is turned ON, and CK3 is outputted via Qo3. According to the configuration, G3 remains at "L". Moreover, at t2, GSP2 falls and becomes "L", however the electric potential of netB2 is maintained at "H" by the capacitor C of SC2, and Trb of SC2 also remains turned ON.

At t3, which is a timing one clock period elapsed after t2, CK1 falls and becomes "L", and the electric potential of netB1 also is returned back to "H". However, since Trb of SC1 remains turned ON, CK1 is continuously outputted via Qo1. As a result, G1 is inactivated and changes from "H" to "L", and this state "L" is maintained. Note that even if G1 is inactivated and becomes "L", the electric potential of netB3 is maintained at "H" by the capacitor C of SC3, and thus Trb of SC3 remains turned ON. Moreover, at t3, CK2 rises; consequently, G2 is also activated and becomes "H". At this point, the electric potential of netB2 rises to an electric potential higher than "H", by the capacitor C. Moreover, at t3, the activation of G2 causes electric potential of Qf4 to rise; consequently, Tra of SC4 is turned ON, thereby causing the electric potential of netB4 to change from "L" to "H". As a result, the Trb of SC4 also is turned ON, and accordingly CK4 is outputted via Qo4. According to the configuration, G4 remains at "L".

At t4, which is a timing one clock period elapsed after t3, CK3 rises, thereby causing G3 to be activated and become "H". At this point, the electric potential of netB3 rises to an electric potential higher than "H" by the capacitor C. Moreover, the activation of G3 causes electric potential at Qb1 to rise; consequently, Trd of SC1 is turned ON, which connects netB1 to Vss, thereby causing the electric potential of netB1 to change from "H" to "L". As a result, Trb of SC1 is turned OFF, and CK1 is no longer outputted via Qo1. Moreover, at t4, CK3 rises; consequently, Tre of SC1 is turned ON, which connects Qo1 to Vss, thereby causing the electric potential of the Qo1 to fall to "L" (G1 is drawn to "L"). Moreover, at t4, CK2 falls and becomes "L", and the electric potential of netB2 is returned back to "H". However, since Trb of SC2 remains turned ON, CK2 is continuously outputted via Qo2. Therefore, G2 is inactivated from "H" to "L", and this state "L" is maintained.

At t5, which is a timing one clock period elapsed after t4, CK4 rises, thereby causing G4 to be activated and become "H". At this point, electric potential of netB4 rises to an electric potential higher than "H", by the capacitor C. On the other hand, the activation of G4 causes electric potential of Qb2 to rise; consequently, Trd of SC2 is turned ON, which connects netB2 to Vss, thereby causing the electric potential of netB2 to change from "H" to "L". As a result, Trb of SC2 is turned OFF, and CK2 is no longer outputted via Qo2. Moreover, at t5, CK4 rises. This causes Tre of SC2 to turn ON, which connects Qo2 to Vss, thereby causing the electric potential at Qo2 to fall to "L" (G2 is drawn to "L"). At t5, CK3 falls and becomes "L", and the electric potential of netB3 also is returned to "H". However, since Trb of SC3 remains turned ON, CK3 is continuously outputted via Qo3. As a result, G3 is inactivated from "H" to "L", and this state "L" is maintained.

At t6, which is a timing one clock period elapsed after t5, CK1 rises, thereby causing G5 to be activated and become "H". At this point, the electric potential of netB5 rises to an electric potential higher than "H" by the capacitor C. Moreover, the activation of G5 causes electric potential of Qb3 to rise; consequently, Trd of SC3 is turned ON, which connects netB3 to Vss, thereby causing the electric potential of netB3 to change from "H" to "L". As a result, Trb of SC3 turns OFF and CK3 is no longer outputted via Qo3. Moreover, at t6, CK1 rises; as a result, Tre of SC3 is turned ON, which connects Qo3 to Vss, thereby causing the electric potential of Qo3 to fall to "L" (G3 is drawn to "L"). Moreover, at t6, CK4 falls and becomes "L", and electric potential of netB4 is also returned back to "H". However, since Trb of SC4 remains turned ON, CK4 is continuously outputted via Qo4. As a result, G4 is inactivated from "H" to "L", and this state "L" is maintained.

At t7, which is a timing one clock period elapsed after t6, CK2 rises, thereby causing G6 to also be activated and become "H". At this point, electric potential of netB6 rises to an electric potential higher than "H" by the capacitor C. Moreover, the activation of G6 causes electric potential of Qb4 to rise; consequently, Trd of SC4 is turned ON, which connects netB4 to Vss, thereby causing the electric potential of netB4 to change from "H" to "L". As a result, Trb of SC4 is turned OFF, and CK4 is no longer outputted via Qo4. Moreover, at t7, CK2 rises, thereby causing Tre of SC4 to be turned ON, which connects Qo4 to Vss. As a result, the electric potential of Qo4 falls to "L" (G4 is drawn to "L").

Furthermore, at tx, CK3 rises, thereby causing G(2n−1) to also be activated and become "H". At this point, the electric potential of the netB(2n−1) rises to an electric potential higher than "H", by the capacitor C.

Moreover, at ty, which is a timing one clock period elapsed after tx, CK4 rises, thereby causing G(2n) to also be activated and become "H". At this point, the electric potential of netB(2n) rises to an electric potential higher than "H" by the capacitor C. Moreover, at ty, CK3 falls and becomes "L", and the electric potential of netB(2n−1) is also returned back to "H". However, since Trb of SC(2n−1) remains turned ON, CK3 is continuously outputted via Qo(2n−1). As a result, G(2n−1) is inactivated from "H" to "L", and this state "L" is maintained.

At tz, which is a timing one clock period elapsed after ty, a first clear signal CLR1 is activated and becomes "H"; consequently, Trc of SC(2n−1) is turned ON, which connects netB(2n−1) to Vss, thereby causing the electric potential of netB(2n−1) to change from "H" to "L". As a result, Trb of SC(2n−1) is turned OFF, and CK3 is no longer outputted via Qo(2n−1). Furthermore, CK1 rises; consequently, Tre of SC(2n−1) is turned ON, which connects Qo(2n−1) to Vss, thereby causing the electric potential of Qo(2n−1) to fall to "L" (G(2n−1) is drawn to "L"). Moreover, at tz, CK4 falls and becomes "L", and the electric potential of netB(2n) is also returned back to "H". However, since Trb of SC(2n) remains turned ON, CK4 is continuously outputted via Qo(2n). As a result, G(2n) is inactivated from "H" to "L", and this state "L" is maintained.

At tw, which is a timing one clock period elapsed after ty, the second clear signal CLR2 is activated and becomes "H"; consequently, Trc of SC(2n) is turned ON, which connects netB(2n) to Vss, thereby causing electric potential to change from "H" to "L". As a result, Trb of SC(2n) is turned OFF, and CK4 is no longer outputted via Qo(2n). Furthermore, CK2 rises, therefore Tre of SC(2n) is turned ON, which connects Qo(2n) to Vss, thereby causing electric potential of Qo(2n) to fall to "L" (G(2n) is drawn to "L").

As described above, in a case where the sync signal includes no anomalousness, the gate on-pulse signals G1 outputted from the respective shift circuits SCi (i=1, 3, 5, . . . and 2n−1) are successively made active each for a respective certain period of time in the shift register 110f, and accordingly the pulses P1, P3, . . . P(2n−1) are outputted successively from respective shift circuits in the order of odd ordinal number, from the shift circuit SC1 in the first stage until the shift circuit SC(2n−1) in the end stage. Moreover, the gate on-pulse signals G1 outputted from the respective shift circuits SCi (i=2, 4, 6, . . . 2n) are successively made active each for a respective certain period of time in the shift register 110g, and pulses P1, P2, P(2n) are outputted successively from the respective shift circuits in the order of even shift circuits, from the shift circuit SC2 in the first stage until the shift circuit SC(2n) in the end stage. Thereafter, in the end stage (unit circuit SC(2n−1) and (2n)), the shift registers 110f and 110g are reset with use of the clear signal. This makes it possible to omit a dummy stage (dummy shift circuit) which is provided in a conventional technique, thereby allowing reduction in the circuit area.

As illustrated in FIG. 37, with the shift registers 110f and 110g, GSP1 and GSP2 can be a common gate start pulse signal. In this case, for example in FIG. 39, GSP1 and GSP2 are made "H" (active) at t0. Moreover, CLR1 and CLR2 can be a common clear signal. In this case, for example in FIG. 39, CLR1 and CLR2 are made "H" (active) at tw.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present display panel driving circuit and shift register are suitably used in a liquid crystal display device.

The invention claimed is:

1. A display panel drive circuit receiving a sync signal from outside, the display panel drive circuit including a shift register constructed of unit circuits connected in stages, the unit circuits outputting signal line selection signals, respectively, each of the signal line selection signals being made active for a respective certain period of time to form a respective pulse, the pulses being outputted successively from respective unit circuits in order of ordinal number starting from a first stage until an end stage,
　　each of the unit circuits receiving (i) a clock signal, (ii) a start pulse signal or a signal line selection signal generated in a stage different from its own stage, and (iii) a clear signal,
　　the clear signal being made active in a case where anomalousness is included in at least the sync signal, and no pulse is outputted from the shift register after the clear signal is made active, until a subsequent vertical scanning period starts.

2. The display panel drive circuit according to claim 1, wherein:
　　the clock signal, the start pulse signal, and the clear signal are generated based on the sync signal.

3. The display panel drive circuit according to claim 1, wherein:
　　the sync signal includes at least one of a vertical sync signal, a horizontal sync signal, and a data enable signal.

4. The display panel drive circuit according to claim 1, wherein:

regardless of whether or not anomalousness is included in the sync signal, the clear signal is made active after the end stage outputs its respective pulse, so that the signal line selection signal outputted from the end stage remains inactive.

5. The display panel drive circuit according to claim 1, wherein:

each of the unit circuits except for that in the end stage includes a set transistor, an output transistor, a reset transistor, a clear transistor, and a capacitor, the set transistor, output transistor, reset transistor, and clear transistor each having a control terminal, a first conductive terminal, and a second conductive terminal, and the capacitor having a first electrode and a second electrode, the set transistor receiving, via its control terminal, the start pulse signal or a signal line selection signal outputted from a stage previous to its own stage, the reset transistor receiving, via its control terminal, a signal line selection signal outputted from a stage subsequent to its own stage, the clear transistor receiving the clear signal via its control terminal, the output transistor receiving the clock signal via its first conductive terminal, the second conductive terminal of the output transistor being connected to the first electrode of the capacitor, the control terminal of the set transistor and the first conductive terminal of the set transistor being connected to each other, and the second conductive terminal of the set transistor being connected to (i) the control terminal of the output transistor and (ii) the second electrode of the capacitor, the first conductive terminal of the reset transistor being connected to the control terminal of the output transistor, and the second conductive terminal of the reset transistor being connected to a constant potential source, the first conductive terminal of the clear transistor being connected to the control terminal of the output transistor, and the second conductive terminal of the clear transistor being connected to the constant potential source, and the second conductive terminal of the output transistor serving as an output terminal of the respective unit circuit.

6. The display panel drive circuit according to claim 5, wherein:

each of the unit circuits except for that in the end stage further includes a potential supplying transistor, the potential supplying transistor having a control terminal, a first conductive terminal, and a second conductive terminal, the first conductive terminal of the potential supplying transistor being connected to the second conductive terminal of the output transistor, and the second conductive terminal of the potential supplying transistor being connected to the constant potential source, the potential supplying transistor receiving, via its control terminal, a signal line selection signal outputted from a stage subsequent to its own stage.

7. The display panel drive circuit according to claim 6, wherein:

each of the set transistor, the output transistor, the reset transistor, the clear transistor, and the potential supplying transistor is an N-channel transistor.

8. The display panel drive circuit according to claim 5, wherein:

each of the unit circuits except for that in the end stage further includes a potential supplying transistor, the potential supplying transistor having a control terminal, a first conductive terminal, and a second conductive terminal, the first conductive terminal of the potential supplying transistor being connected to the second conductive terminal of the output transistor, and the second conductive terminal of the potential supplying transistor being connected to the constant potential source, the potential supplying transistor receiving, via its control terminal, a clock signal different from the clock signal received via the first conductive terminal of the output transistor.

9. The display panel drive circuit according to claim 5, wherein:

the unit circuit in the end stage includes a set transistor, an output transistor, a clear transistor, and a capacitor, the set transistor, output transistor, and clear transistor each having a control terminal, a first conductive terminal, and a second conductive terminal, and the capacitor having a first electrode and a second electrode, the set transistor receiving, via its control terminal, a signal line selection signal outputted from a stage previous to its own stage, the clear transistor receiving the clear signal via its control terminal, and the output transistor receiving the clock signal via its first conductive terminal, the second conductive terminal of the output transistor being connected to the first electrode of the capacitor, the control terminal of the set transistor and the first conductive terminal of the set transistor being connected to each other, and the second conductive terminal of the set transistor being connected to (i) the control terminal of the output transistor and (ii) the second electrode of the capacitor, the first conductive terminal of the clear transistor being connected to the control terminal of the output transistor, and the second conductive terminal of the clear transistor being connected to the constant potential source, and the second conductive terminal of the output transistor serving as an output terminal of the unit circuit in the end stage.

10. The display panel drive circuit according to claim 9, wherein:

the unit circuit in the end stage further includes a potential supplying transistor, the potential supplying transistor having a control terminal, a first conductive terminal, and a second conductive terminal, the potential supplying transistor receiving the clear signal via its control terminal, the first conductive terminal of the potential supplying transistor being connected to the second conductive terminal of the output transistor, and the second conductive terminal of the potential supplying transistor being connected to the constant potential source.

11. The display panel drive circuit according to claim 5, wherein:

the clear signal is made active at a timing in which the signal line selection signal received from a respective stage is made inactive, or is made active while the signal line selection signal received from the respective stage is inactive.

12. The display panel drive circuit according to claim 5, wherein:
a plurality of clock signals each having phases different from each other are inputted into the shift register, the plurality of clock signals being received by the output transistors of different unit circuits, respectively.

13. The display panel drive circuit according to claim 12, wherein:
each of the plurality of clock signals have an inactive period that partially coincides with an inactive period of another of the plurality of clock signals.

14. The display panel drive circuit according to claim 12, wherein:
the plurality of clock signals include two clock signals which are shifted in phase by half a cycle.

15. The display panel drive circuit according to claim 12, wherein:
at least one of the plurality of clock signals is made inactive while the clear signal is made active.

16. The display panel drive circuit according to claim 5, wherein:
each of the set transistor, the output transistor, the reset transistor, and the clear transistor is an N-channel transistor.

17. The display panel drive circuit according to claim 16, wherein:
the first conductive terminal of each of the transistors is a drain terminal, and the second conductive terminal of each of the transistors is a source terminal.

18. The display panel drive circuit according to claim 5, wherein:
the first conductive terminal of each of the transistors is a source terminal, and the second conductive terminal of each of the transistors is a drain terminal.

19. The display panel drive circuit according to claim 1, further comprising:
a timing controller for generating the clock signal, the start pulse signal, and the clear signal, with use of the sync signal.

20. The display panel drive circuit according to claim 1, further comprising:
an anomalousness detection circuit for detecting anomalousness of the sync signal,
the clear signal being generated based on a result of the detection.

21. A liquid crystal display device comprising:
a display panel drive circuit recited in claim 1; and
a liquid crystal panel.

22. The liquid crystal display device according to claim 21, wherein:
the shift register is provided monolithically in the liquid crystal panel.

23. The liquid crystal display device according to claim 22, wherein:
the liquid crystal panel is formed by use of amorphous silicone.

24. The liquid crystal display device according to claim 22, wherein:
the liquid crystal panel is formed by use of polysilicon.

25. A shift register, provided in a display panel drive circuit that receives a sync signal, the shift register constructed of unit circuits connected in stages, the unit circuits generating signal line selection signals, respectively, each of the signal line selection signals being made active for a respective certain period of time to form a respective pulse, the pulses being outputted successively from respective unit circuits in order of ordinal number starting from a first stage until an end stage,
each of the unit circuits receiving (i) a clock signal, (ii) a start pulse signal or a signal line selection signal generated by a stage different from its own stage, and (iii) a clear signal,
the clear signal being made active in a case where anomalousness is included in at least the sync signal, and no pulse is outputted after the clear signal is made active, until a subsequent vertical scanning period starts.

26. A liquid crystal panel, wherein a shift register recited in claim 25 is monolithically provided.

27. A method for driving a display device, the display device receiving a sync signal from outside and including a shift register constructed of unit circuits connected in stages, the unit circuits generating signal line selection signals, respectively, each of the signal line selection signals being made active for a respective certain period of time to form a respective pulse, the shift register outputting the pulses successively from respective unit circuits in order of ordinal number starting from a first stage until an end stage,
the method comprising:
inputting, to each of the unit circuits, (i) a clock signal, (ii) a start pulse signal or a signal line selection signal generated in a stage different from its own stage, and (iii) a clear signal; and
activating the clear signal in a case where anomalousness is included in at least the sync signal, so that no pulse is outputted from the shift register after the clear signal is made active, until a subsequent vertical scanning period starts.

28. A display panel drive circuit receiving a sync signal from outside, the display panel drive circuit including a shift register constructed of unit circuits connected in stages, each of the unit circuits receiving a clock signal and outputting a respective pulse by use of the received clock signal, the pulses being outputted successively from each of the stages, each of the unit circuits having an output transistor provided between an input terminal of the clock signal and an output terminal of the respective unit circuit,
a clear signal being generated and inputted into each of the unit circuits, the clear signal being made active in a case where anomalousness is included in at least the sync signal, and
once the clear signal is made active, the output transistor provided in each of the unit circuits being turned OFF until a subsequent vertical scanning period starts.

29. The display panel drive circuit according to claim 28, wherein:
regardless of whether or not anomalousness is included in the sync signal, the clear signal is made active after the pulse is outputted from a unit circuit in the end stage, so that the output transistor in each of the unit circuits is turned OFF until the subsequent vertical scanning period starts.

30. The display panel drive circuit according to claim 28, wherein:
the clear signal is made active at a timing in which no pulse is outputted or at a timing in which the pulse is made inactive.

* * * * *